(12) United States Patent
Huang et al.

(10) Patent No.: US 11,935,920 B2
(45) Date of Patent: Mar. 19, 2024

(54) SEMICONDUCTOR DEVICE AND METHOD

(71) Applicant: Taiwan Semiconductor Manufacturing Co., Ltd., Hsinchu (TW)

(72) Inventors: Yu-Lien Huang, Jhubei (TW); Guan-Ren Wang, Hsinchu (TW); Ching-Feng Fu, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/874,732

(22) Filed: Jul. 27, 2022

(65) Prior Publication Data
US 2022/0359650 A1    Nov. 10, 2022

Related U.S. Application Data

(62) Division of application No. 16/917,473, filed on Jun. 30, 2020, now Pat. No. 11,545,546.

(51) Int. Cl.
| | |
|---|---|
| *H01L 29/06* | (2006.01) |
| *H01L 21/764* | (2006.01) |
| *H01L 21/8238* | (2006.01) |
| *H01L 27/092* | (2006.01) |
| *H01L 27/11* | (2006.01) |

(Continued)

(52) U.S. Cl.
CPC ........ *H01L 29/0649* (2013.01); *H01L 21/764* (2013.01); *H01L 21/823814* (2013.01); *H01L 21/823821* (2013.01); *H01L 21/823871* (2013.01); *H01L 21/823878* (2013.01); *H01L 27/0924* (2013.01); *H01L 29/0847* (2013.01); *H01L 29/41791* (2013.01); *H10B 10/12* (2023.02)

(58) Field of Classification Search
CPC ..... H01L 21/823481; H01L 21/823878; H01L 29/0649; H01L 21/764; H01L 21/76224; H01L 29/0653
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |

(Continued)

FOREIGN PATENT DOCUMENTS

| | | | |
|---|---|---|---|
| KR | 20180053803 A | 5/2018 | |
| KR | 20190112910 A | 10/2019 | |

(Continued)

*Primary Examiner* — John A Bodnar
(74) *Attorney, Agent, or Firm* — Slater Matsil, LLP

(57) ABSTRACT

In an embodiment, a device includes: a first source/drain region; a second source/drain region; an inter-layer dielectric (ILD) layer over the first source/drain region and the second source/drain region; a first source/drain contact extending through the ILD layer, the first source/drain contact connected to the first source/drain region; a second source/drain contact extending through the ILD layer, the second source/drain contact connected to the second source/drain region; and an isolation feature between the first source/drain contact and the second source/drain contact, the isolation feature including a dielectric liner and a void, the dielectric liner surrounding the void.

20 Claims, 40 Drawing Sheets

(51) Int. Cl.
*H01L 29/08* (2006.01)
*H01L 29/417* (2006.01)
*H10B 10/00* (2023.01)

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,374,040 B1 | 8/2019 | Chanemougame et al. | |
| 10,672,795 B2 | 6/2020 | Singh et al. | |
| 10,998,238 B2 | 5/2021 | Ching et al. | |
| 2012/0205752 A1 | 8/2012 | Blackmer et al. | |
| 2015/0380305 A1 | 12/2015 | Basker et al. | |
| 2017/0278796 A1 | 9/2017 | Briggs et al. | |
| 2018/0138092 A1 | 5/2018 | Lee et al. | |
| 2019/0157387 A1 | 5/2019 | Wu et al. | |
| 2019/0305099 A1 | 10/2019 | Jo et al. | |
| 2019/0378903 A1 | 12/2019 | Jeon et al. | |
| 2020/0027981 A1* | 1/2020 | Park | H01L 29/7827 |
| 2020/0098681 A1* | 3/2020 | Kim | H01L 21/76897 |
| 2020/0152760 A1 | 5/2020 | Cheng et al. | |
| 2020/0176560 A1 | 6/2020 | Yu et al. | |
| 2020/0343145 A1* | 10/2020 | Kang | H01L 29/1083 |
| 2020/0395238 A1* | 12/2020 | Cheng | H01L 29/66666 |

FOREIGN PATENT DOCUMENTS

| | | |
|---|---|---|
| KR | 20190140647 A | 12/2019 |
| KR | 20200066161 A | 6/2020 |
| TW | 202015215 A | 4/2020 |
| TW | 202020978 A | 6/2020 |

\* cited by examiner

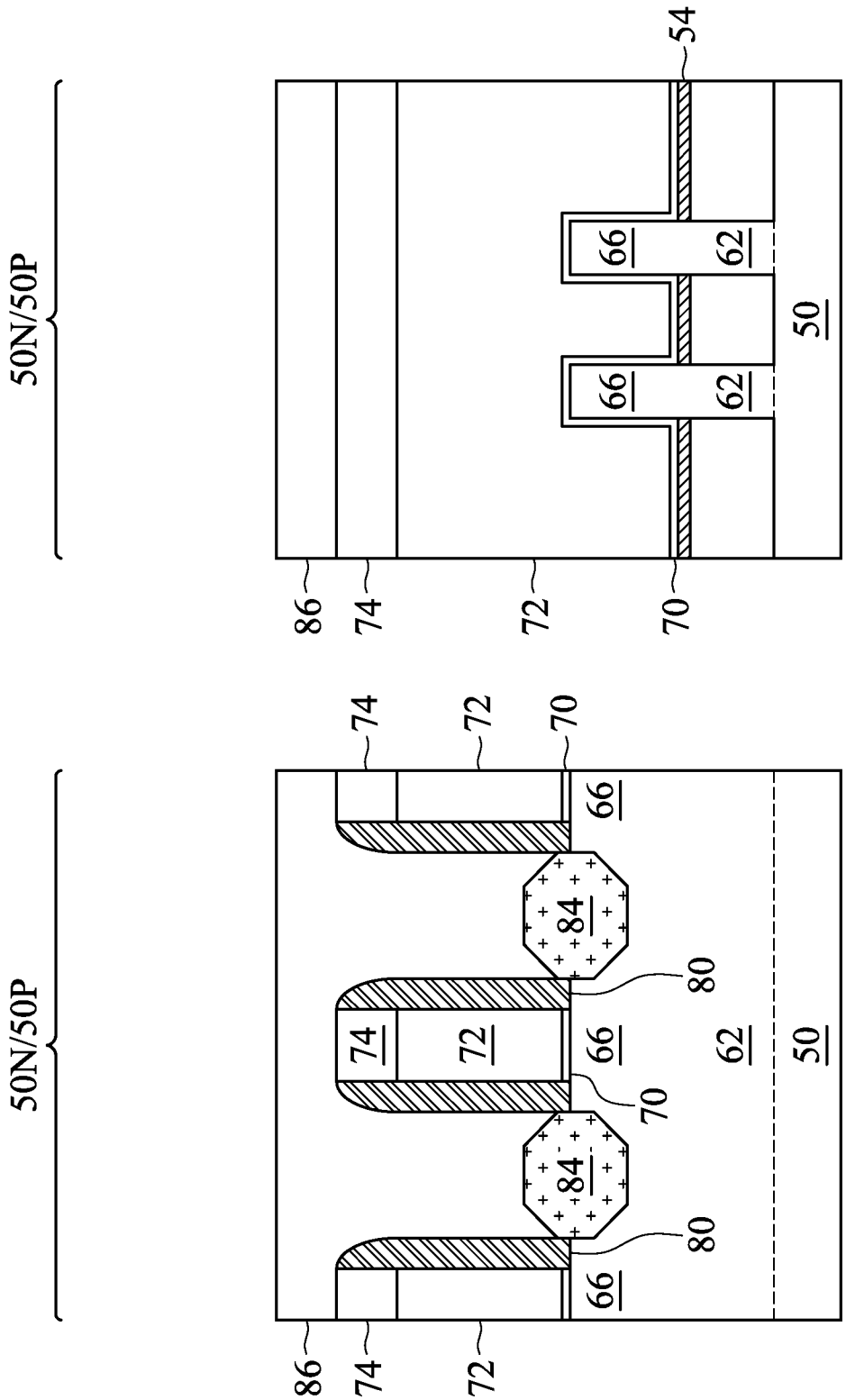

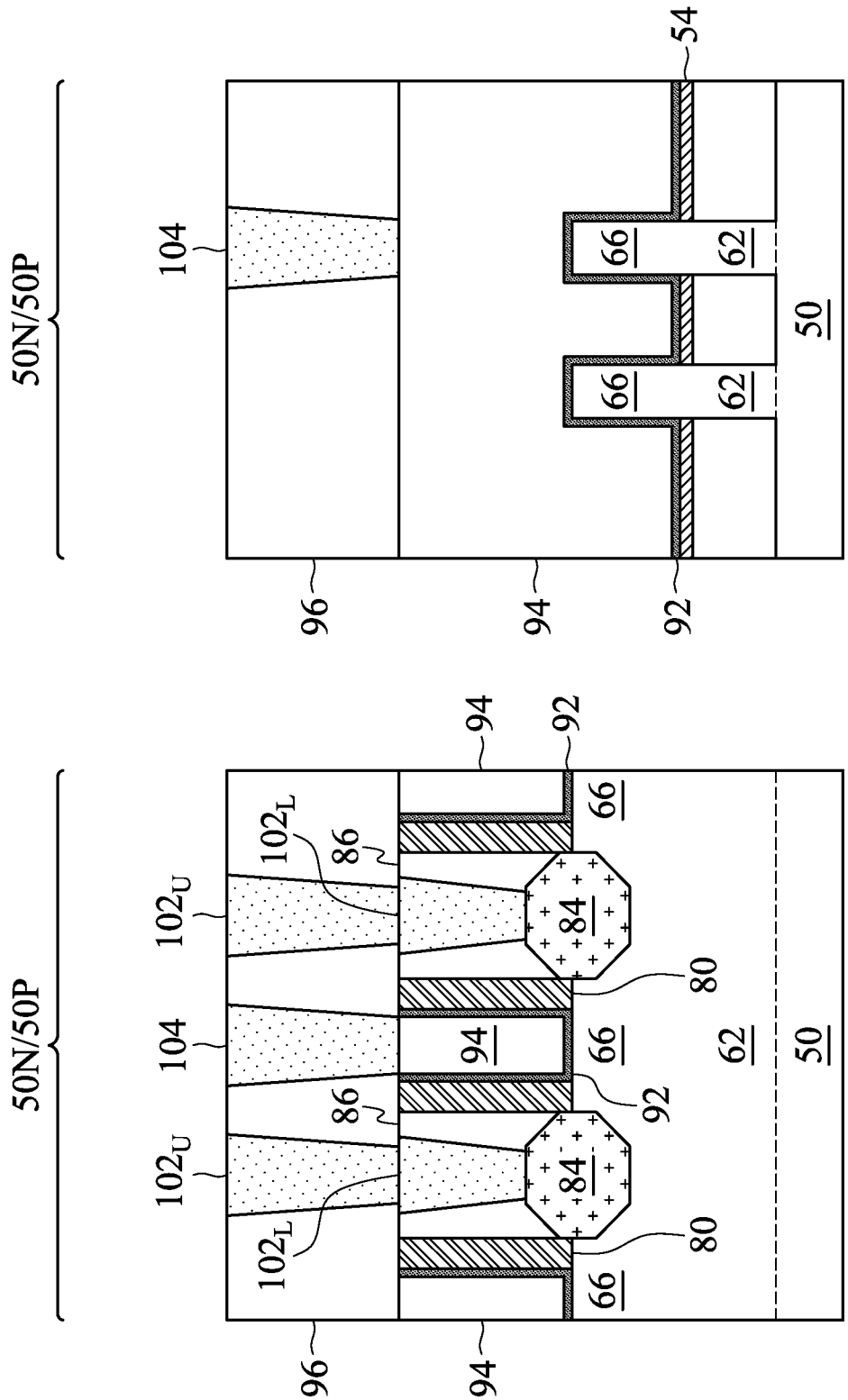

SEMICONDUCTOR DEVICE AND METHOD

PRIORITY CLAIM AND CROSS-REFERENCE

This application is a divisional of U.S. patent application Ser. No. 16/917,473, filed on Jun. 30, 2020, entitled "Semiconductor Device and Method," which application is hereby incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A, 7B, 7C, 7D, 8A, 8B, 9A, 9B, 10A, 10B, 11A, and 11B are cross-sectional views of further intermediate stages in the manufacturing of FinFETs, in accordance with some embodiments.

FIGS. 16A, 16B, 16C, and 16D are cross-sectional views of FinFETs, in accordance with some other embodiments.

DETAILED DESCRIPTION

Figure 1:
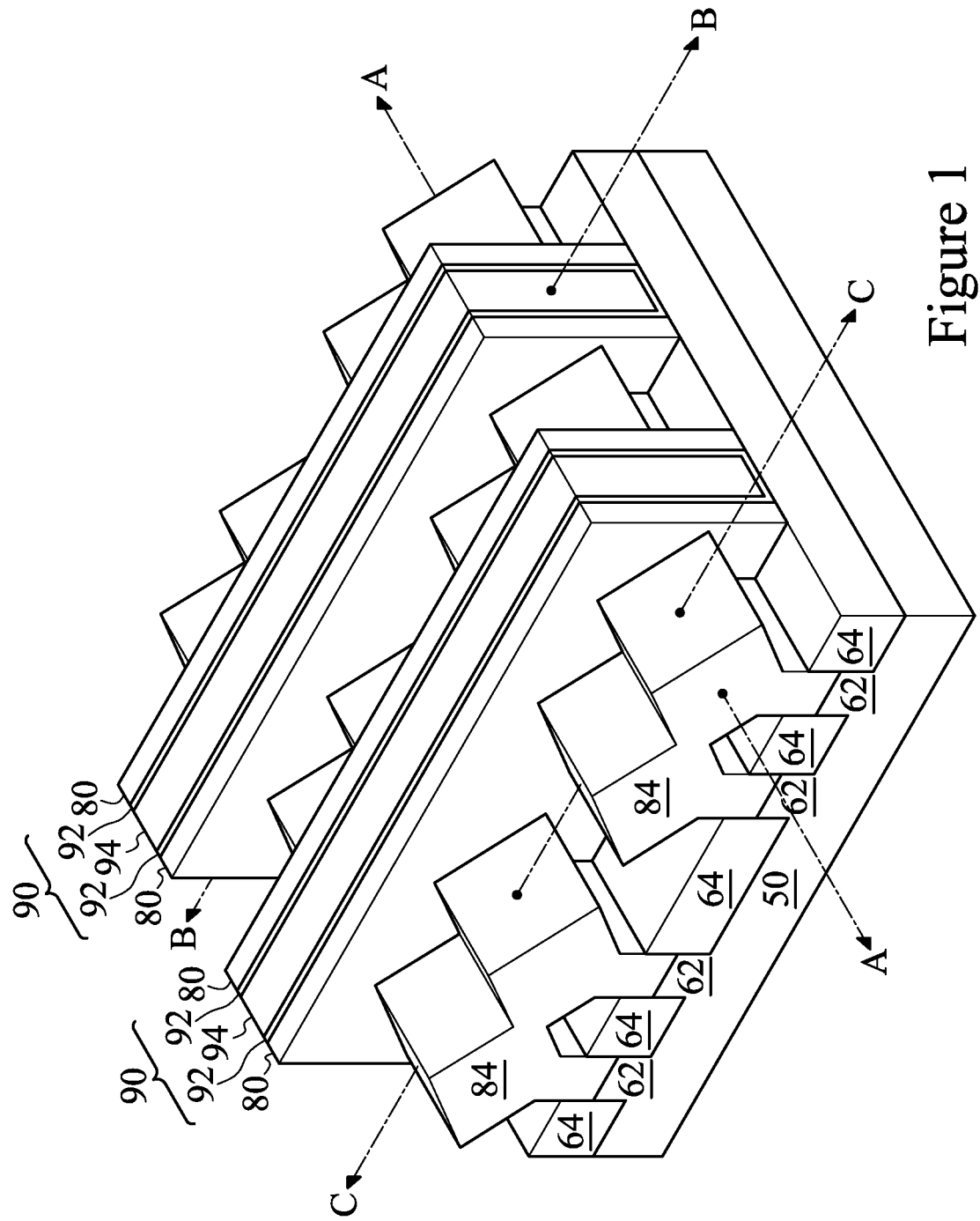
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, source/drain contacts are formed so that they are separated by isolation features. The isolation features include a void, thus giving the isolation features a low relative permittivity. A large amount of electrical isolation may thus be achieved between the source/drain contacts, increasing the performance of the FinFETs. In some embodiments, the isolation features are formed in a "cut last" process by initially forming a shared source/drain contact to multiple FinFETs, dividing the shared source/drain contact into multiple source/drain contacts, and forming the isolation features between the divided source/drain contacts. In some embodiments, the isolation features are formed in a "cut first" process by initially forming the isolation features and then forming separated source/drain contacts adjacent the isolation features.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically coupled in a manner to operate as, for example, one transistor or multiple transistors, such as four transistors.

The FinFETs include fins 62 extending from a substrate 50. Shallow trench isolation (STI) regions 64 are disposed over the substrate 50, and the fins 62 protrude above and from between neighboring STI regions 64. Although the STI regions 64 are described/illustrated as being separate from the substrate 50, as used herein the term "substrate" may be used to refer to just the semiconductor substrate or a semiconductor substrate inclusive of isolation regions. Additionally, although the fins 62 are illustrated as being a single, continuous material of the substrate 50, the fins 62 and/or the substrate 50 may include a single material or a plurality of materials. In this context, the fins 62 refers to the portions extending between the neighboring STI regions 64.

Gate structures 90 are over channel regions of the fins 62. The gate structures 90 include gate dielectrics 92 and gate electrodes 94. The gate dielectrics 92 are along sidewalls and over top surfaces of the fins 62, and the gate electrodes 94 are over the gate dielectrics 92. Source/drain regions 84 are disposed in opposite sides of the fins 62 with respect to the gate dielectrics 92 and the gate electrodes 94. Gate spacers 80 separate the source/drain regions 84 from the gate structures 90. In embodiments where multiple transistors are formed, the source/drain regions 84 may be shared between various transistors. In embodiments where one transistor is formed from multiple fins 62, neighboring source/drain regions 84 may be electrically coupled, such as through coalescing the source/drain regions 84 by epitaxial growth, or through coupling the source/drain regions 84 with a same source/drain contact. One or more inter-layer dielectric (ILD) layer(s) (discussed further below) are over the source/drain regions 84 and/or the gate electrodes 94, through which contacts (discussed further below) to the source/drain regions 84 and the gate electrodes 94 are formed.

FIG. 1 further illustrates several reference cross-sections. Cross-section A-A is along a longitudinal axis of a fin 62 and in a direction of, for example, a current flow between the source/drain regions 84 of a FinFET. Cross-section B-B is perpendicular to cross-section A-A and is along a longitudinal axis of a gate electrode 94. Cross-section C-C is perpendicular to cross-section A-A and extends through source/drain regions 84 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 6 are three-dimensional views of intermediate stages in the manufacturing of FinFETs, in accordance with some embodiments. FIGS. 2 through 6 show a similar three-dimensional view as FIG. 1, except three gate structures are shown.

Figure 2:
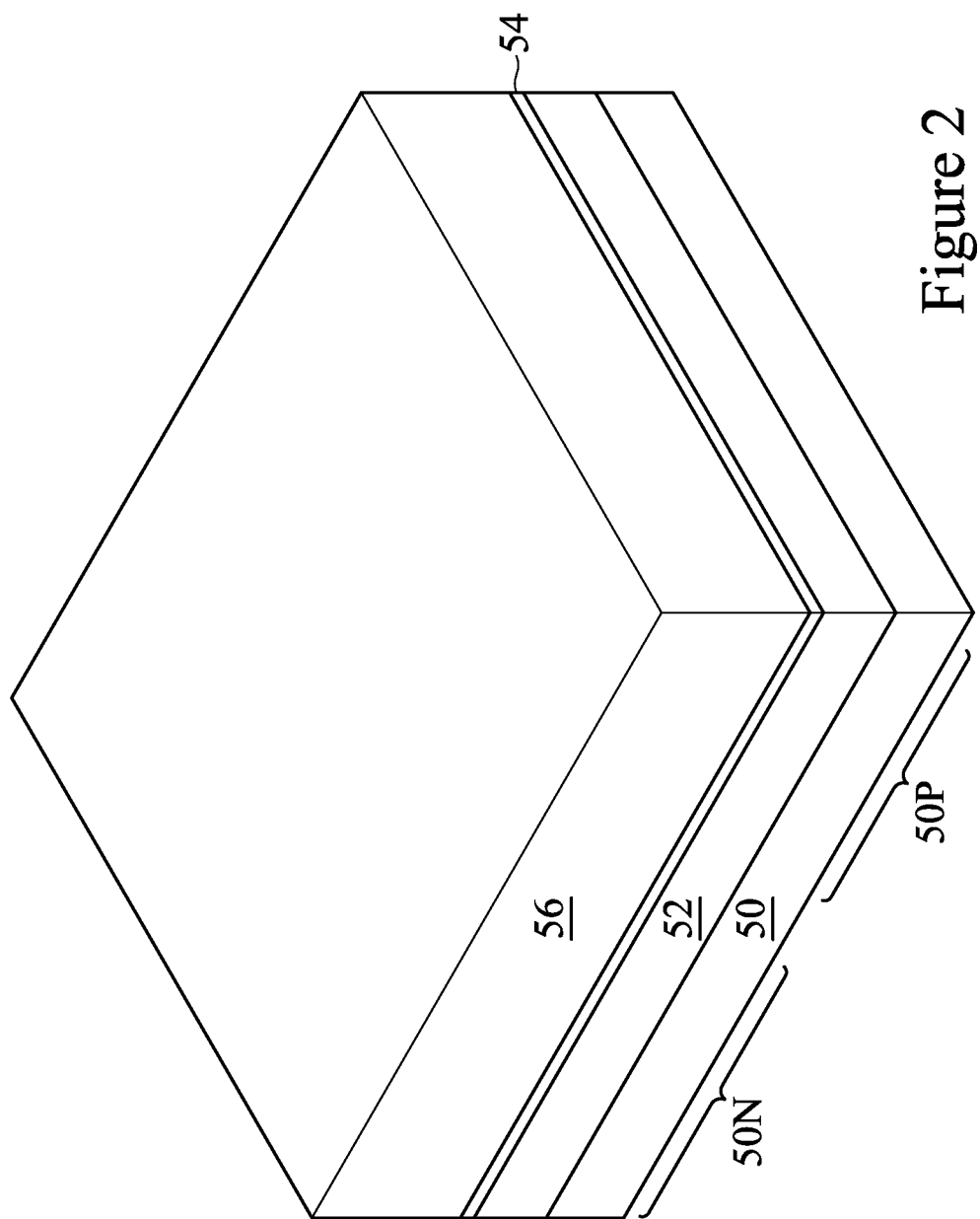
FIGS. 2, 3, 4, 5, and 6 are three-dimensional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

A dielectric layer 52 is then formed on the substrate 50. As discussed further below, the dielectric layer 52 will be patterned to form STI regions. The dielectric layer 52 may be formed of an oxide, such as silicon oxide, a nitride, such as silicon nitride, the like, or a combination thereof, and may be formed by chemical vapor deposition (CVD), high density plasma chemical vapor deposition (HDP-CVD), flowable CVD (FCVD) (e.g., a CVD-based material deposition in a remote plasma system and post curing to convert it to another material, such as an oxide), the like, or a combination thereof. Other insulation materials formed by any acceptable process may be used. In an embodiment, the dielectric layer 52 is a layer of silicon oxide formed by a FCVD process. Although the dielectric layer 52 is illustrated as a single layer, some embodiments may utilize multiple layers. For example, in some embodiments the dielectric layer 52 includes a liner sub-layer and a filler sub-layer. The liner sub-layer may first be formed along the top surface of the substrate 50, and the filler sub-layer may be formed over the liner. In some embodiments, the liner sub-layer is formed of a nitride, such as silicon nitride, and the filler sub-layer is formed of an oxide, such as silicon oxide.

An etch stop layer 54 is then formed on the dielectric layer 52. The etch stop layer 54 is formed of a dielectric material having a different etch rate than the material of a subsequently formed ILD layer (discussed further below). For example, the etch stop layer 54 may be formed of silicon nitride, silicon oxide, silicon oxynitride, or the like, and may be deposited by CVD, atomic layer deposition (ALD), or the like. In an embodiment, the etch stop layer 54 is formed of silicon nitride.

A dielectric layer 56 is then formed on the etch stop layer 54. The dielectric layer 56 may be formed of a material selected from the group of candidate materials of the dielectric layer 52, and may be formed using a method selected from the group of candidate methods for forming the dielectric layer 52. The dielectric layers 52, 56 may be formed of the same material, or may include different materials. In an embodiment, the dielectric layer 56 is a layer of silicon oxide formed by a FCVD process.

One or more anneal process(es) are performed after forming the dielectric layer 52 and/or the dielectric layer 56. In some embodiments, a first anneal process is performed after depositing the dielectric layer 52 and a second anneal process is performed after depositing the dielectric layer 56. In some embodiments, a single anneal process is performed after depositing both of the dielectric layers 52, 56 and the etch stop layer 54, and no anneal processes are performed between the depositing of the dielectric layer 52 and the depositing of the dielectric layer 56. The anneal process(es) densify the dielectric layers 52, 56. The dielectric layer 56 can then be planarized. In some embodiments, a planarization process such as a chemical mechanical polish (CMP), an etch back process, combinations thereof, or the like may be utilized.

Figure 3:
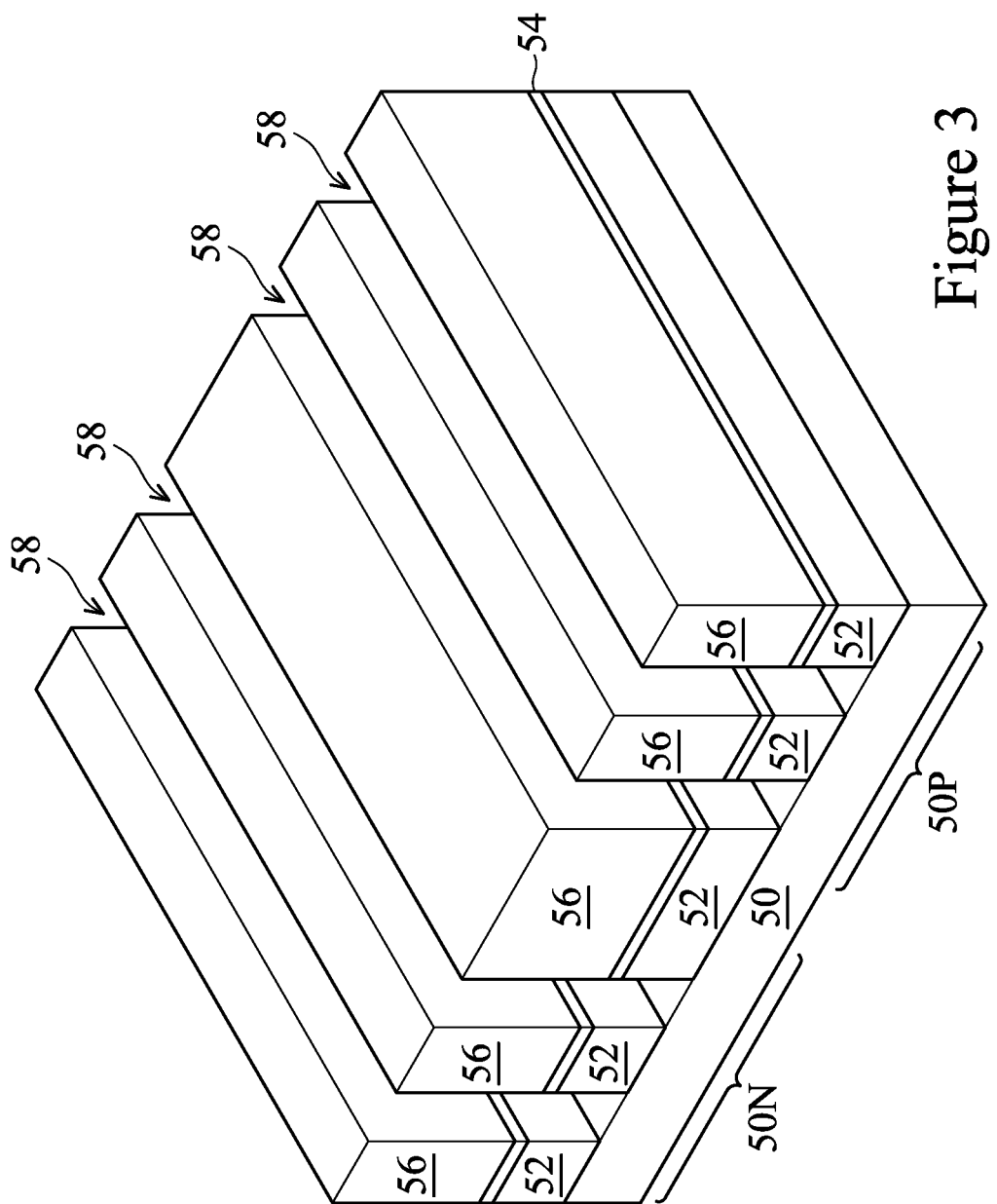

In FIG. 3, the dielectric layers 52, 56 and the etch stop layer 54 are patterned to form trenches 58 exposing the substrate 50. The trenches 58 can be patterned using acceptable photolithography and etching techniques, such as with one or more etching process(es). The etching may be any acceptable etch process, such as a reactive ion etch (RIE) or the like. The etch may be anisotropic. In some embodiments, the etching is performed with a gas that can etch the material of both the dielectric layers 52, 56 (e.g., silicon oxide) and the material of the etch stop layer 54 (e.g., silicon nitride), such as a fluorine-containing gas, such as tetrafluoromethane ($CF_4$), fluoroform ($CHF_3$), fluoromethane ($CH_3F$), octafluorocyclopentene ($C_5F_8$), octafluorocyclobutane ($C_4F_8$), combinations thereof, or the like. In some embodiments, the dielectric layers 52, 56 and the etch stop layer 54 can each be patterned by a different etch.

Figure 4:
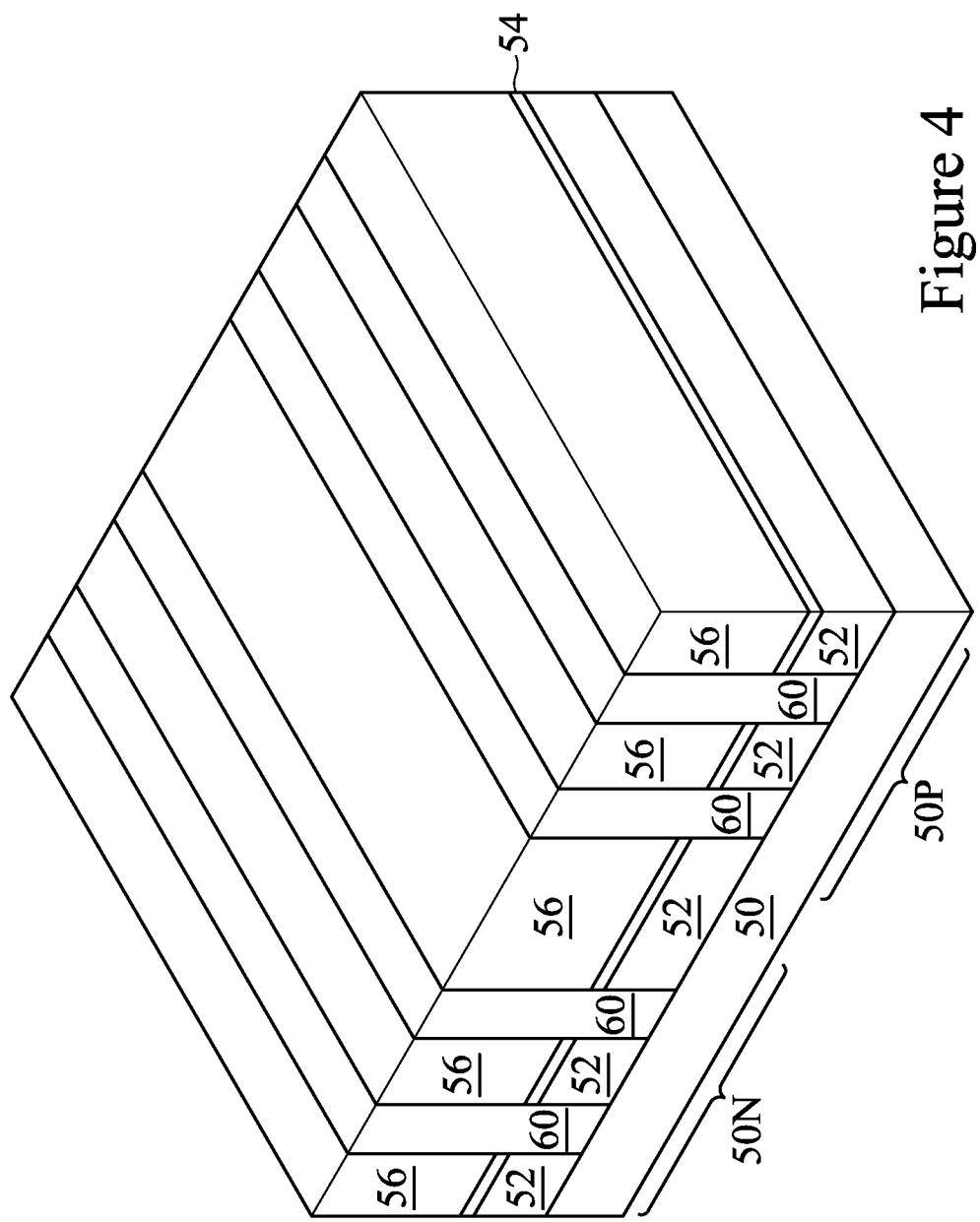

In FIG. 4, epitaxial structures 60 are formed in the trenches 58. The epitaxial structures 60 are formed of a semiconductor material. In some embodiments, the semiconductor material of the epitaxial structures 60 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. The epitaxial structures 60 may be formed of the same material as the substrate 50, or may include different materials than the substrate 50.

The epitaxial structures 60 are formed by an epitaxial growth process. For example, homoepitaxial structures can be epitaxially grown in the trenches 58. Additionally, in some embodiments, heteroepitaxial structures can be used for the epitaxial structures 60. For example, the epitaxial structures 60 can be recessed, and a material different from the epitaxial structures 60 may be epitaxially grown over the recessed epitaxial structures 60. In such embodiments, the final epitaxial structures 60 comprise the recessed material as well as the epitaxially grown material disposed over the recessed material. In an even further embodiment, heteroepitaxial structures can be epitaxially grown in the trenches 58 using a material different from the substrate 50. In some embodiments, the epitaxially grown materials may be in situ doped during growth, which may obviate prior and subsequent implantations, although in situ and implantation doping may be used together.

Still further, it may be advantageous to epitaxially grow a material in the region 50N (e.g., the NMOS region) different from the material in the region 50P (e.g., the PMOS region). In various embodiments, upper portions of the epitaxial structures 60 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming a III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Figure 5:
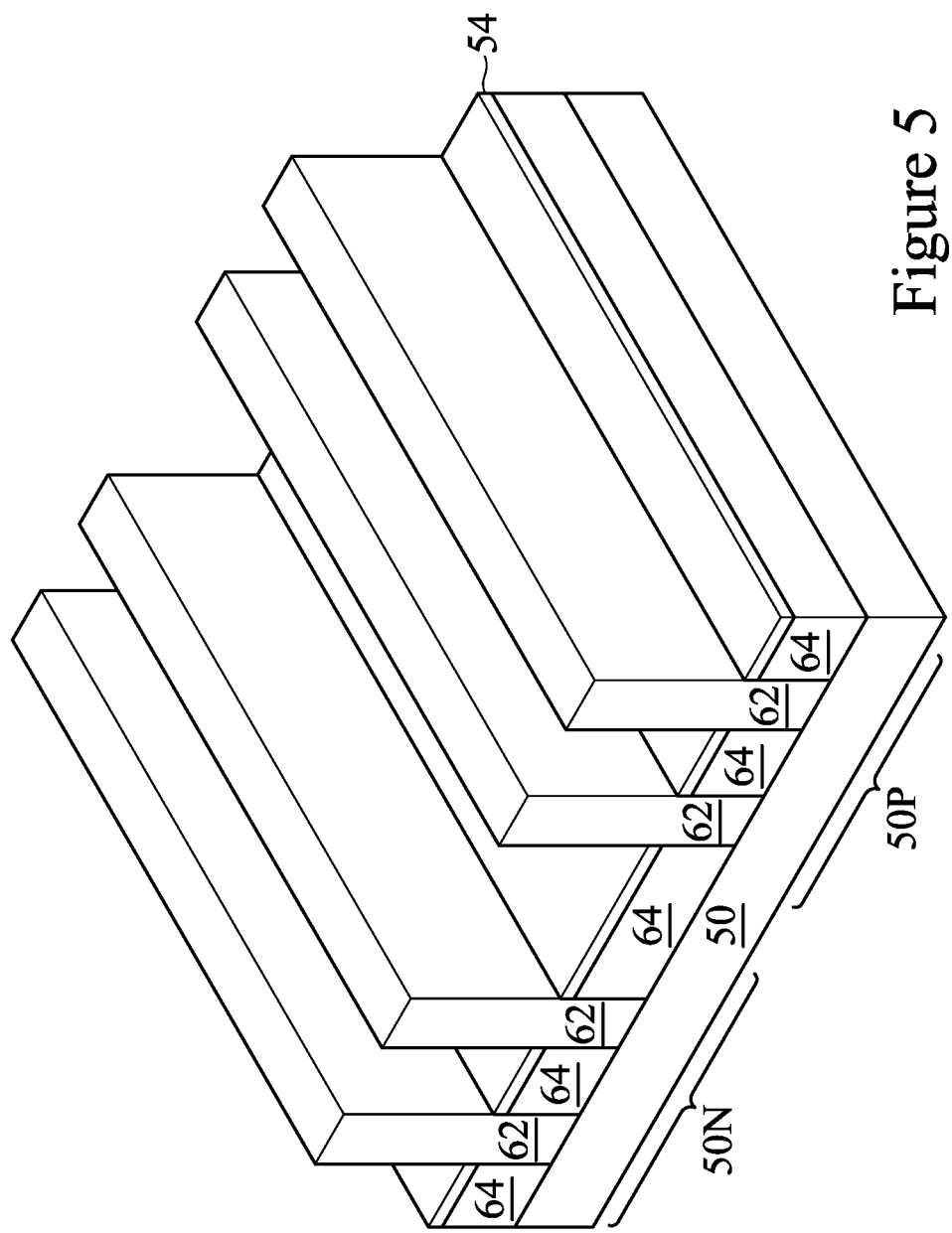

In FIG. 5, the dielectric layer 56 is removed. The dielectric layer 56 may be removed using an acceptable etching process, such as one that is selective to the material of the dielectric layer 56 (e.g., etches the material of the dielectric layer 56 at a faster rate than the material of the etch stop layer 54 and the epitaxial structures 60). The etching process used to remove the dielectric layer 56 can be different from (e.g. is performed with different etching parameters, different etchants, and/or a different type of etching than) the etching process used to form the trenches 58. In some embodiments, the dielectric layer 56 is removed with an anisotropic dry etch using, for example, tetrafluoromethane ($CF_4$), fluoroform ($CHF_3$), or the like may be used. The etch stop layer 54 stops the etching, thus protecting the dielectric layer 52. After the etching, the remaining portions of the dielectric layer 52 form STI regions 64, and the epitaxial structures 60 (see FIG. 4) protrude from between neighboring portions of the STI regions 64 and neighboring portions of the etch stop layer 54 to form fins 62. The fins 62 are semiconductor strips.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. For example, the spacers may be used to pattern the trenches 58, in which the fins 62 are formed.

Further, appropriate wells may be formed in the fins 62 and/or the substrate 50. In some embodiments, a P well may be formed in the region 50N, and an N well may be formed in the region 50P. In some embodiments, a P well or an N well are formed in both the region 50N and the region 50P.

In embodiments with different well types, the different implant steps for the region 50N and the region 50P may be achieved using a photoresist or other masks. For example, a photoresist may be formed over the fins 62 and the STI regions 64 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like, and can be implanted in the region to a concentration of equal to or less than $10^{18}$ $cm^{-3}$, such as in the range of about $10^{16}$ $cm^{-3}$ to about $10^{18}$ $cm^{-3}$. After the implant, the photoresist is removed, such as by an acceptable ashing process.

Following the implanting of the region 50P, a photoresist is formed over the fins 62 and the STI regions 64 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like, and can be implanted in the region to a concentration of equal to or less than $10^{18}$ $cm^{-3}$, such as in the range of about $10^{16}$ $cm^{-3}$ to about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of the fins 62 may be in situ doped during growth, which may obviate the implantations, although in situ and implantation doping may be used together.

Figure 6:
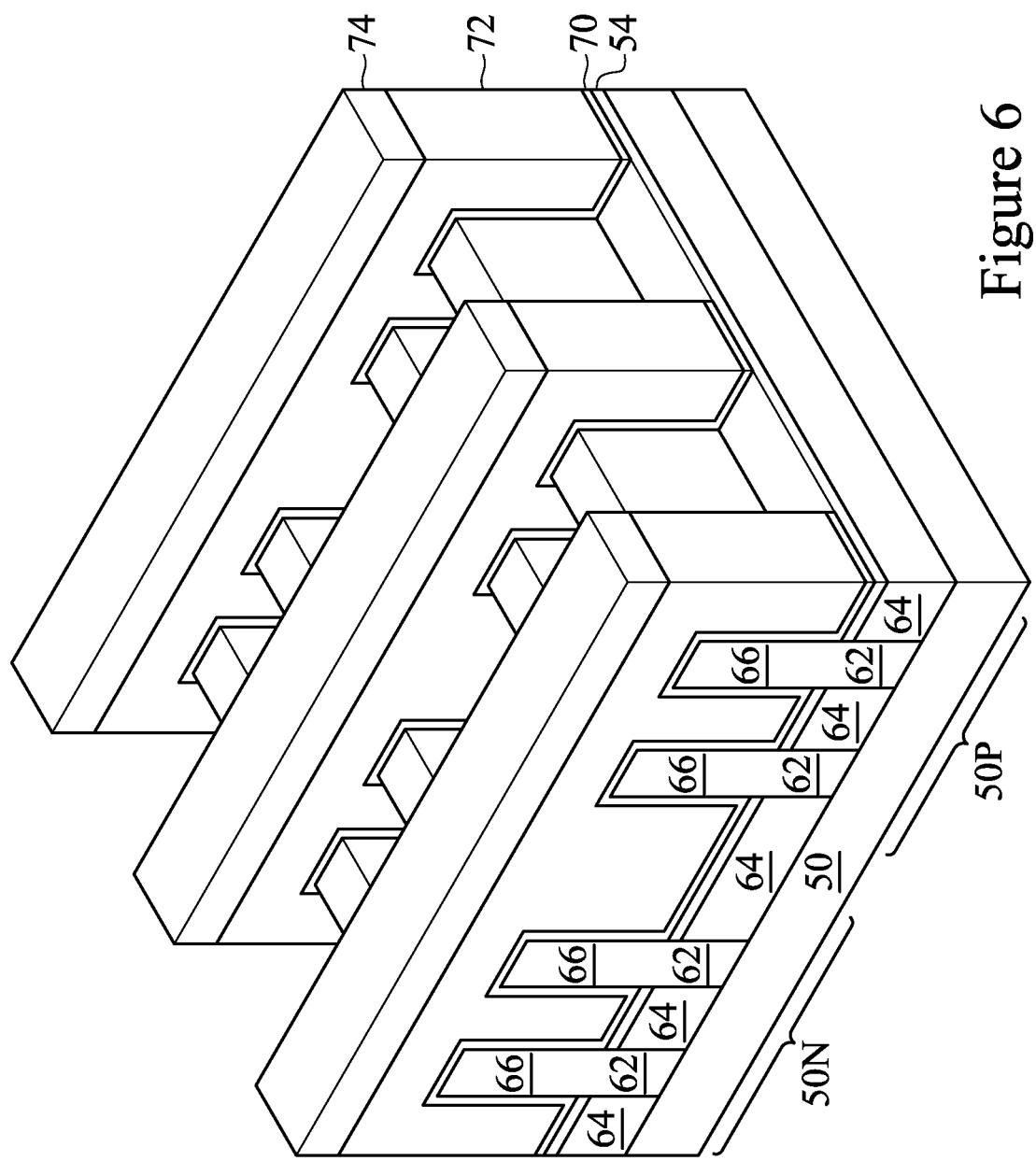

In FIG. 6, dummy dielectrics 70 are formed over the fins 62 and dummy gates 72 are formed over the dummy dielectrics 70. The dummy dielectrics 70 and dummy gates 72 may be collectively referred to as "dummy gate stacks," with each dummy gate stack including a dummy dielectric 70 and a dummy gate 72. The dummy gate stacks extend along sidewalls of the fins 62. The dummy dielectrics 70 may contact the etch stop layer 54, including portions of the etch stop layer 54 between individual fins 62, and portions of the etch stop layer 54 between groups of the fins 62, e.g., between the region 50N and the region 50P.

As an example to form the dummy dielectrics 70 and the dummy gates 72, a dummy dielectric layer is formed on the fins 62. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The dummy gate layer may be a conductive or non-conductive material and may be selected from a group including amorphous silicon, polycrystalline-silicon (polysilicon), poly-crystalline silicon germanium (poly-SiGe), metallic nitrides, metallic silicides, metallic oxides, and metals. The dummy gate layer may be deposited by physical vapor deposition (PVD), CVD, sputter deposition, or other techniques known and used in the art for depositing the selected material. The dummy gate layer may be made of other materials that have a high etching selectivity from the etching of the etch stop layer 54. The mask layer may include, for example, silicon nitride, silicon oxynitride, or the like. In this example, a single dummy gate layer and a single mask layer are formed across the region 50N and the region 50P. The mask layer is then patterned using acceptable photolithography and etching techniques to form masks 74. The pattern of the masks 74 is then transferred to the dummy gate layer by an acceptable etching technique to form the dummy gates 72. The pattern of the masks 74 may optionally be further transferred to the dummy dielectric layer to form the dummy dielectrics 70. The dummy gates 72 cover respective channel regions 66 of the fins 62. The pattern of the masks 74 may be used to physically separate each of the dummy gates 72 from adjacent dummy gates. The dummy gates 72 may also have a lengthwise direction substantially perpendicular (within process limitations) to the lengthwise direction of respective fins 62. Although the dummy dielectrics 70 are shown covering the etch stop layer 54, it should be appreciate that the dummy dielectrics 70 can be formed in other manners. In some embodiments, such as when the dummy dielectric layer is thermally grown, the dummy dielectrics 70 are formed to only cover the fins 62.

The process described above is just one example of how the fins 62 and the dummy gates 72 may be formed. In some embodiments, the etch stop layer 54 can be omitted and the fins 62 may be formed by directly etching the substrate 50. For example, the substrate 50 may be provided, and the fins 62 can be formed in the substrate 50 by etching trenches in the substrate 50. The etching may be any acceptable etch process, such as a reactive ion etch (RIE), neutral beam etch (NBE), the like, or a combination thereof. The etch may be anisotropic. An insulation material, similar to the dielectric layer 52, can then be formed over the substrate 50 and between the fins 62, such as by a FCVD process. Thereafter, the insulation material can be planarized and recessed to form the STI regions 64 between neighboring fins 62. The dummy dielectrics 70 and the dummy gates 72 can then be formed over the fins 62 and STI regions 64.

FIGS. 7A through 11B are cross-sectional views of further intermediate stages in the manufacturing of FinFETs, in accordance with some embodiments. FIGS. 7A, 8A, 9A, 10A, and 11A are cross-sectional views illustrated along reference cross-section A-A in FIG. 1, except three gate structures are shown. FIGS. 7B, 8B, 9B, 10B, and 11B are cross-sectional views illustrated along reference cross-section B-B in FIG. 1, except only two fins are shown. FIGS. 7A,7B, and 8A through 11B illustrate features in either of the region 50N and the region 50P. For example, the structures illustrated in FIGS. 7A,7B, and 8A through 11B may be applicable to both the region 50N and the region 50P. Differences (if any) in the structures of the region 50N and the region 50P are described herein. FIGS. 7C and 7D are cross-sectional views illustrated along reference cross-section C-C in FIG. 1, where four fins are shown. FIGS. 7C and 7D illustrate features in both the region 50N and the region 50P.

In FIGS. 7A and 7B, gate spacers 80 are formed on exposed surfaces of the dummy gates 72, the masks 74, and/or the fins 62. The gate spacers 80 may be formed by forming an insulating material and subsequently etching the insulating material. The insulating material of the gate spacers 80 may be silicon nitride, silicon carbonitride, silicon oxycarbonitride, a combination thereof, or the like, and may be formed by thermal oxidation, deposition, a combination thereof, or the like. In some embodiments, the gate spacers 80 are formed from a multi-layered insulating material, and include multiple layers. For example, the gate spacers 80 may include multiple layers of silicon carbonitride, may include multiple layers of silicon oxycarbonitride, or may include a layer of silicon oxide disposed between two layers of silicon nitride. The etching of the gate spacers 80 can be anisotropic, and is selective to the material of the gate spacer 80 (e.g., etches the material of the gate spacers 80 at a faster rate than the material of the etch stop layer 54). After etching, the gate spacers 80 can have straight sidewalls or curved sidewalls.

Before or during the formation of the gate spacers 80, implants for lightly doped source/drain (LDD) regions (not explicitly illustrated) may be performed. In embodiments with different device types, similar to the implants discussed, a mask, such as a photoresist, may be formed over the region 50N, while exposing the region 50P, and appropriate type (e.g., p-type) impurities may be implanted into the exposed fins 62 in the region 50P. The mask may then be removed. Subsequently, a mask, such as a photoresist, may be formed over the region 50P while exposing the region 50N, and appropriate type impurities (e.g., n-type) may be implanted into the exposed fins 62 in the region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ $cm^{-3}$ to about $10^{19}$ $cm^{-3}$. An anneal may be used to repair implant damage and to activate the implanted impurities.

Figure 7C:
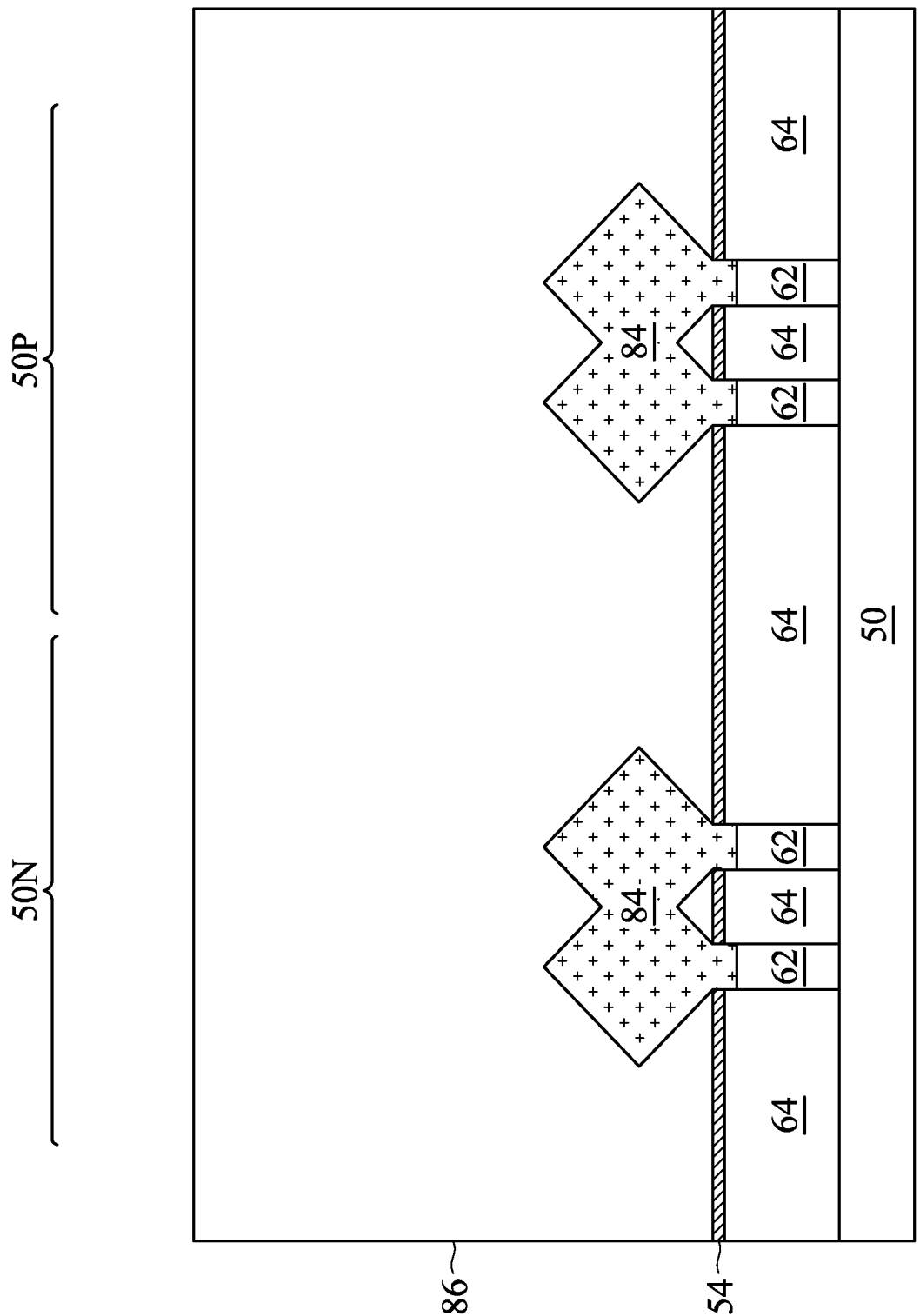
Figure 7D:
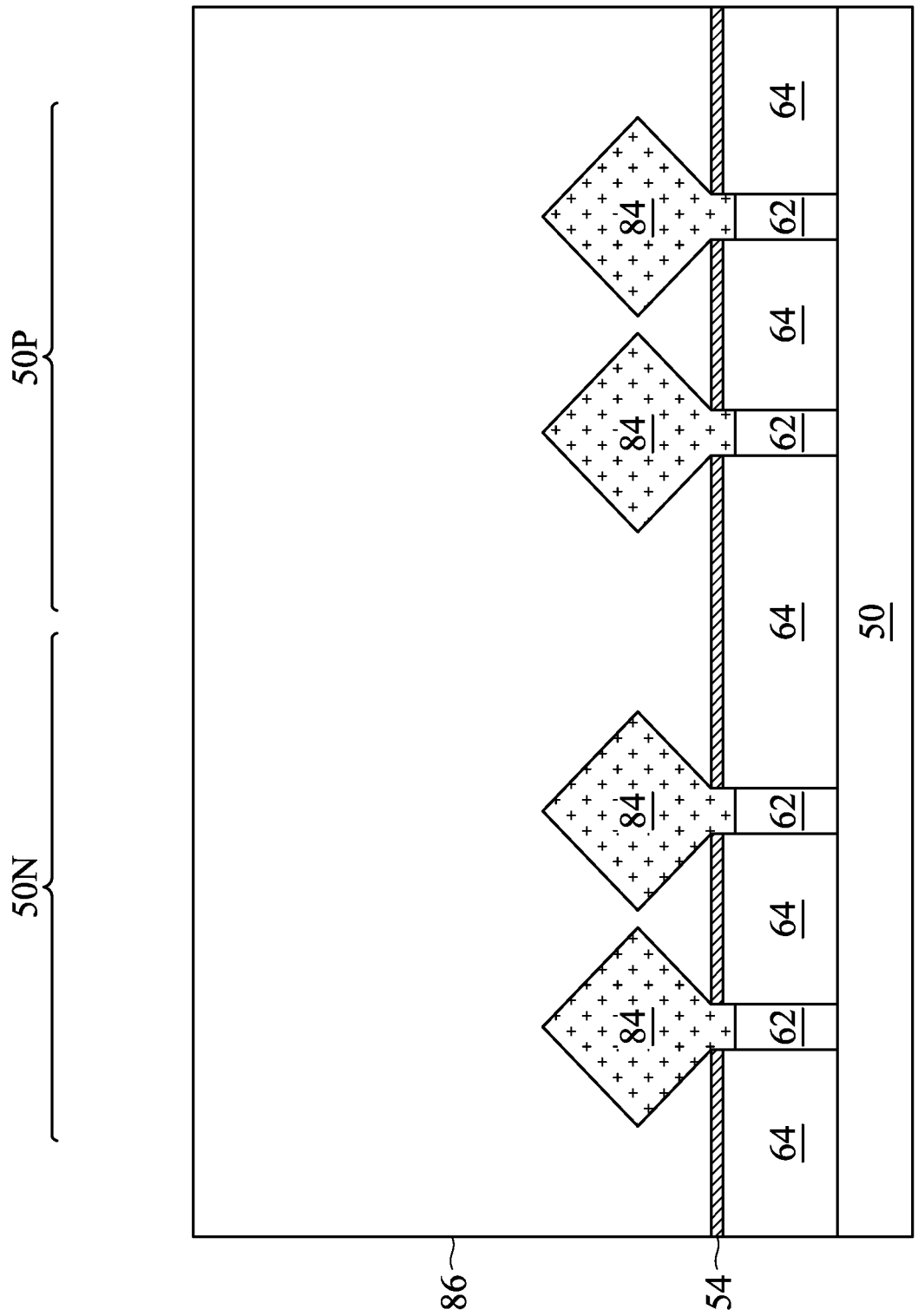

Epitaxial source/drain regions 84 are then formed in the fins 62. The epitaxial source/drain regions 84 are formed in the fins 62 such that each of the dummy gates 72 are disposed between respective neighboring pairs of the epitaxial source/drain regions 84. The epitaxial source/drain regions 84 extend through (e.g., along sidewalls of) the etch stop layer 54, and may extend into portions of the fins 62 beneath the top surfaces of the STI regions 64, as illustrated by FIGS. 7C and 7D (discussed further below). In some embodiments, the gate spacers 80 are used to separate the epitaxial source/drain regions 84 from the dummy gates 72 by an appropriate lateral distance so that the epitaxial source/drain regions 84 do not short out subsequently formed gates of the resulting FinFETs. The epitaxial source/drain regions 84 can exert stress in the channel regions 66 of the fins 62, thereby improving performance.

The epitaxial source/drain regions 84 in the region 50N, e.g., the NMOS region, may be formed by masking the region 50P, e.g., the PMOS region, and etching source/drain regions of the fins 62 in the region 50N to form recesses in the fins 62. The recesses can extend through the etch stop layer 54. Then, the epitaxial source/drain regions 84 in the region 50N are epitaxially grown in the recesses. The epitaxial source/drain regions 84 may include any acceptable material, such as appropriate for n-type FinFETs. For example, if the fins 62 are silicon, the epitaxial source/drain regions 84 in the region 50N may include materials exerting a tensile strain in the channel region 66, such as silicon, silicon carbide, phosphorous doped silicon carbide, silicon phosphide, or the like. The epitaxial source/drain regions 84 in the region 50N may have surfaces raised from respective surfaces of the fins 62 and may have facets.

The epitaxial source/drain regions 84 in the region 50P, e.g., the PMOS region, may be formed by masking the region 50N, e.g., the NMOS region, and etching source/drain regions of the fins 62 in the region 50P are etched to form recesses in the fins 62. The recesses can extend through the etch stop layer 54. Then, the epitaxial source/drain regions 84 in the region 50P are epitaxially grown in the recesses. The epitaxial source/drain regions 84 may include any acceptable material, such as appropriate for p-type FinFETs. For example, if the fins 62 are silicon, the epitaxial source/drain regions 84 in the region 50P may comprise materials exerting a compressive strain in the channel region 66, such as silicon-germanium, boron doped silicon-germanium, germanium, germanium tin, or the like. The epitaxial source/drain regions 84 in the region 50P may also have surfaces raised from respective surfaces of the fins 62 and may have facets.

The epitaxial source/drain regions 84 and/or the fins 62 may be implanted with dopants to form source/drain regions, similar to the process previously discussed for forming lightly-doped source/drain regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 84 may be in situ doped during growth.

As a result of the epitaxy processes used to form the epitaxial source/drain regions 84, upper surfaces of the epitaxial source/drain regions 84 have facets which expand laterally outward beyond sidewalls of the fins 62. In some embodiments, these facets cause adjacent epitaxial source/drain regions 84 of a same FinFET to merge as illustrated by FIG. 7C. In other embodiments, adjacent epitaxial source/drain regions 84 remain separated after the epitaxy process is completed as illustrated by FIG. 7D. For example, unmerged epitaxial source/drain regions 84 may be formed when FinFET are formed from a single fin 62 or when FinFET are formed from multiple fins 62. In the embodiment illustrated, the spacer etch used to form the gate spacers 80 is used to remove the spacer material to allow the epitaxial source/drain regions 84 to extend to the top surface of the etch stop layer 54. In some other embodiments, the gate spacers 80 are formed covering a portion of the sidewalls of the fins 62 that extend above the etch stop layer 54, thereby blocking the epitaxial growth.

It is noted that the above disclosure generally describes a process of forming spacers, LDD regions, and source/drain regions. Other processes and sequences may be used. For example, fewer or additional spacers may be utilized, different sequence of steps may be utilized, spacers may be formed and removed, and/or the like. In some embodiments, the gate spacers 80 can be formed after the epitaxial source/drain regions 84. Furthermore, the n-type and p-type devices may be formed using a different structures and steps. In some embodiments, dummy spacers can be formed in the region 50N during the formation of the epitaxial source/drain regions 84 in the region 50N. The dummy spacers in the region 50N can then be removed. Dummy spacers can then be formed in the region 50P during the formation of the epitaxial source/drain regions 84 in the region 50P. The dummy spacers in the region 50P can then be removed. The gate spacers 80 can then be formed after the epitaxial source/drain regions 84 have been formed in both the region 50N and the region 50P.

A first ILD layer 86 is then deposited over the epitaxial source/drain regions 84, the gate spacers 80, the masks 74 (if present) or the dummy gates 72, and the STI regions 64. The first ILD layer 86 is formed of a dielectric material having a different etch rate than the material of the etch stop layer 54, and may be deposited by any suitable method, such as CVD, plasma-enhanced CVD (PECVD), or FCVD. Dielectric materials may include oxides such as silicon oxide, phosphosilicate glass (PSG), borosilicate glass (BSG), boron-doped phosphosilicate glass (BPSG), undoped Silicate Glass (USG), or the like; nitrides such as silicon nitride; or the like. Other insulation materials formed by any acceptable process may be used. After formation, the first ILD layer 86 can be planarized, such as by a CMP. Because the epitaxial source/drain regions 84 are formed after the etch stop layer 54, the first ILD layer 86 physically contacts the facets of the epitaxial source/drain regions 84, with no etch stop layers disposed between the first ILD layer 86 and the epitaxial source/drain regions 84.

Figures 8A, 8B:
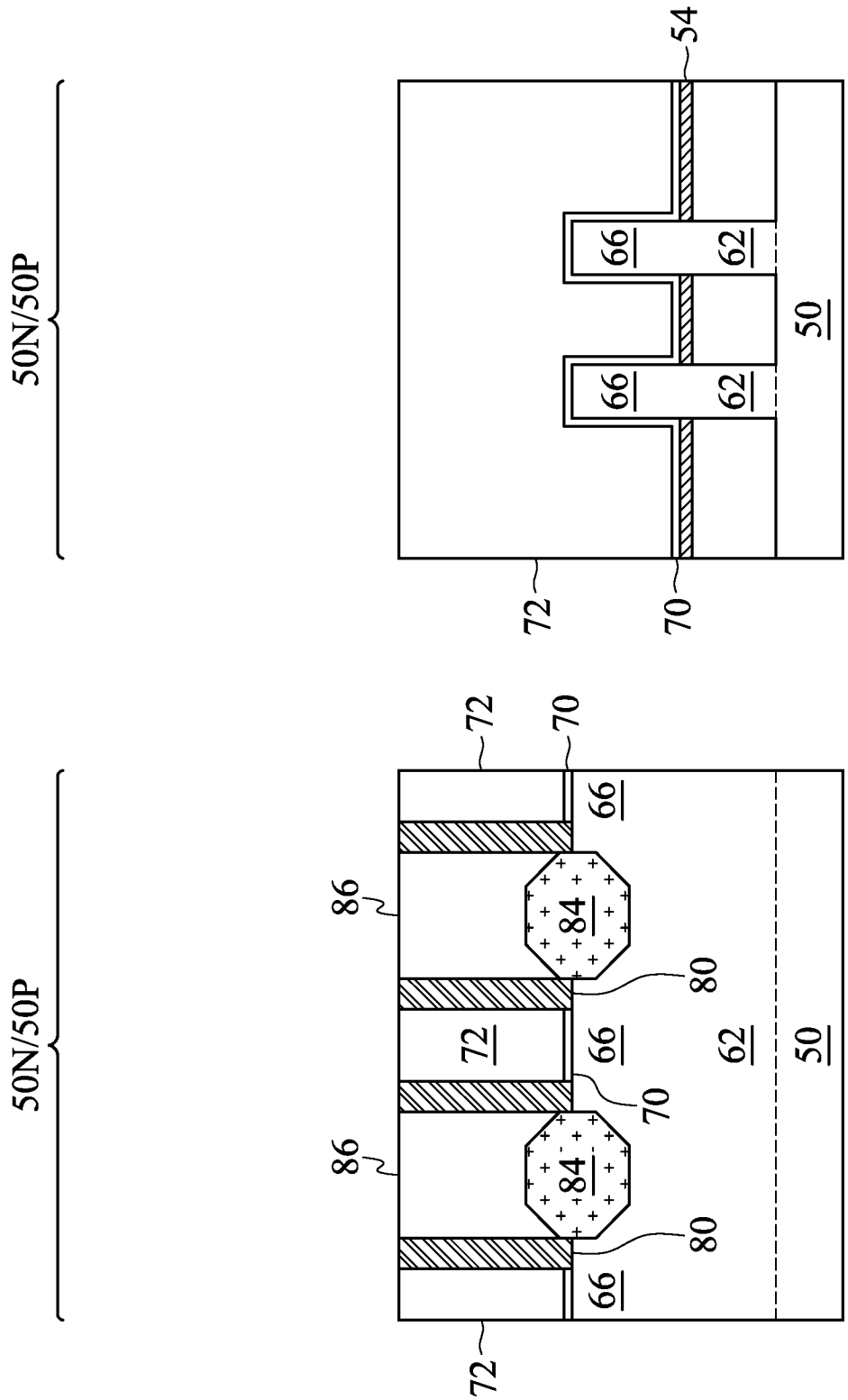

In FIGS. 8A and 8B, a planarization process, such as a CMP, may be performed to level the top surface of the first ILD layer 86 with the top surfaces of the masks 74 (if present) or the dummy gates 72. The planarization process can remove the masks 74 on the dummy gates 72 and portions of the gate spacers 80 along sidewalls of the masks 74. After the planarization process, top surfaces of the dummy gates 72, the gate spacers 80, and the first ILD layer 86 are coplanar. Accordingly, the top surfaces of the dummy gates 72 are exposed through the first ILD layer 86. In some embodiments, the masks 74 may remain, in which case the planarization process levels the top surface of the first ILD layer 86 with the top surfaces of the masks 74.

Figures 9A, 9B:
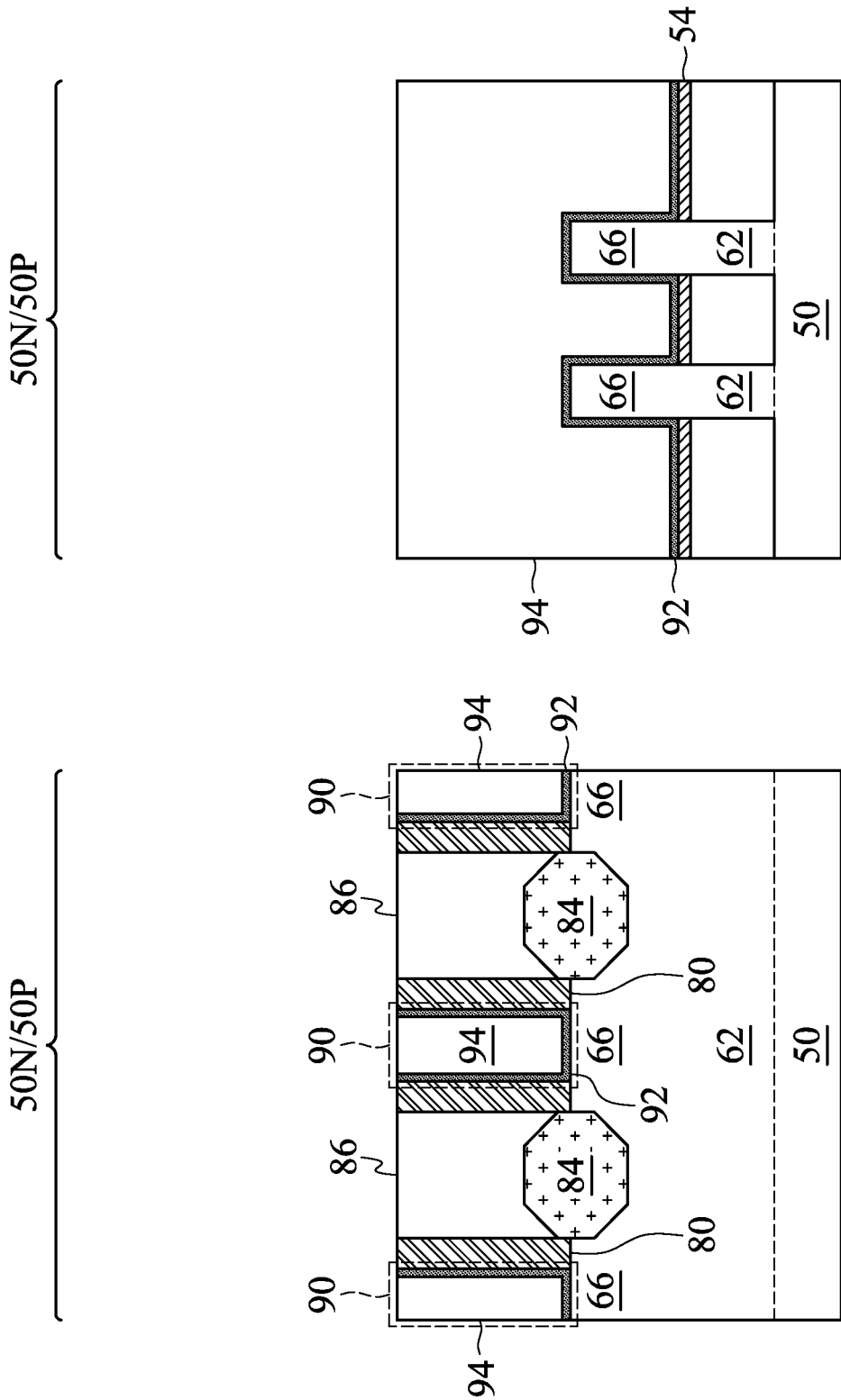

In FIGS. 9A and 9B, the dummy gates 72 and optionally the dummy dielectrics 70 are removed and are replaced with gate structures 90. The gate structures 90 include gate dielectrics 92 and gate electrodes 94. As an example to form the gate structures 90, the dummy gates 72 and the masks 74 (if present) are removed in one or more etching step(s), so that recesses are formed. Portions of the dummy dielectrics 70 in the recesses may also be removed. In some embodiments, only the dummy gates 72 are removed and the dummy dielectrics 70 remain and are exposed by the recesses. In some embodiments, the dummy dielectrics 70 are removed from recesses in a first region of a die (e.g., a core logic region) and remain in recesses in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD layer 86 or the gate spacers 80. Each recess exposes and/or overlies a channel region 66 of a respective fin 62. Each channel region 66 is disposed between neighboring pairs of the epitaxial source/drain regions 84. During the removal, the dummy dielectrics 70 may be used as etch stop layers when the dummy gates 72 are etched. The dummy dielectrics 70 may then be optionally removed after the removal of the dummy gates 72. After the removal, the gate dielectrics 92 are deposited conformally in the recesses, such as on the top surfaces and the sidewalls of the fins 62 and on sidewalls of the gate spacers 80. The gate dielectrics 92 may also be formed on top surface of the first ILD layer 86. In accordance with some embodiments, the gate dielectrics 92 comprise silicon oxide, silicon nitride, or multilayers thereof. In some embodiments, the gate dielectrics 92 include a high-k dielectric material, and in these embodiments, the gate dielectrics 92 may have a k value greater than about 7.0, and may include a metal oxide or a silicate of hafnium, aluminum, zirconium, lanthanum, manganese, barium, titanium, lead, and combinations thereof. The formation methods of the gate dielectrics 92 may include molecular-beam deposition (MBD), atomic layer deposition (ALD), PECVD, and the like. In embodiments where portions of the dummy dielectrics 70 remain in the recesses, the gate dielectrics 92 include a material of the dummy dielectrics 70 (e.g., silicon oxide). The gate electrodes 94 are deposited over the gate dielectrics 92, respectively, and fill the remaining portions of the recesses. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single-layer gate electrode 94 is illustrated, each gate electrode 94 may comprise any number of liner layers, any number of work function tuning layers, and a fill material. After the filling of the gate electrodes 94, a planarization process, such as a CMP, may be performed to remove the excess portions of the gate dielectrics 92 and the material of the gate electrodes 94, which excess portions are over the top surface of the first ILD layer 86. The remaining portions of material of the gate electrodes 94 and the gate dielectrics 92 form the gate structures 90 of the resulting FinFETs. The gate structures 90 may be also referred to as "gate stacks" or "metal gates." The gate structures 90 may extend along sidewalls of the channel regions 66 of the fins 62.

The formation of the gate structures 90 in the region 50N and the region 50P may occur simultaneously such that the gate dielectrics 92 in each region are formed from the same materials and the gate electrodes 94 in each region are formed from the same materials. In some embodiments, the gate structures 90 in each region may be formed by distinct processes, such that the gate dielectrics 92 in each region may be different materials and/or the gate electrodes 94 in each region may be different materials. Various masking steps may be used to mask and expose appropriate regions when using distinct processes.

Figures 10A, 10B:
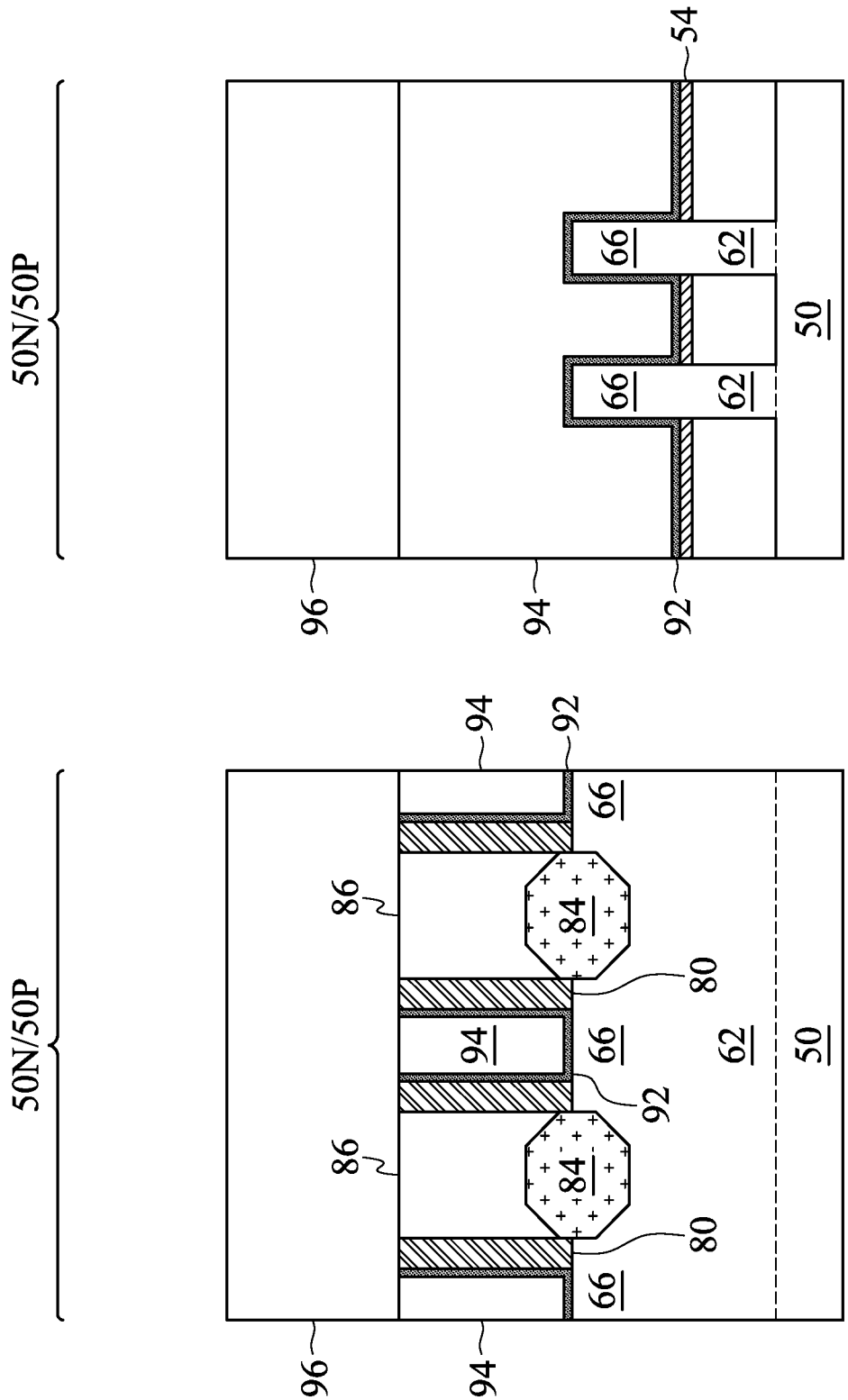

In FIGS. 10A and 10B, a second ILD layer 96 is deposited over the first ILD layer 86. The second ILD layer 96 may be formed of a dielectric material, and may be deposited by any suitable method, such as CVD, plasma-enhanced CVD (PECVD), or FCVD. Dielectric materials may include oxides such as silicon oxide, phosphosilicate glass (PSG), borosilicate glass (BSG), boron-doped phosphosilicate glass (BPSG), undoped Silicate Glass (USG), or the like; nitrides such as silicon nitride; or the like. After formation, the second ILD layer 96 can be planarized, such as by a CMP. In some embodiments, an etch stop layer is formed between the first ILD layer 86 and the second ILD layer 96. The etch stop layer may comprise a dielectric material, such as silicon nitride, silicon oxide, silicon oxynitride, or the like, having a different etch rate than the material of the second ILD layer 96. In some embodiments, before the formation of the second ILD layer 96, gate masks can be formed over the gate dielectrics 92 and gate electrodes 94, which may protect the gate dielectrics 92 and gate electrodes 94 during contact formation.

Figures 11A, 11B:
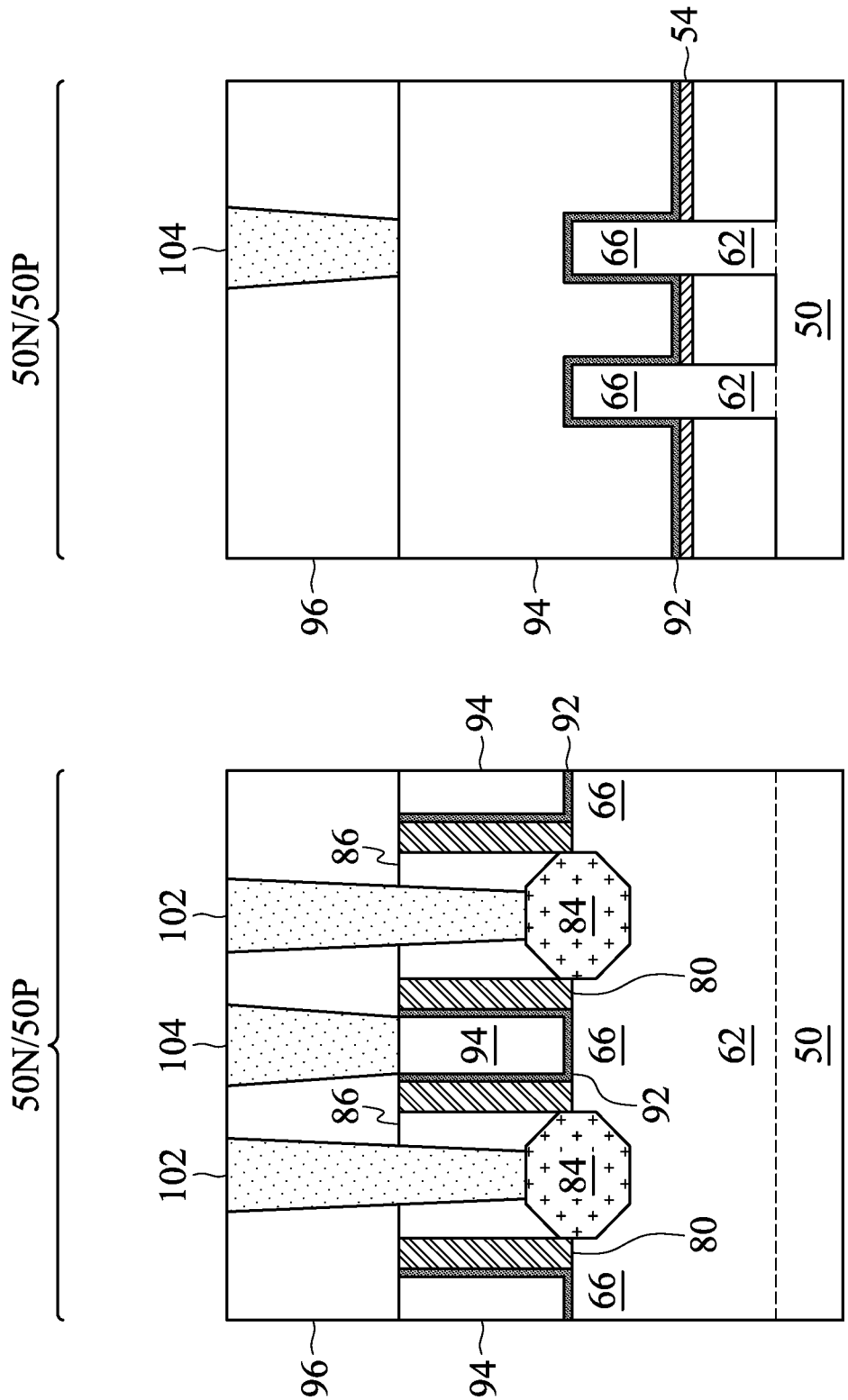

In FIGS. 11A and 11B, source/drain contacts 102 and gate contacts 104 are formed. The source/drain contacts 102 are physically and electrically coupled to, and thus are connected to, the epitaxial source/drain regions 84. The gate contacts 104 are physically and electrically coupled to, and thus are connected to, the gate electrodes 94.

As an example to form the gate contacts 104, openings for the gate contacts 104 are formed through the second ILD layer 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be cobalt, tungsten, aluminum, copper, silver, gold, nickel, the like, or combinations thereof. A planarization process, such as a CMP, may be performed to remove excess material from a surface of the second ILD layer 96. The remaining liner and conductive material form the gate contacts 104 in the openings. After formation, top surfaces of the second ILD layer 96 and the gate contacts 104 are coplanar.

Details about the formation of the source/drain contacts 102 will be discussed further below, however, it should be appreciated that the source/drain contacts 102 and the gate contacts 104 may be formed in different processes, or may be formed in the same process. In some embodiments, the source/drain contacts 102 are formed simultaneously with the gate contacts 104, e.g., the openings for the source/drain contacts 102 are formed concurrently with the openings for the gate contacts 104. In some embodiments, the source/drain contacts 102 are formed before or after the gate contacts 104, e.g., the openings for the source/drain contacts 102 are formed before or after the openings for the gate contacts 104 are formed. Further, although the source/drain contacts 102 and the gate contacts 104 are illustrated in a same cross-section, each of the source/drain contacts 102 and the gate contacts 104 may be formed in different cross-sections, which may avoid shorting of the contacts.

FIGS. 12A through 12E are cross-sectional views of intermediate stages in the manufacturing of source/drain contacts for FinFETs, in accordance with some embodiments. FIGS. 12A through 12E are cross-sectional views illustrated along reference cross-section C-C in FIG. 1, where four fins are shown, and illustrate features in both the region 50N and the region 50P. As discussed further below, FIGS. 12A through 12E illustrate a "cut last" contact formation process where a shared source/drain contact 102 (see FIG. 12B) is initially formed to couple multiple epitaxial source/drain regions 84. After the shared source/drain contact 102 is formed, a contact cut process is performed, where the shared source/drain contact 102 is divided to form multiple separated source/drain contacts 102A, 102B (see FIG. 12C) and an isolation feature 120 (see FIG. 12E) is formed between the separated source/drain contacts 102A, 102B. In this embodiment, the isolation feature 120 has a bowed profile shape. Processing of FinFETs having merged epitaxial source/drain regions 84 similar to those in FIG. 7C is shown, but it should be appreciated that FinFETs having separated epitaxial source/drain regions 84 similar to those in FIG. 7D may be processed using similar techniques. Further, although the formation of two separated source/drain contacts 102A, 102B and one isolation feature 120 is shown, it should be appreciated that any desired quantity of isolation features and separated source/drain contacts may be formed simultaneously.

Figure 12A:
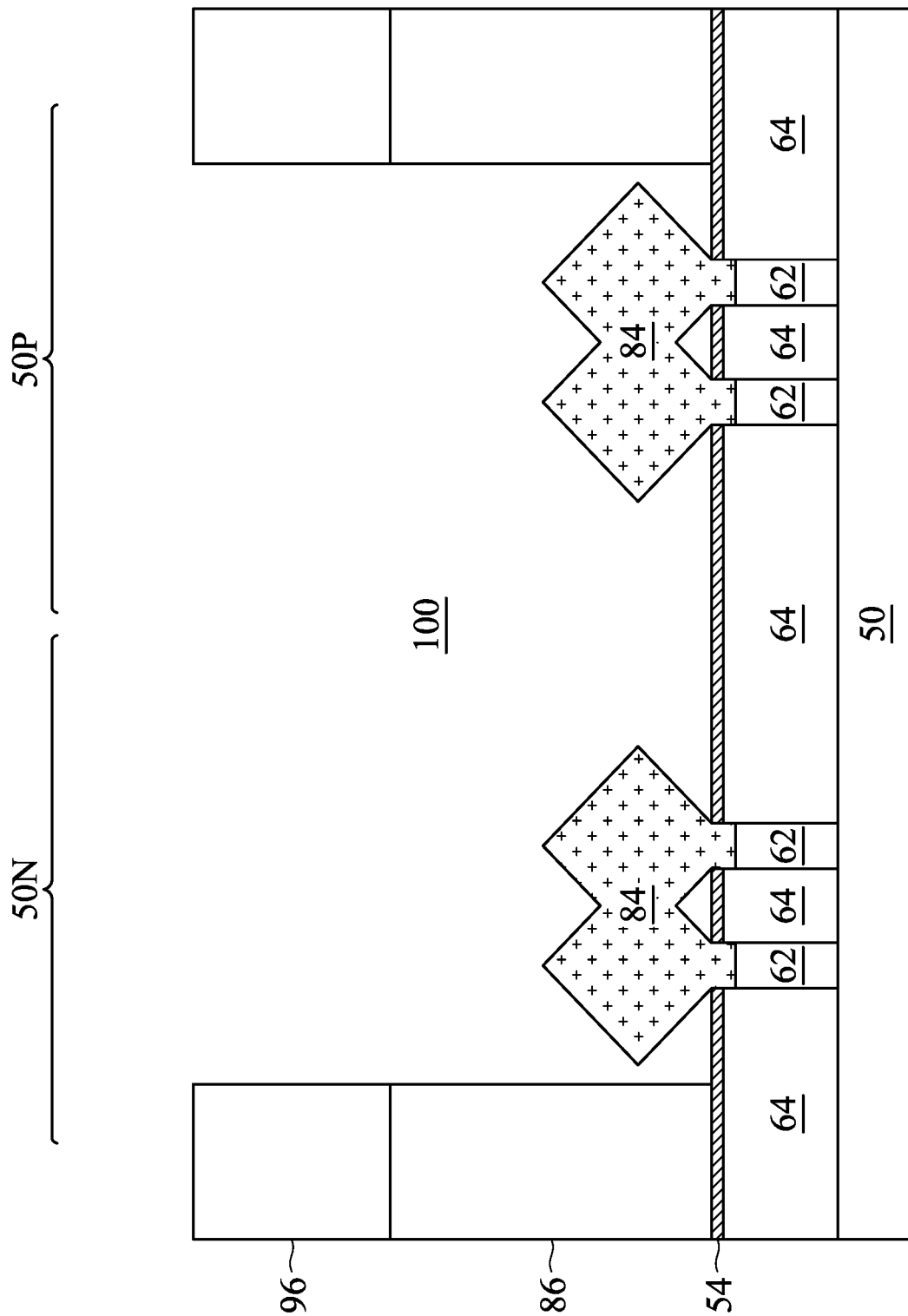
FIGS. 12A, 12B, 12C, 12D, 12E, and 12F are cross-sectional views of further intermediate stages in the manufacturing of FinFETs, in accordance with some embodiments.

In FIG. 12A, an opening 100 for a shared source/drain contact is formed through the ILD layers 86, 96. The opening 100 may be formed using acceptable photolithography and etching techniques. After formation, the opening 100 extends through the ILD layers 86, 96 and exposes the etch stop layer 54. The etch stop layer 54 stops the etching of the opening 100. Because the etch stop layer 54 underlies the raised portions of the epitaxial source/drain regions 84, all of the facets of the epitaxial source/drain regions 84 can be exposed by the opening 100. The etch stop layer 54 thus functions as a contact etch stop layer (CESL).

Figure 12B:
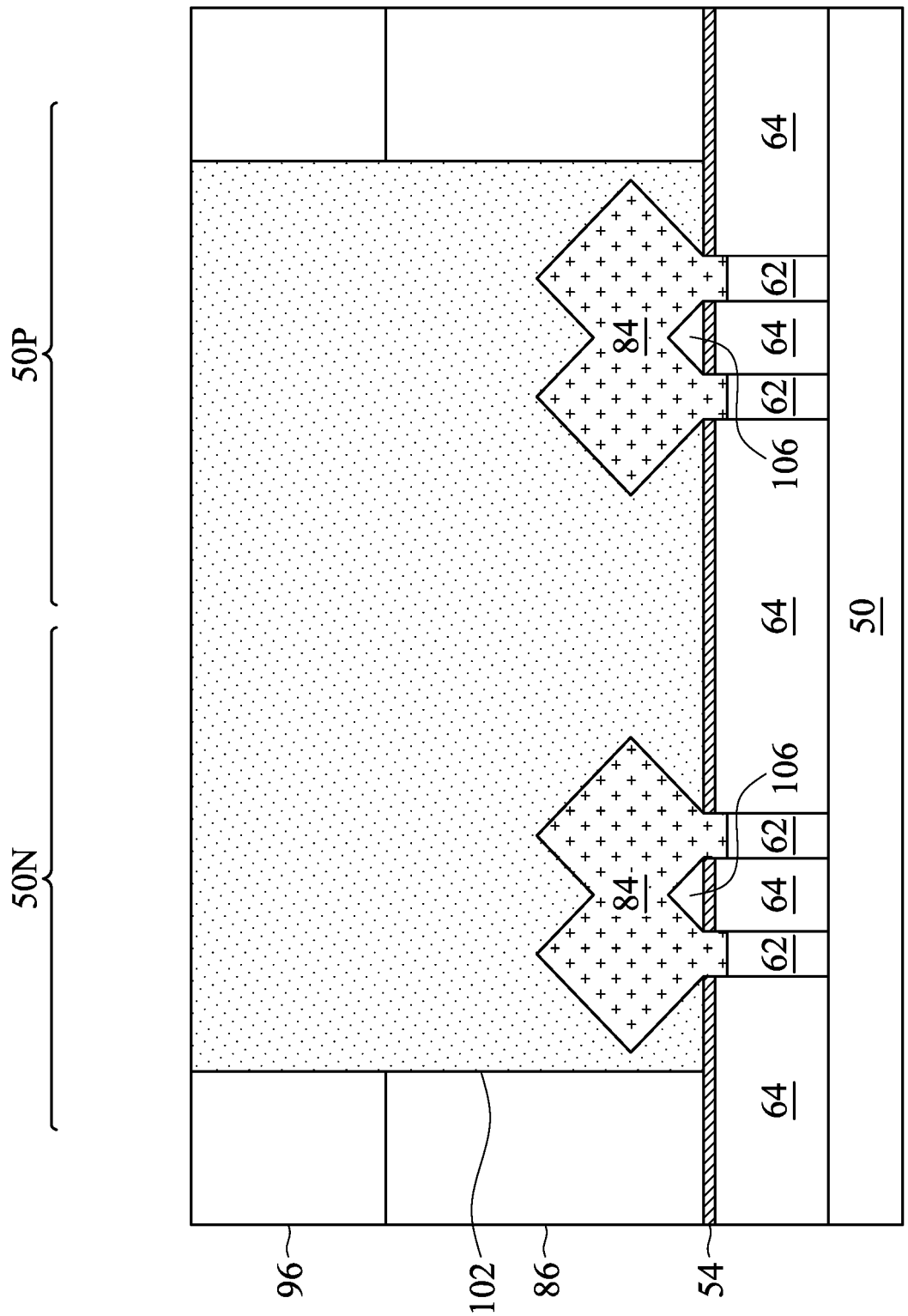

In FIG. 12B, a shared source/drain contact 102 is formed in the opening 100. A liner, such as a diffusion barrier layer, an adhesion layer, or the like, and a conductive material are formed in the opening 100. The liner may include titanium, titanium nitride, tantalum, tantalum nitride, or the like. The conductive material may be cobalt, tungsten, aluminum, copper, silver, gold, nickel, the like, or combinations thereof. In an embodiment, the conductive material is cobalt. In another embodiment, the conductive material is tungsten. A planarization process, such as a CMP, may be performed to remove excess material from a surface of the second ILD layer 96. The remaining liner and conductive material form the shared source/drain contact 102 and the gate contacts 104 in the openings. After formation, top surfaces of the second ILD layer 96 and the shared source/drain contact 102 are coplanar.

After formation, all of the interfaces of the shared source/drain contact 102 and the etch stop layer 54 are planar to a major surface of the substrate 50, and the etch stop layer 54 does not extend along the facets of the epitaxial source/drain regions 84. In the embodiment shown, e.g., where adjacent epitaxial source/drain regions 84 of a same FinFET are merged, voids 106 can be formed beneath the merged epitaxial source/drain regions 84. The voids 106 can be empty, filled, or partially filled (such as partially filled with some of the material of the shared source/drain contact 102). In embodiments where adjacent epitaxial source/drain regions 84 remain separated, all facets of the epitaxial source/drain regions 84 can be contacted by the shared source/drain contact 102. The remaining portions of the etch stop layer 54 are disposed between the fins 62 of a FinFET, and the epitaxial source/drain regions 84 overly such portions of the etch stop layer 54.

In some embodiments, metal-semiconductor alloy regions (not shown) are formed between the epitaxial source/drain regions 84 and the shared source/drain contact 102, such as on portions of the epitaxial source/drain regions 84 exposed by the opening 100. The metal-semiconductor alloy regions can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions can be formed by depositing a metal in the opening 100 and then performing a thermal anneal process. The metal can be any metal capable of reacting with the semiconductor materials (e.g., silicon, silicon germanium, germanium, etc.) of the epitaxial source/drain regions 84 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. In an embodiment, the metal-semiconductor alloy regions are silicide regions formed of titanium-silicon. After the thermal anneal process, a cleaning process, such as a wet clean, may be performed to remove any residual metal from the opening 100.

Figure 12C:
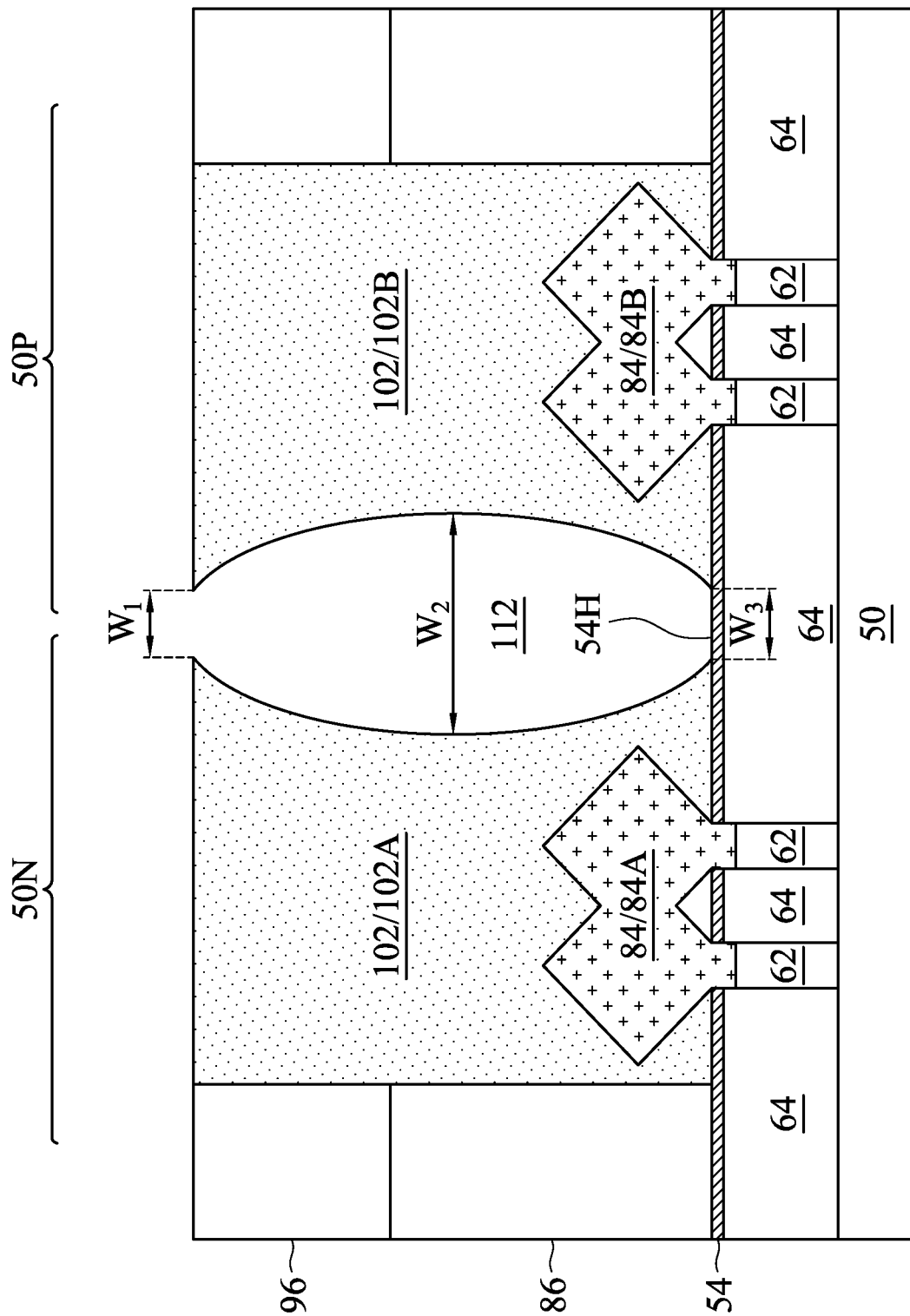

In FIG. 12C, an opening 112 is formed in the shared source/drain contact 102. The opening 112 divides the shared source/drain contact 102 into multiple separated source/drain contacts 102A, 102B. The opening 112 exposes sidewalls of the separated source/drain contacts 102A, 102B and a horizontal portion 54H of the etch stop layer 54. The separated source/drain contact 102A is connected to an epitaxial source/drain region 84A, and the separated source/drain contact 102B is connected to an epitaxial source/drain region 84B. The separated source/drain contacts 102A, 102B both contact the horizontal portion 54H of the etch stop layer 54. The horizontal portion 54H of the etch stop layer 54 extends along the STI regions 64, and extends between the epitaxial source/drain region 84A and the epitaxial source/drain region 84B.

The opening 112 can be formed using acceptable photolithography and etching techniques. In some embodiments, the opening 112 is formed by an anisotropic or semi-isotropic etch performed by a plasma process, described in greater detail below. The etch is selective to the material of the shared source/drain contact 102 (e.g., etches the material of the shared source/drain contact 102 at a faster rate than the material of the etch stop layer 54). As such, the horizontal portion 54H of the etch stop layer 54 acts as an etch stop for the plasma etching process.

The profile shape of the opening 112 can be controlled by controlling parameters of the plasma etching process. For example, dimensions of the opening 112, such as different widths at different locations along the opening 112, may be controlled. As an illustrative example, the widths $W_1$, $W_2$, and $W_3$ shown in FIG. 12C indicate three locations along the opening 112 that may be controlled by the plasma etching process. Other locations, more locations, or fewer locations along the opening 112 may be used to characterize the profile shape of opening 112. The width $W_1$ is located at the top of the opening 112. The width $W_2$ is located at a midpoint of the opening 112. The width $W_3$ is located at the bottom of the opening 112, along the exposed horizontal portion 54H of the etch stop layer 54. In an embodiment, the width $W_1$ can be in the range of about 15 nm to about 120 nm, the width $W_2$ can be in the range of about 16.5 nm to about 150 nm, and the width $W_3$ can be in the range of about 15 nm to about 120 nm. The opening 112 has a bowed profile shape, such that the width $W_2$ is at the widest point of the opening 112, and is greater than each of the widths $W_1$, $W_3$. In an embodiment, the width $W_2$ can be from about 10% to about 50% greater than each of the widths $W_1$, $W_3$. Forming the opening 112 with a small width $W_1$ allows pinch-off to be induced during a subsequent process for filling the opening 112. As such, a void can be intentionally formed between the separated source/drain contacts 102A, 102B.

The plasma etching process is performed in a processing chamber with process gases being supplied into the processing chamber. In some embodiments, plasma generation power is pulsed between a low power and a high power during the plasma etching process. In some embodiments, an applied bias voltage is also pulsed between a low voltage and a high voltage during the plasma etching process. The plasma generation power and/or the bias voltage may be pulsed as a rectangular wave or a square wave, although other pulse shapes maybe used. In some embodiments, the plasma generation power and the bias voltage have synchronized pulses, such that the plasma generation power and the bias voltage are simultaneously in their respective low state or high state. In some embodiments, the plasma is a direct plasma. In some embodiments, the plasma is a remote plasma that is generated in a separate plasma generation chamber connected to the processing chamber. Process gases can be activated into plasma by any suitable method of generating the plasma, such as transformer coupled plasma (TCP) systems, inductively coupled plasma (ICP) systems, capacitively coupled plasma (CCP) systems, magnetically enhanced reactive ion techniques, electron cyclotron resonance techniques, or the like.

The process gases used in the plasma etching process includes at least one or more etchant gas(es) and a passivation gas. The etchant gas(es) can include a fluorine or chlorine based gas. In embodiments where the shared source/drain contact 102 is formed of tungsten, suitable examples of the etchant gas(es) include $NF_3$, $SF_6$, $CF_4$, $CHF_3$, $CH_2F_2$, $CH_3F$, $C_4F_6$, $C_4F_8$, $C_5F_8$, the like, or combinations thereof, and suitable examples of the passivation gas include CO, $O_2$, $H_2$ or the like. In embodiments where the shared source/drain contact 102 is formed of cobalt, suitable examples of the etchant gas(es) include $Cl_2$, $NF_3$, $SF_6$, $CF_4$, $CHF_3$, $CH_2F_2$, $CH_3F$, $C_4F_6$, $C_4F_8$, $C_5F_8$, the like, or combinations thereof, and suitable examples of the passivation gas include CO, $O_2$, $H_2$ or the like. Carrier gases, such as $N_2$, Ar, He, or the like, may be used to carry the process gases into the processing chamber. Other process gases such as oxygen gas or hydrogen gas may also be used.

The etchant gas(es) convert the material of the shared source/drain contact 102 to a gas phase byproduct that can be evacuated from the processing chamber, thus forming the opening 112. In some embodiments, a single etchant gas is used that sublimates the material of the shared source/drain contact 102 directly to a gas phase byproduct. In some embodiments, multiple etchant gases are used. For example, a first etchant gas can be flowed along with a second etchant gas. The first etchant gas can be one of the fluorine or chlorine based etchant gases described above, and the second etchant gas can be hydrogen gas (which is suitable for etching cobalt) or oxygen gas (which is suitable for etching tungsten or cobalt). The first etchant gas converts the material of the shared source/drain contact 102 to a solid phase byproduct, and the second etchant gas sublimates the solid phase byproduct to a gas phase byproduct.

The passivation gas passivates the sidewalls of the opening 112 so that the lateral etch rate of the opening 112 can be reduced during the plasma etching process. Specifically, the passivation gas reacts with the material of the shared source/drain contact 102 to form byproducts that condense on the sidewalls of the separated source/drain contacts 102A, 102B and inhibit etching. As a result, the opening 112 can be formed to a high aspect ratio, e.g., a large height-to-width ratio. For example, the ratio of the height to the width of the opening 112 can be in the range of about 0.3:1 to about 3.3:1. Forming the opening 112 with a high aspect ratio allows pinch-off to be induced during a subsequent process for filling the opening 112. As such, a void can be intentionally formed between the separated source/drain contacts 102A, 102B.

The process gases may be flowed into the processing chamber at a rate in the range of about 10 sccm to about 950 sccm. For example, when multiple etchant gases are used, the first etchant gas may be flowed into the processing chamber at a rate in the range of about 5 sccm to about 500 sccm, the second etchant gas may be flowed into the processing chamber at a rate in the range of about 5 sccm to about 500 sccm, and the passivation gas may be flowed into the processing chamber at a rate in the range of about 5 sccm to about 10 sccm. The ratio of the flow rate of the etchant gas(es) to the flow rate of the passivation gas can be up to about 2:1, such as in the range of about 0.01:1 to about 2:1.

The plasma etching process may be performed using a bias voltage having a high voltage in the range of about 50 volts to about 800 volts. The plasma etching process may be performed using a plasma generation power having a high power in the range of about 100 watts to about 2500 watts. In some embodiments, the plasma generation power or the bias voltage may be pulsed with a duty cycle in the range of about 5% to about 95%, and may have a pulse frequency in the range of about 500 Hz to about 10000 Hz. The plasma etching process may be performed at a temperature in the range of about −80° C. to about 200° C. A pressure in the processing chamber may be in the range of about 5 mTorr to about 500 mTorr. The plasma etching process can be performed for a duration in the range of about 10 seconds to about 1000 seconds.

As noted above, the profile shape of the opening 112 can be controlled by controlling parameters of the plasma etching process. The opening 112 can be formed with a bowed profile shape by performing the plasma etching process at a high pressure, a low passivation gas flow rate, and/or a low bias voltage. For example, the pressure, bias voltage, passivation gas flow rate, and ratio of the flow rate of the etchant gas(es) to the flow rate of the passivation gas can be controlled to be in the ranges discussed above during the plasma etching process. Performing the plasma etching process with parameters in these ranges allows the opening 112 to be formed with a bowed profile shape, and performing the plasma etching process with parameters outside of these ranges does not allow for a bowed profile shape.

Figure 12D:
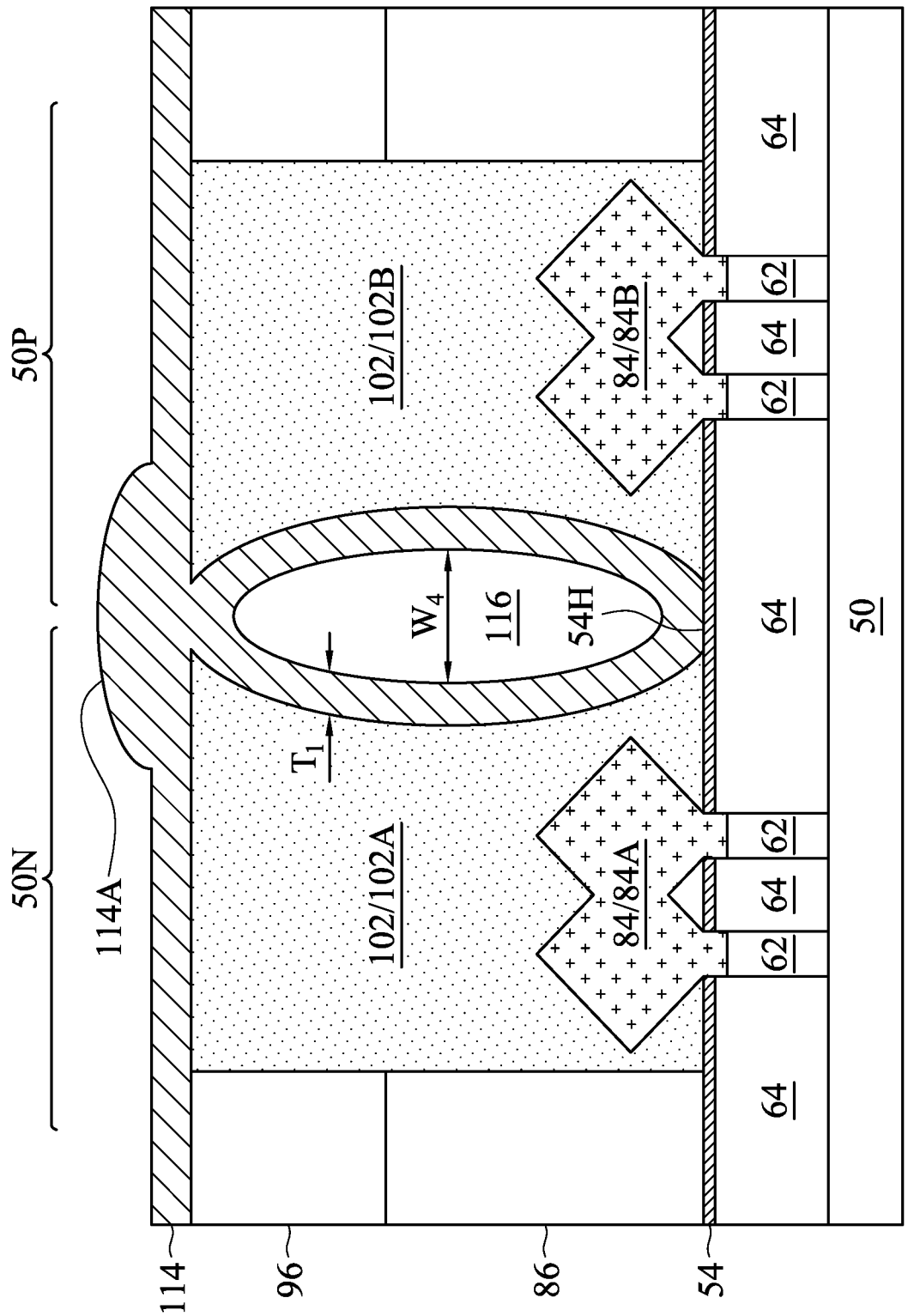

In FIG. 12D, a dielectric liner 114 is deposited in the opening 112 (see FIG. 12C), on the separated source/drain contacts 102A, 102B, and on the second ILD layer 96. The dielectric liner 114 may be formed of an oxide such as silicon oxide, a nitride such as silicon nitride, the like, or combinations thereof, and may be deposited by CVD, atomic layer deposition (ALD), or the like. In an embodiment, the dielectric liner 114 is formed of silicon oxide. The dielectric liner 114 lines the sidewalls and the bottom of the opening 112, such as the exposed sidewalls of the separated source/drain contacts 102A, 102B and the exposed horizontal portion 54H of the etch stop layer 54. Because the opening 112 is formed with a small width $W_1$ and a high aspect ratio, pinch-off occurs during deposition of the dielectric liner 114. As a result, a void 116 is formed from portions of the opening 112 that are not filled by the dielectric liner 114. The void 116 has a similar profile shape as the opening 112, e.g., a bowed profile shape. To promote formation of the void 116, a deposition process that is more prone to pinch-off such as CVD may be used to deposit the dielectric liner 114. The dielectric liner 114 along the sidewalls and the bottom of the opening 112 may be formed to a uniform thickness $T_1$ in the range of about 7 nm to about 60 nm, which can result in the void 116 having a width $W_4$ at its widest point (e.g., the center) in the range of about 1.5 nm to about 30 nm. The void 116 can be at a vacuum or filled with a gas (e.g., air) depending on the processing conditions during deposition of the dielectric liner 114. Loading may occur after pinch-off, thus causing the formation of a raised region 114A in the dielectric liner 114 over the void 116.

Figure 12E:
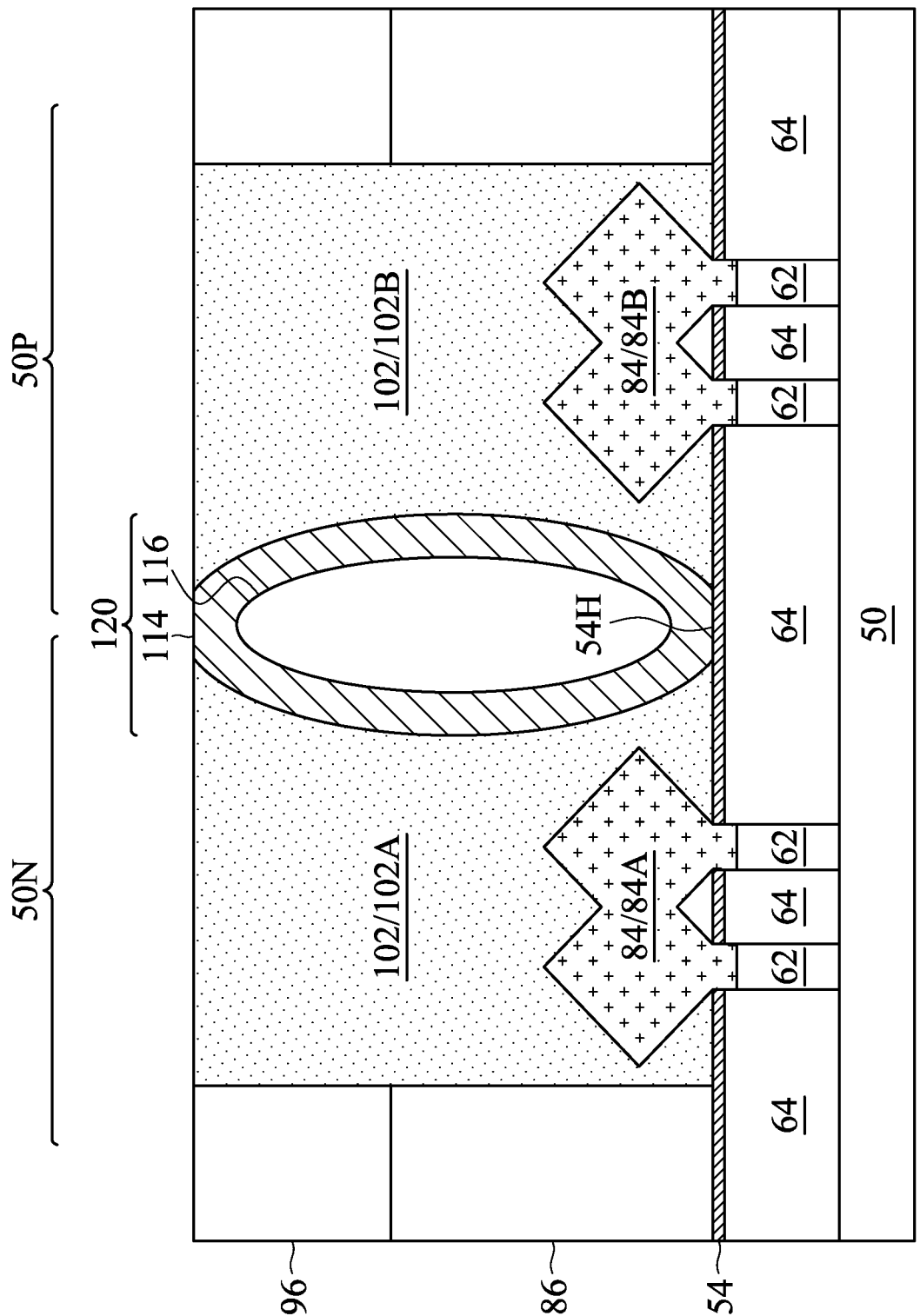

In FIG. 12E, a planarization process is performed to remove excess material of the dielectric liner 114 from the top surfaces of the separated source/drain contacts 102A, 102B and the second ILD layer 96. Specifically, the raised region 114A of the dielectric liner 114 is removed. The planarization process may be a CMP process, an etch back process, combinations thereof, or the like. The void 116 and the remaining portions of the dielectric liner 114 form the isolation feature 120, with the dielectric liner 114 surrounding the void 116. The isolation feature 120 has the same bowed profile shape and the same dimensions as the opening 112 (see FIG. 12C). After planarization, each of the isolation feature 120 and the separated source/drain contacts 102A, 102B contact the horizontal portion 54H of the etch stop layer 54, and each of the isolation feature 120 and the separated source/drain contacts 102A, 102B have the same height.

The isolation feature 120 physically and electrically isolates the separated source/drain contacts 102A, 102B. As noted above, the void 116 can be at a vacuum or filled with a gas (e.g., air). The void 116 can thus have a relative permittivity (e.g., k-value) of down to about 1, thereby giving the isolation feature 120 a very low relative permittivity. As such, a great amount of electrical isolation between the separated source/drain contacts 102A, 102B may be achieved. The relative permittivity of the isolation feature 120 is less than the relative permittivity of the surrounding dielectric features (e.g., the ILD layers 86, 96 and the etch stop layer 54). For example, the relative permittivity of the isolation feature 120 can be from about 10% to about 60% less than the relative permittivity of the surrounding dielectric features. As such, the amount of electrical isolation between the source/drain contacts 102A, 102B can be increased, thereby reducing the parasitic capacitance between the source/drain contacts 102 and increasing the performance of the resulting FinFETs.

Figure 12F:
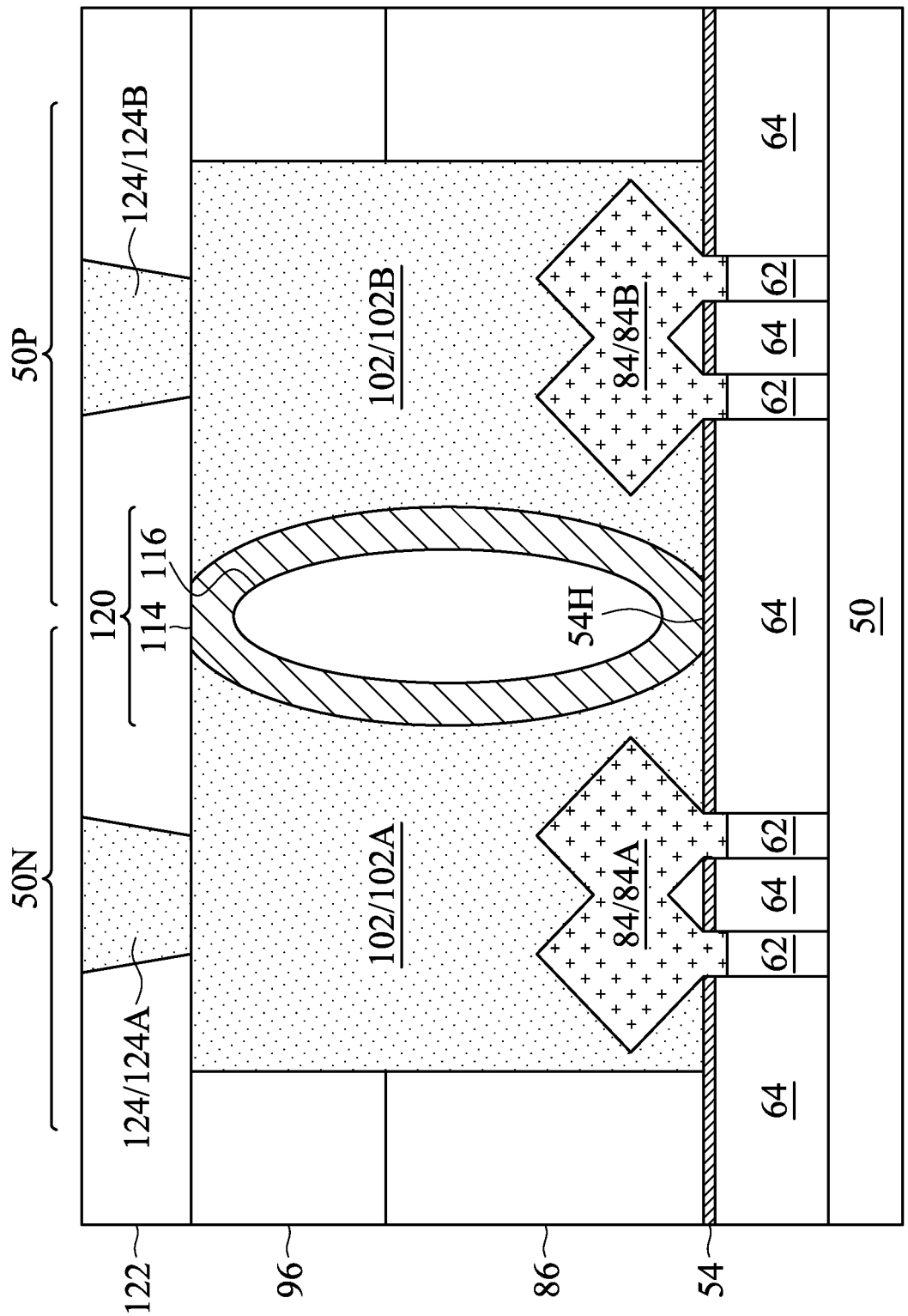

After the isolation feature 120 and the source/drain contacts 102A, 102B are formed, further processing of the FinFETs can be performed. For example, in FIG. 12F, an inter-metal dielectric (IMD) layer 122 is formed on the isolation feature 120, the separated source/drain contacts 102A, 102B, and the second ILD layer 96. Conductive features 124 are formed in the IMD layer 122, and are connected to the source/drain contacts 102. Specifically, a first conductive feature 124A is connected to the source/drain contact 102A and a second conductive feature 124B is connected to the source/drain contact 102B. The IMD layer 122 and conductive features 124 can be part of an interconnect structure. For example the conductive features 124 can include conductive vias and conductive lines that are part of metallization patterns (e.g., interconnects) of the interconnect structure. The metallization patterns interconnect the resulting FinFETs to form integrated circuits. The interconnect structure (comprising the IMD layer 122 and the conductive features 124) can be formed by a damascene process, such as a single damascene process, a dual damascene process, or the like.

The IMD layer 122 may be formed of any suitable dielectric material, for example, an oxide such as silicon oxide, phosphosilicate glass (PSG), borosilicate glass (BSG), boron-doped phosphosilicate glass (BPSG), or the like; a nitride such as silicon nitride; or the like. The IMD layer 122 may be formed by any acceptable deposition process, such as spin coating, physical vapor deposition (PVD), chemical vapor deposition (CVD), the like, or a combination thereof. The IMD layer 122 may be a layer formed of a low-k dielectric material having a k-value lower than about 3.0. The IMD layer 122 may be a layer formed of an extra-low-k (ELK) dielectric material having a k-value of less than 2.5. In some embodiments, an etch stop layer is formed between the IMD layer 122 and the second ILD layer 96. The etch stop layer may comprise a dielectric material, such as silicon nitride, silicon oxide, silicon oxynitride, or the like, having a different etch rate than the material of the IMD layer 122.

The conductive features 124 can include diffusion barrier layers and conductive material over the diffusion barrier layers. As an example to form the conductive features 124, openings are formed in the IMD layer 122 expose underlying conductive features, such as the source/drain contacts 102. The openings may be formed using acceptable photolithography and etching techniques. The diffusion barrier layers may be formed of titanium, titanium nitride, tantalum, tantalum nitride, or the like, and may be formed in the openings by a deposition process such as atomic layer deposition (ALD) or the like. The conductive material may include copper, aluminum, tungsten, silver, and combinations thereof, or the like, and may be formed over the diffusion barrier layers in the openings by an electro-chemical plating process, CVD, ALD, PVD, the like, or a combination thereof. In an embodiment, the conductive material is copper, and the diffusion barrier layers are thin barrier layers that prevent the copper from diffusing into the IMD layer 122. After formation of the diffusion barrier layers and the conductive material, excess of the diffusion barrier layers and conductive material may be removed by, for example, a planarization process such as a chemical mechanical polish (CMP) process. The remaining portions of the diffusion barrier layers and conductive material form the conductive features 124.

FIGS. 13A through 13D are cross-sectional views of intermediate stages in the manufacturing of source/drain contacts for FinFETs, in accordance with some embodiments. FIGS. 13A through 13D are cross-sectional views illustrated along reference cross-section C-C in FIG. 1, where four fins are shown, and illustrate features in both the region 50N and the region 50P. As discussed further below, FIGS. 13A through 13D illustrate another "cut last" contact formation process, where a shared source/drain contact is divided to form multiple separated source/drain contacts 102A, 102B (see FIG. 13A) and an isolation feature 120 (see FIG. 13C) is formed between the separated source/drain contacts 102A, 102B. In this embodiment, the isolation feature 120 has a reentrant profile shape. Processing of FinFETs having merged epitaxial source/drain regions 84 similar to those in FIG. 7C is shown, but it should be appreciated that FinFETs having separated epitaxial source/drain regions 84 similar to those in FIG. 7D may be processed using similar techniques. Further, although the formation of two separated source/drain contacts 102A, 102B and one isolation feature 120 is shown, it should be appreciated that any desired quantity of isolation features and separated source/drain contacts may be formed simultaneously.

Figure 13A:
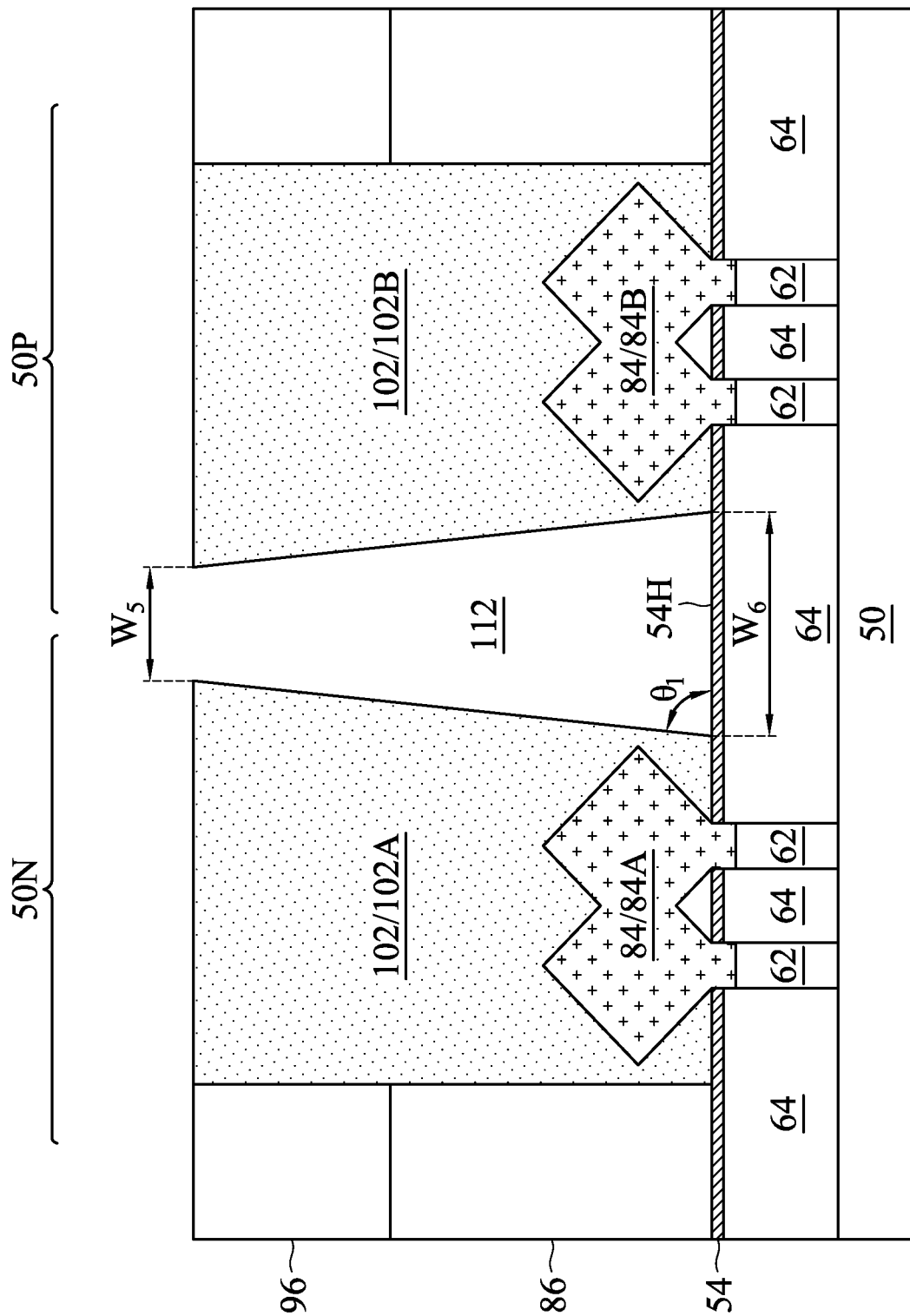
FIGS. 13A, 13B, 13C, and 13D are cross-sectional views of further intermediate stages in the manufacturing of FinFETs, in accordance with some other embodiments.

In FIG. 13A, a structure similar to that shown in FIG. 12B is obtained and an opening 112 is formed in the shared source/drain contact 102. The opening 112 divides the shared source/drain contact 102 into multiple separated source/drain contacts 102A, 102B. The opening 112 exposes sidewalls of the separated source/drain contacts 102A, 102B and a horizontal portion 54H of the etch stop layer 54. The separated source/drain contact 102A is connected to an epitaxial source/drain region 84A, and the separated source/drain contact 102B is connected to an epitaxial source/drain region 84B. The separated source/drain contacts 102A, 102B both contact the horizontal portion 54H of the etch stop layer 54.

The opening 112 can be formed using acceptable photolithography and etching techniques. In some embodiments, the opening 112 is formed by an anisotropic etch performed by a plasma process, described in greater detail below. The etch is selective to the material of the shared source/drain contact 102 (e.g., etches the material of the shared source/drain contact 102 at a faster rate than the material of the etch stop layer 54). As such, the horizontal portion 54H of the etch stop layer 54 acts as an etch stop for the plasma etching process.

The profile shape of the opening 112 can be controlled by controlling parameters of the plasma etching process. For example, dimensions of the opening 112, such as different widths at different locations along the opening 112, may be controlled. As an illustrative example, the widths $W_5$ and $W_6$ shown in FIG. 13A indicate two locations along the opening 112 that may be controlled by the plasma etching process. Other locations, more locations, or fewer locations along the opening 112 may be used to characterize the profile shape of opening 112. The width $W_5$ is located at the top of the opening 112. The width $W_6$ is located at the bottom of the opening 112, along the exposed horizontal portion 54H of the etch stop layer 54. In an embodiment, the width $W_5$ can be in the range of about 15 nm to about 120 nm, and the width $W_6$ can be in the range of about 16 nm to about 144 nm. The opening 112 has a reentrant profile shape, such that sidewalls of the opening 112 form an acute angle $\theta_1$ with a surface of the etch stop layer 54. The acute angle $\theta_1$ can be in the range of about 86 degrees to about 89.5 degrees. Because the angle $\theta_1$ is acute, the width $W_5$ is less than the width $W_6$ and the width of the opening 112 increases continually in a direction extending from the top of the opening 112 to the bottom of the opening 112. In an embodiment, the width $W_6$ can be from about 5% to about 20% greater than the width $W_5$. Forming the opening 112 with a small width $W_5$ allows pinch-off to be induced during a subsequent process for filling the opening 112. As such, a void can be intentionally formed between the separated source/drain contacts 102A, 102B.

The plasma etching process is performed in a processing chamber with process gases being supplied into the processing chamber. The plasma etching process can be performed by generating a plasma in a similar manner as that described with respect to FIG. 12C. The plasma etching process can be performed with similar process gases as those described with respect to FIG. 12C. In this embodiment, the process gases include etchant gas(es) that have a very high etching selectivity between the material of the etch stop layer 54 and the material of the shared source/drain contact 102. For example, the plasma etching process can be performed with $NF_3$, $SF_6$, $CF_4$, $CHF_3$, $CH_2F_2$, $CH_3F$, $C_4F_6$, $C_4F_8$, $C_5F_8$, the like, or combinations thereof when the shared source/drain contact 102 is formed of tungsten or can be performed with $Cl_2$, $NF_3$, $SF_6$, $CF_4$, $CHF_3$, $CH_2F_2$, $CH_3F$, $C_4F_6$, $C_4F_8$, $C_5F_8$, the like, or combinations thereof when the shared source/drain contact 102 is formed of cobalt, thus allowing for an etching selectivity in the range of about 10:1 to about 50:1. Performing the plasma etching process with a high etching selectivity allows the plasma etching process to be performed for a long duration such that a significant amount of over-etching occurs. The plasma etching process in this embodiment may be performed for a longer duration than that described with respect to FIG. 12C. For example, the plasma etching process can be performed for a duration in the range of about 15 seconds to about 1500 seconds. Because the etch stop layer 54 overlies the STI regions 64, damage to the STI regions 64 and/or fins 62 can be avoided even when significant over-etching occurs.

As noted above, the profile shape of the opening 112 can be controlled by controlling parameters of the plasma etching process. The opening 112 can be formed with a reentrant profile shape by performing the plasma etching process for a long duration and with a high etching selectivity to the etch stop layer 54. For example, the duration and the etching selectivity to the etch stop layer 54 can be controlled to be in the ranges discussed above during the plasma etching process. Performing the plasma etching process with parameters in these ranges allows the opening 112 to be formed with a reentrant profile shape, and performing the plasma etching process with parameters outside of these ranges does not allow for a reentrant profile shape.

Figure 13B:
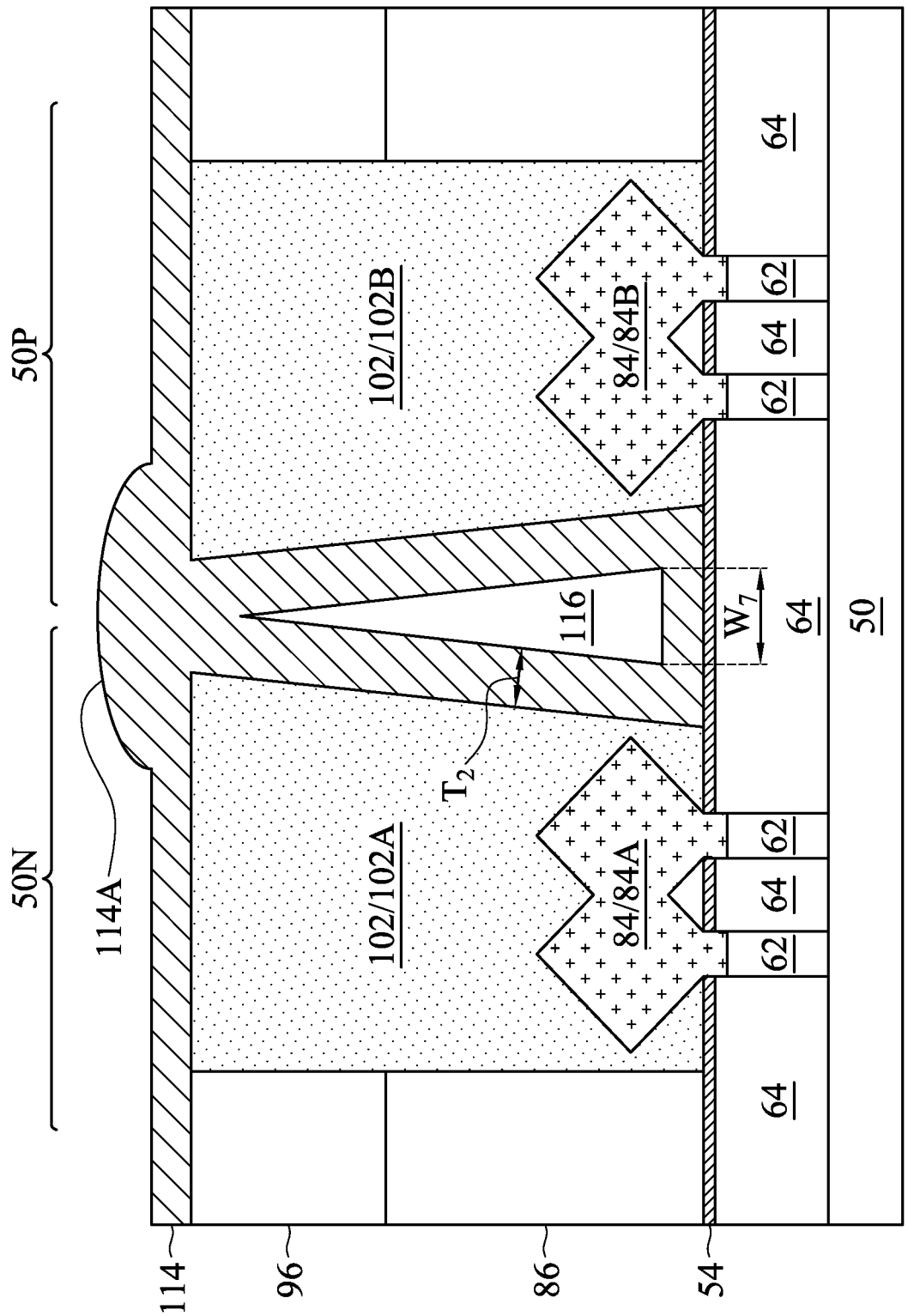

In FIG. 13B, a dielectric liner 114 is deposited in the opening 112 (see FIG. 13A), on the separated source/drain contacts 102A, 102B, and on the second ILD layer 96. The dielectric liner 114 can be formed of similar materials and in a similar manner as that described with respect to FIG. 12D. The dielectric liner 114 lines the sidewalls and the bottom of the opening 112, such as the exposed sidewalls of the separated source/drain contacts 102A, 102B and the exposed horizontal portion 54H of the etch stop layer 54. Because the opening 112 is formed with a small width $W_5$, pinch-off occurs during deposition of the dielectric liner 114. As a result, a void 116 is formed from portions of the opening 112 that are not filled by the dielectric liner 114. The void 116 has a similar profile shape as the opening 112, e.g., a reentrant profile shape. The dielectric liner 114 along the sidewalls and the bottom of the opening 112 may be formed to a uniform thickness $T_2$ in the range of about 7 nm to about 60 nm, which can result in the void 116 having a width $W_7$ at its widest point (e.g., the bottom) in the range of about 1 nm to about 24 nm. The void 116 can be at a vacuum or filled with a gas (e.g., air) depending on the processing conditions during deposition of the dielectric liner 114. Loading may occur after pinch-off, thus causing the formation of a raised region 114A in the dielectric liner 114 over the void 116.

Figure 13C:
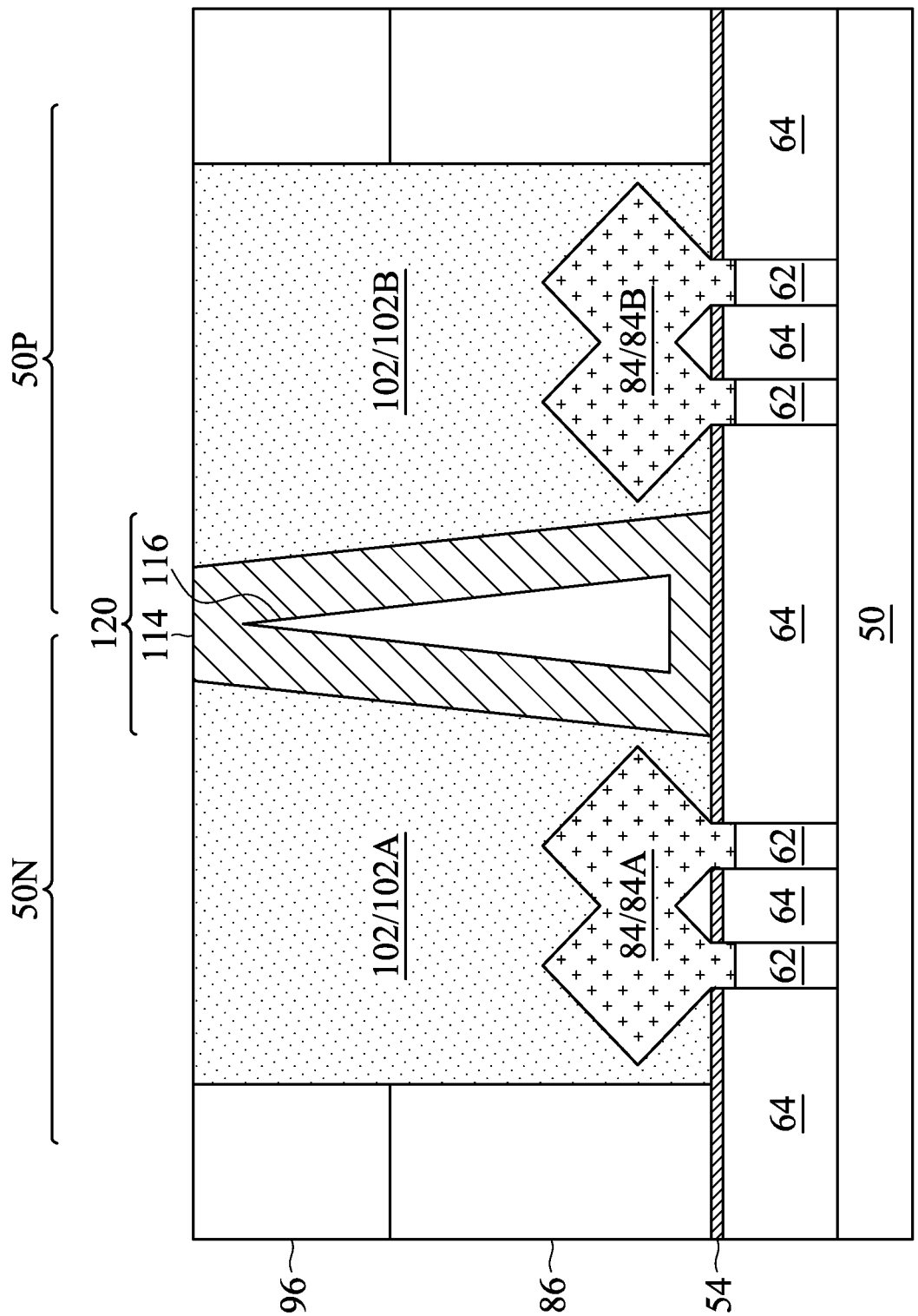
Figure 13D:
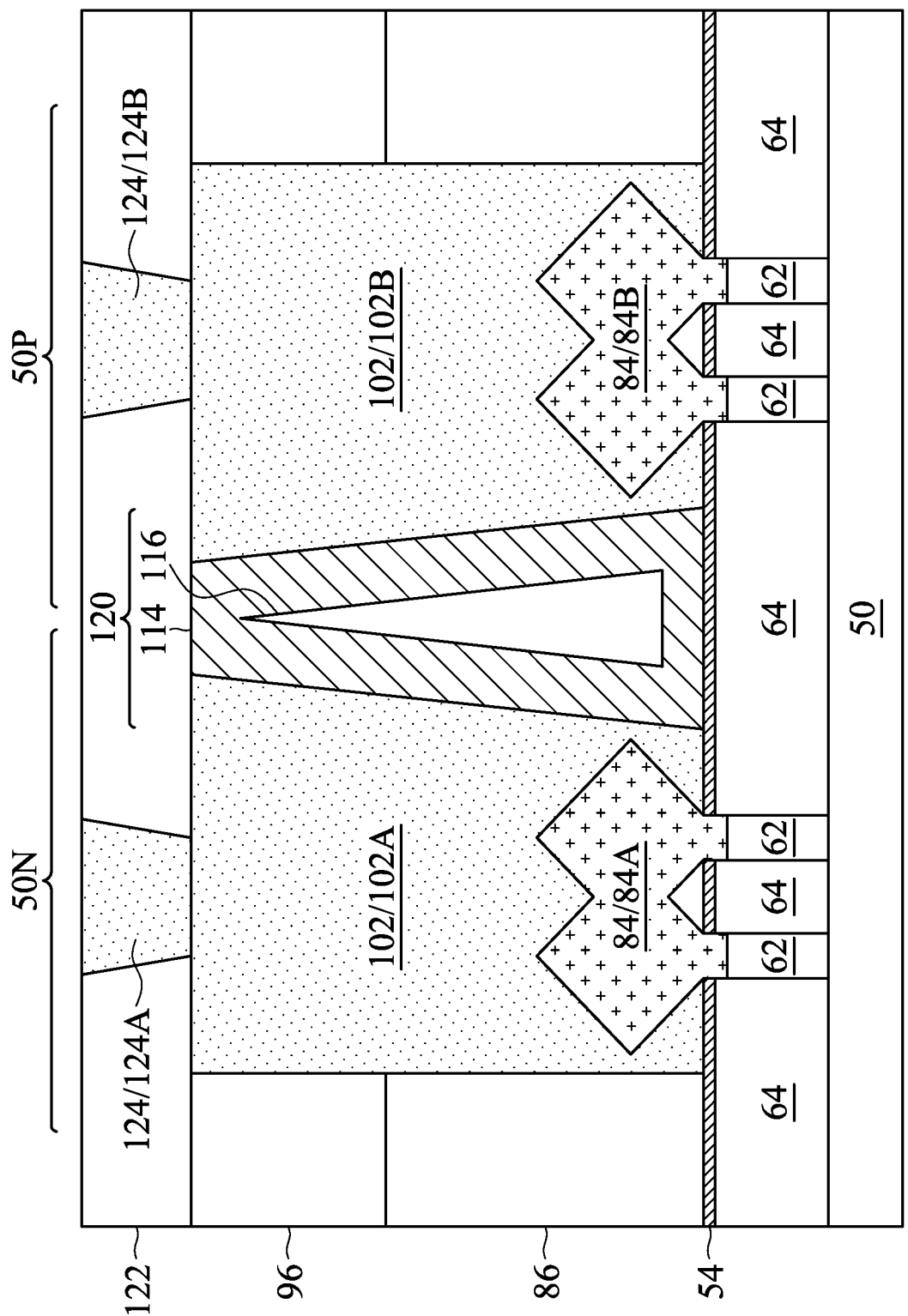

In FIG. 13C, a planarization process is performed to remove excess material of the dielectric liner 114 from the top surfaces of the separated source/drain contacts 102A, 102B and the second ILD layer 96. Specifically, the raised region 114A of the dielectric liner 114 is removed. The planarization process may be a CMP process, an etch back process, combinations thereof, or the like. The void 116 and the remaining portions of the dielectric liner 114 form the isolation feature 120, with the dielectric liner 114 surrounding the void 116. The isolation feature 120 has the same reentrant profile shape and the same dimensions as the opening 112 (see FIG. 13A).

After the isolation feature 120 and the source/drain contacts 102A, 102B are formed, further processing of the FinFETs can be performed. For example, in FIG. 13D, an IMD layer 122 is formed on the isolation feature 120, the separated source/drain contacts 102A, 102B, and the second ILD layer 96. Conductive features 124 are formed in the IMD layer 122, and are connected to the source/drain contacts 102. The IMD layer 122 and the conductive features 124 can be formed of similar materials and in a similar manner as those described with respect to FIG. 12F.

FIGS. 14A through 14E are cross-sectional views of intermediate stages in the manufacturing of source/drain contacts for FinFETs, in accordance with some embodiments. FIGS. 14A through 14E are cross-sectional views illustrated along reference cross-section C-C in FIG. 1, where four fins are shown, and illustrate features in both the region 50N and the region 50P. As discussed further below, FIGS. 14A through 14E illustrate a "cut first" contact formation process where an isolation feature 120 (see FIG. 14C) is initially formed in the ILD layers 86, 96. After the isolation feature 120 is formed, multiple separated source/drain contacts 102A, 102B (see FIG. 14E) are formed adjacent the isolation feature 120. In this embodiment, the isolation feature 120 has a bowed profile shape. Processing of FinFETs having merged epitaxial source/drain regions 84 similar to those in FIG. 7C is shown, but it should be appreciated that FinFETs having separated epitaxial source/drain regions 84 similar to those in FIG. 7D may be processed using similar techniques. Further, although the formation of two separated source/drain contacts 102A, 102B and one isolation feature 120 is shown, it should be appreciated that any desired quantity of isolation features and separated source/drain contacts may be formed simultaneously.

Figure 14A:
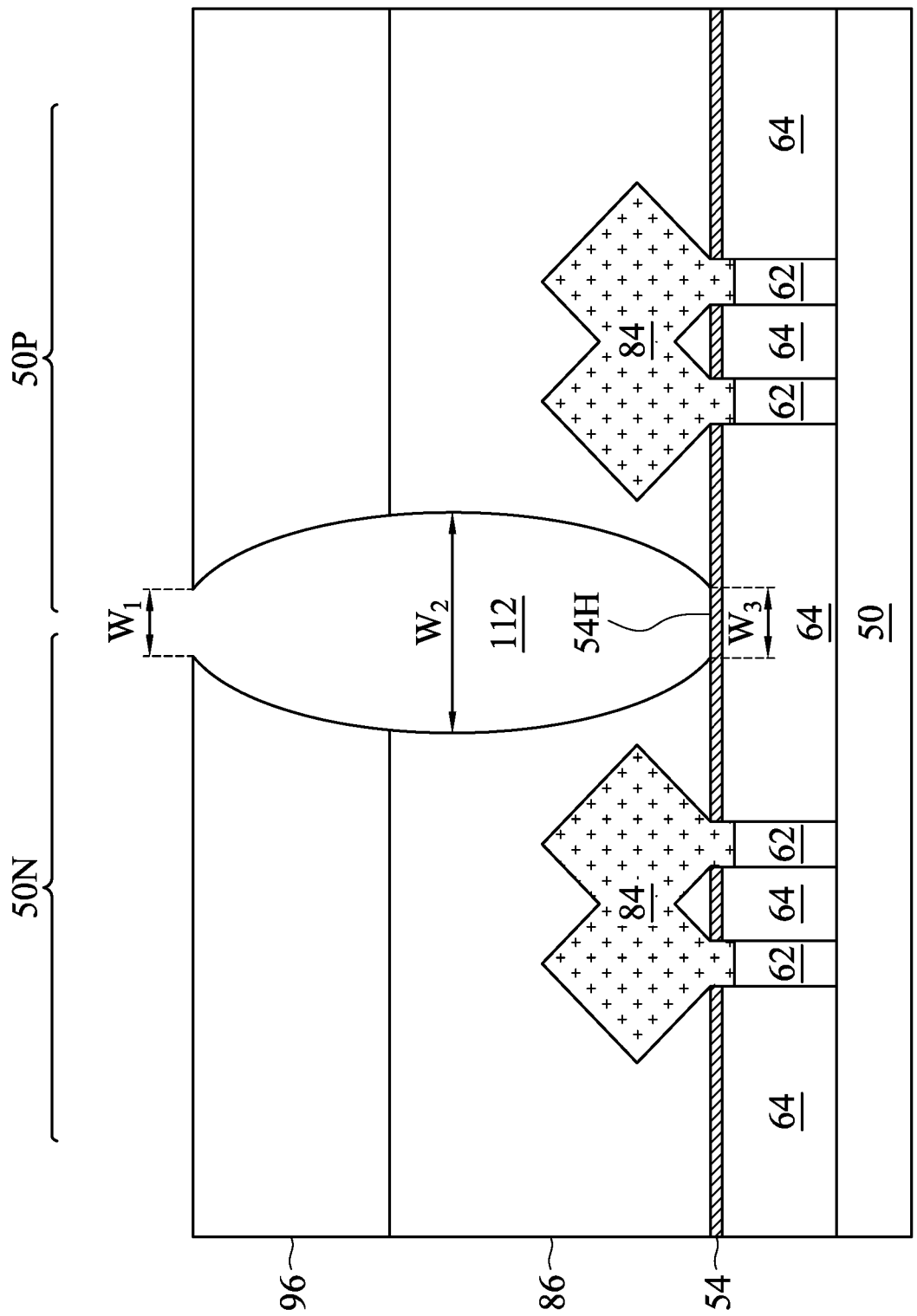
FIGS. 14A, 14B, 14C, 14D, and 14E are cross-sectional views of FinFETs, in accordance with some other embodiments.

In FIG. 14A, an opening 112 for an isolation feature is formed through the ILD layers 86, 96. The opening 112 may be formed by a similar plasma etching process as that described with respect to FIG. 12C, such that the opening 112 has a bowed profile shape. In some embodiments, the opening 112 can be formed by performing the plasma etching process, and subsequently performing an isotropic chemical etch using dilute hydrofluoric (HF) acid, a combination of HF acid and $NH_3$ with application of heat (e.g., a thermal process), a combination of $NF_3$ and $NH_3$ with application of plasma, or the like. The opening 112 can have similar widths $W_1$, $W_2$, and $W_3$ as those described with respect to FIG. 12C. The opening 112 exposes sidewalls of the ILD layers 86, 96 and a horizontal portion 54H of the etch stop layer 54. The horizontal portion 54H of the etch stop layer 54 acts as an etch stop for the plasma etching process.

Figure 14B:
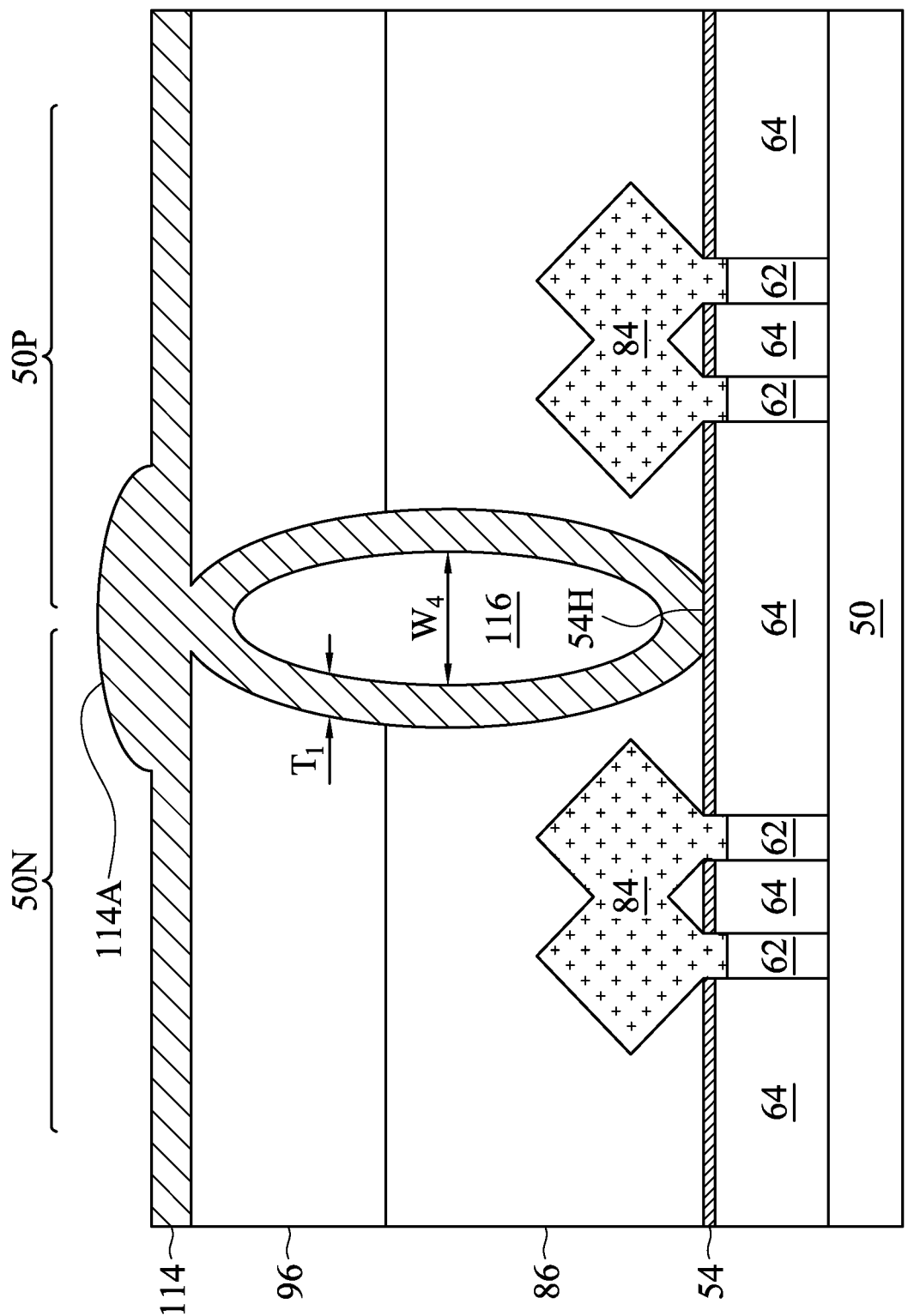

In FIG. 14B, a dielectric liner 114 is deposited in the opening 112 (see FIG. 14A), on the second ILD layer 96. The dielectric liner 114 can be formed in a similar manner as that described with respect to FIG. 12D, except in this embodiment, the dielectric liner 114 is formed from a material that has a high etching selectivity from the etching of the ILD layers 86, 96. For example, when the ILD layers 86, 96 are formed of an oxide, such as silicon oxide, the dielectric liner 114 can be formed of a nitride, such as silicon nitride. Due to pinch-off during deposition, a void 116 is formed from portions of the opening 112 that are not filled by the dielectric liner 114. Loading may occur after pinch-off, thus causing the formation of a raised region 114A in the dielectric liner 114 over the void 116. The void 116 has a similar profile shape as the opening 112, e.g., a bowed profile shape. The dielectric liner 114 can have a similar thickness $T_1$ as that described with respect to FIG. 12D. The void 116 can have a similar width $W_4$ as that described with respect to FIG. 12D.

Figure 14C:
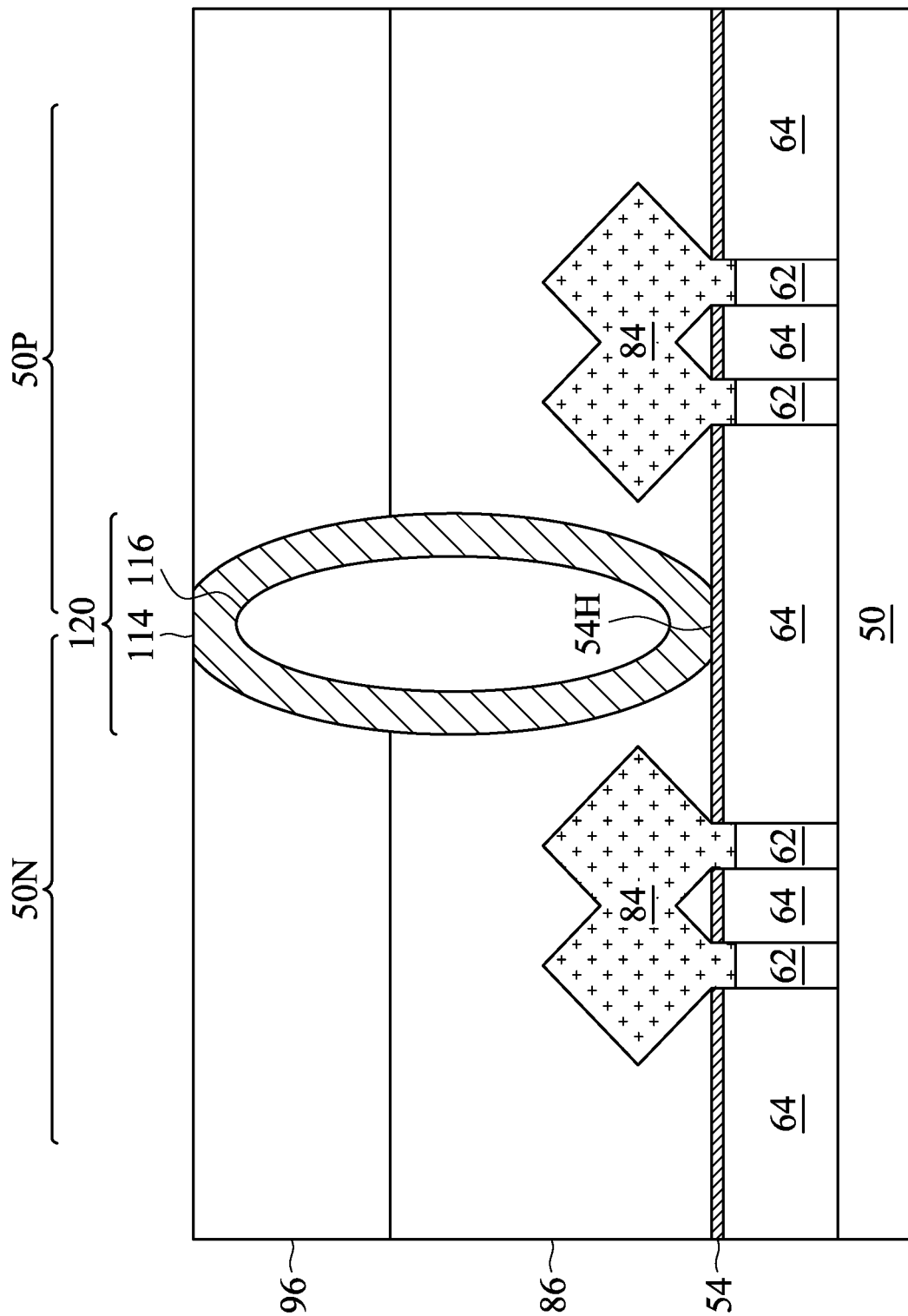

In FIG. 14C, a planarization process is performed to remove excess material of the dielectric liner 114 from the top surface of the second ILD layer 96. Specifically, the raised region 114A of the dielectric liner 114 is removed. The planarization process may be a CMP process, an etch back process, combinations thereof, or the like. The void 116 and the remaining portions of the dielectric liner 114 form the isolation feature 120, with the dielectric liner 114 surrounding the void 116. The isolation feature 120 has the same bowed profile shape and the same dimensions as the opening 112 (see FIG. 14A).

Figure 14D:
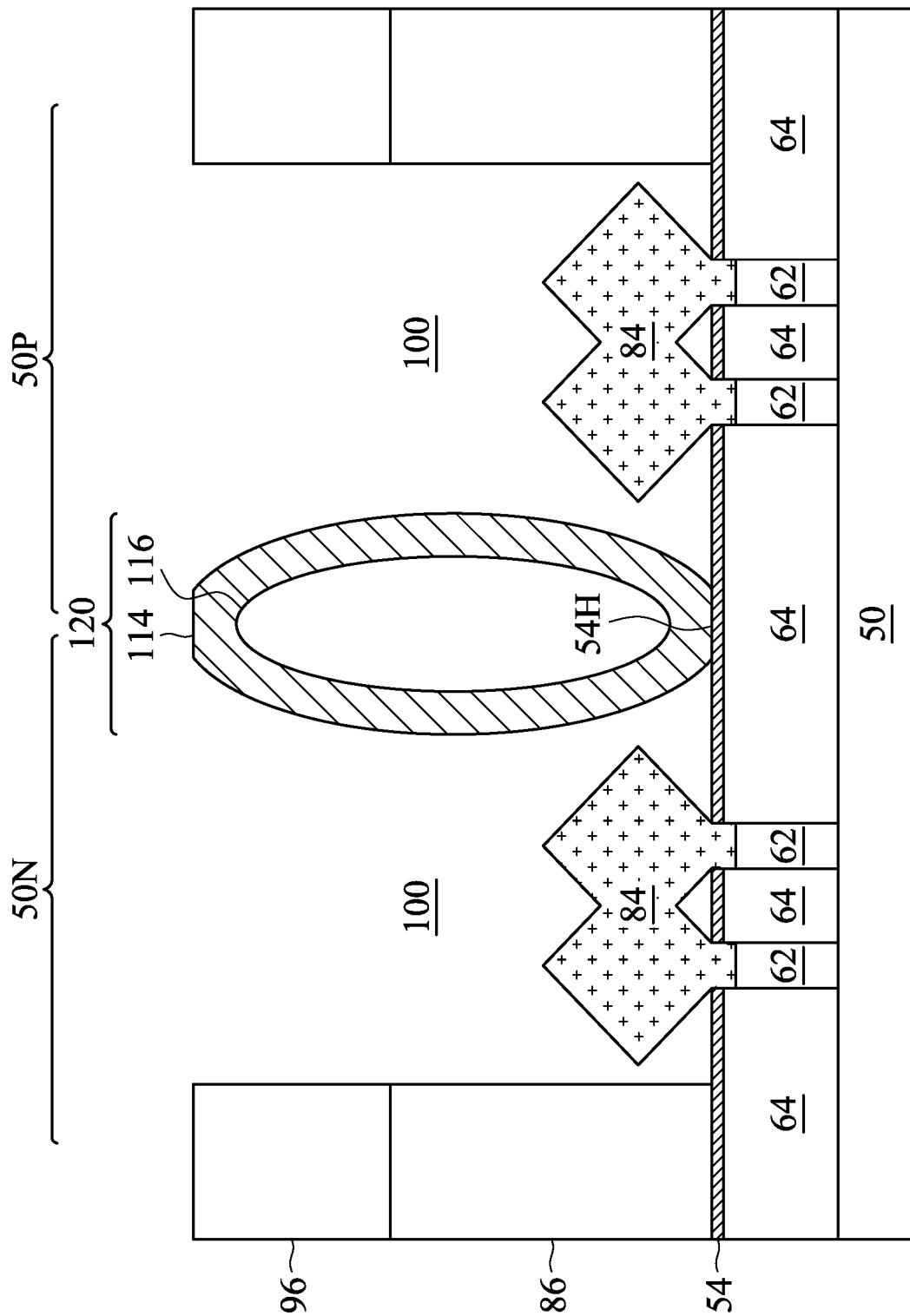

In FIG. 14D, openings 100 for source/drain contacts are formed through the ILD layers 86, 96. The openings 100 may be formed using acceptable photolithography and etching techniques. The etching is selective to the material of the ILD layers 86, 96, e.g., the material of the ILD layers 86, 96 is selectively etched at a greater rate than the material of the dielectric liner 114. After formation, the openings 100 extend through the ILD layers 86, 96 and expose the etch stop layer 54. The etch stop layer 54 stops the etching of the openings 100. Because the etch stop layer 54 underlies the raised portions of the epitaxial source/drain regions 84, all of the facets of the epitaxial source/drain regions 84 can be exposed by the openings 100. The openings 100 expose sidewalls of the isolation feature 120, e.g., sidewalls of the dielectric liner 114.

Figure 14E:
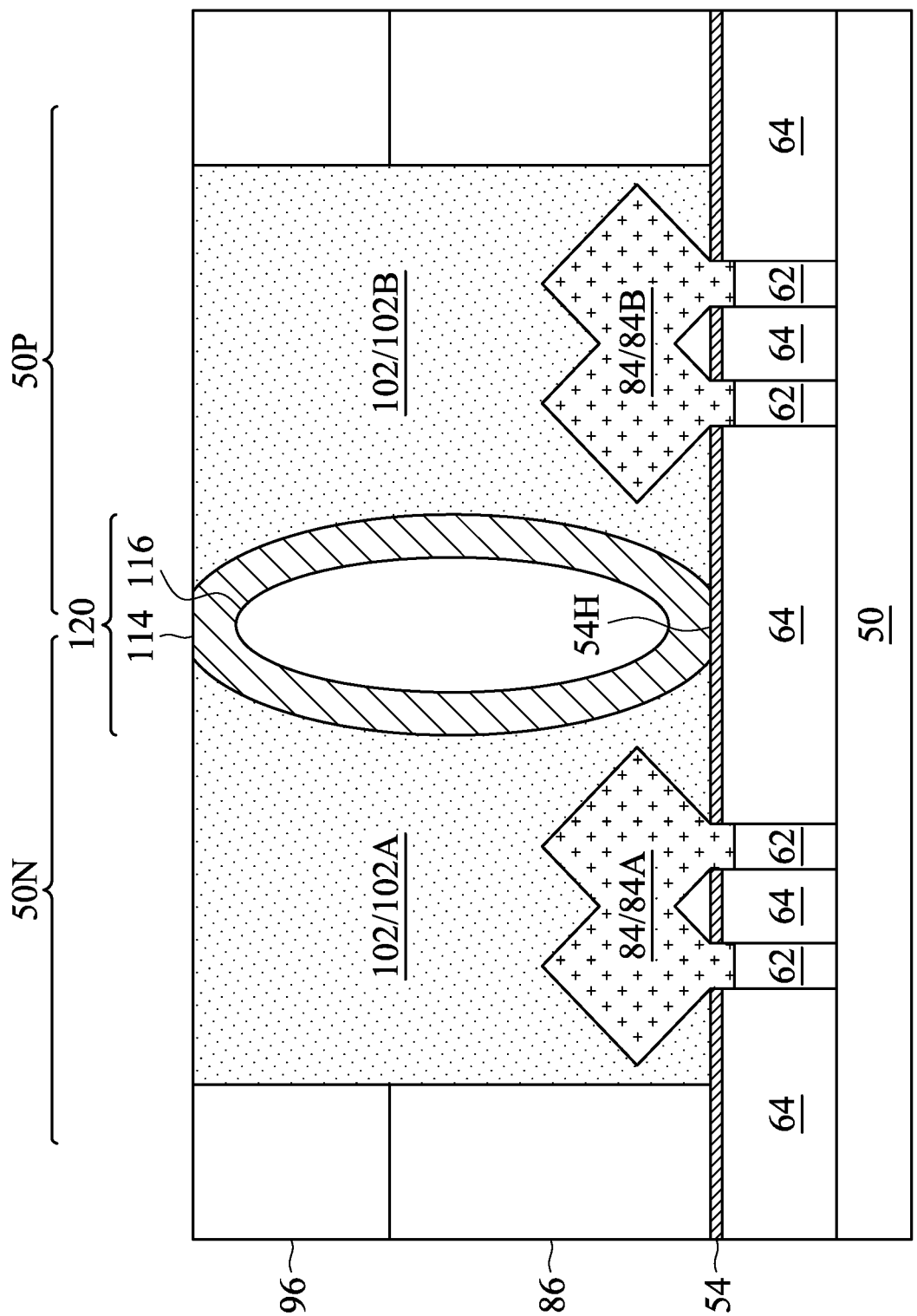

In FIG. 14E, separated source/drain contacts 102A, 102B are formed in the openings 100. A liner, such as a diffusion barrier layer, an adhesion layer, or the like, and a conductive material are formed in the openings 100. The liner may include titanium, titanium nitride, tantalum, tantalum nitride, or the like. The conductive material may be cobalt, tungsten, aluminum, copper, silver, gold, nickel, the like, or combinations thereof. In an embodiment, the conductive material is cobalt. In another embodiment, the conductive material is tungsten. A planarization process, such as a CMP, may be performed to remove excess material from surfaces of the second ILD layer 96 and the dielectric liner 114. The remaining liner and conductive material form the separated source/drain contacts 102A, 102B. The separated source/drain contact 102A is connected to an epitaxial source/drain region 84A, the separated source/drain contact 102B is connected to an epitaxial source/drain region 84B, and the isolation feature 120 is disposed between the separated source/drain contacts 102A, 102B. The separated source/drain contacts 102A, 102B both contact the horizontal portion 54H of the etch stop layer 54. After planarization, each of the isolation feature 120 and the separated source/drain contacts 102A, 102B contact the horizontal portion 54H of the etch stop layer 54, and each of the isolation feature 120 and the separated source/drain contacts 102A, 102B have the same height.

In some embodiments, metal-semiconductor alloy regions (not shown) are formed between the epitaxial source/drain regions 84A, 84B and the separated source/drain contacts 102A, 102B, respectively, such as on portions of the epitaxial source/drain regions 84A, 84B exposed by the openings 100. The metal-semiconductor alloy regions can similar to those described above.

After the isolation feature 120 and the source/drain contacts 102A, 102B are formed, further processing of the FinFETs can be performed. For example, similar to the embodiment of FIG. 12F, an IMD layer 122 is formed on the isolation feature 120, the separated source/drain contacts 102A, 102B, and the second ILD layer 96. Conductive features 124 are formed in the IMD layer 122, and are connected to the source/drain contacts 102.

FIGS. 15A through 15D are cross-sectional views of intermediate stages in the manufacturing of source/drain contacts for FinFETs, in accordance with some embodiments. FIGS. 15A through 15D are cross-sectional views illustrated along reference cross-section C-C in FIG. 1, where four fins are shown, and illustrate features in both the region 50N and the region 50P. As discussed further below, FIGS. 15A through 15D illustrate a "cut first" contact formation process where an isolation feature 120 (see FIG. 15C) is initially formed in the ILD layers 86, 96. After the isolation feature 120 is formed, multiple separated source/drain contacts 102A, 102B (see FIG. 15D) are formed adjacent the isolation feature 120. In this embodiment, the isolation feature 120 has a reentrant profile shape. Processing of FinFETs having merged epitaxial source/drain regions 84 similar to those in FIG. 7C is shown, but it should be appreciated that FinFETs having separated epitaxial source/drain regions 84 similar to those in FIG. 7D may be processed using similar techniques. Further, although the formation of two separated source/drain contacts 102A, 102B and one isolation feature 120 is shown, it should be appreciated that any desired quantity of isolation features and separated source/drain contacts may be formed simultaneously.

Figure 15A:
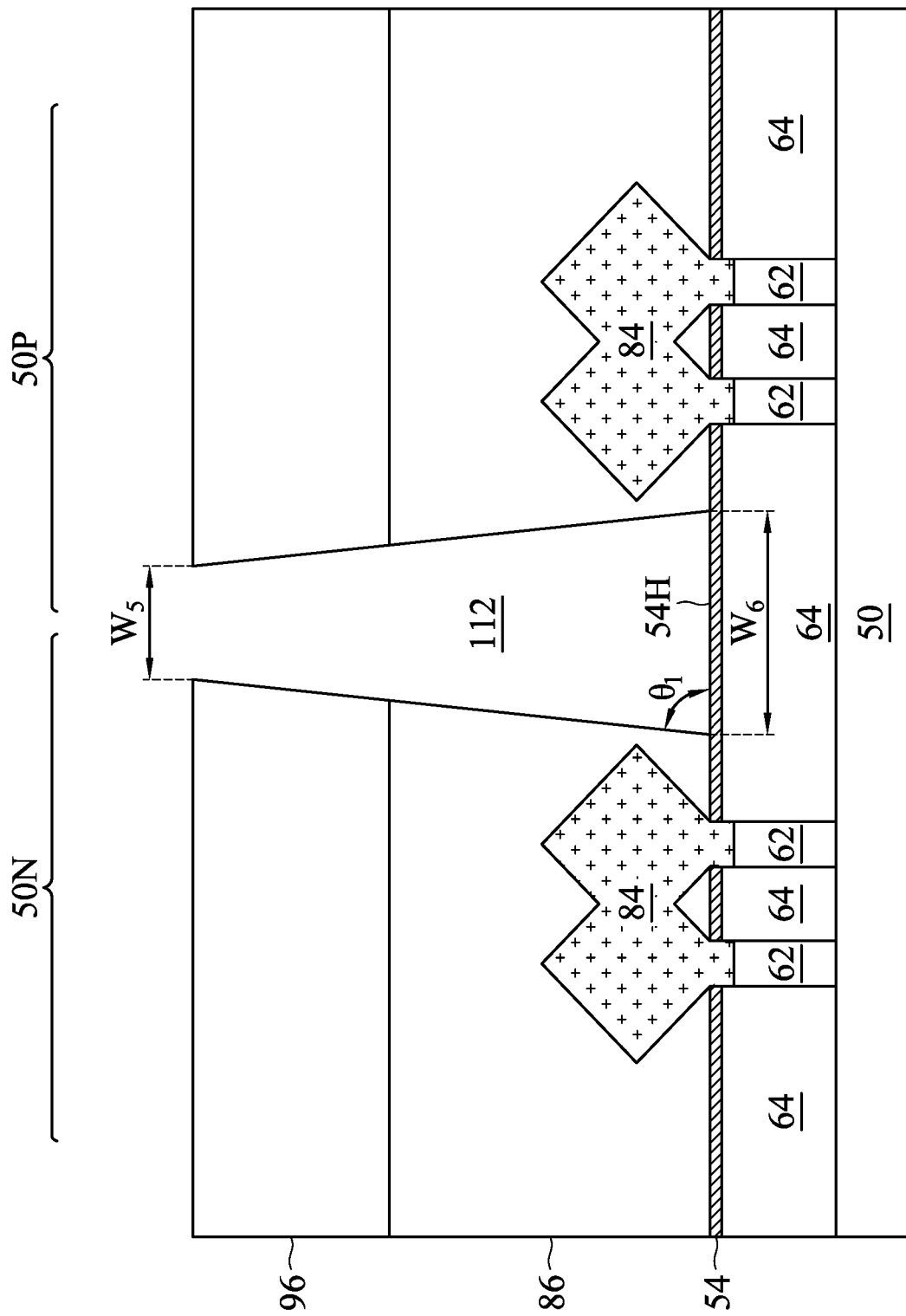
FIGS. 15A, 15B, 15C, and 15D are cross-sectional views of further intermediate stages in the manufacturing of FinFETs, in accordance with some other embodiments.

In FIG. 15A, an opening 112 for an isolation feature is formed through the ILD layers 86, 96. The opening 112 may be formed by a similar plasma etching process as that described with respect to FIG. 13A, such that the opening 112 has a reentrant profile shape. The opening 112 can have similar widths $W_5$ and $W_6$ as those described with respect to FIG. 13A. The opening 112 exposes sidewalls of the ILD layers 86, 96 and a horizontal portion 54H of the etch stop layer 54. The horizontal portion 54H of the etch stop layer 54 acts as an etch stop for the plasma etching process.

Figure 15B:
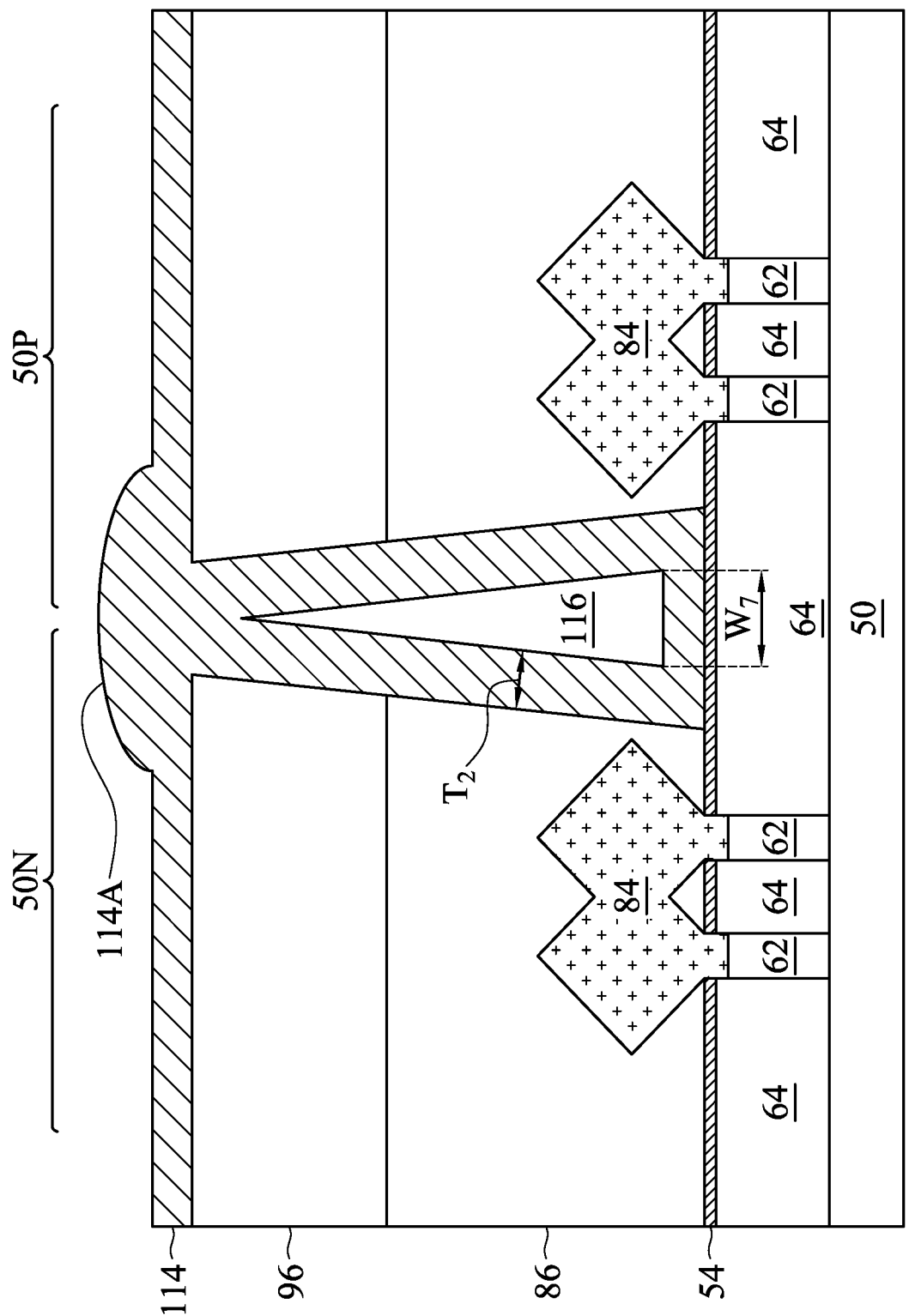

In FIG. 15B, a dielectric liner 114 is deposited in the opening 112 (see FIG. 15A), on the second ILD layer 96. The dielectric liner 114 can be formed in a similar manner as that described with respect to FIG. 12D, except in this embodiment, the dielectric liner 114 is formed from a material that has a high etching selectivity from the etching of the ILD layers 86, 96. For example, when the ILD layers 86, 96 are formed of an oxide, such as silicon oxide, the dielectric liner 114 can be formed of a nitride, such as silicon nitride. Due to pinch-off during deposition, a void 116 is formed from portions of the opening 112 that are not filled by the dielectric liner 114. Loading may occur after pinch-off, thus causing the formation of a raised region 114A in the dielectric liner 114 over the void 116. The void 116 has a similar profile shape as the opening 112, e.g., a reentrant profile shape. The dielectric liner 114 can have a similar thickness $T_2$ as that described with respect to FIG. 13B. The void 116 can have a similar width $W_7$ as that described with respect to FIG. 13B.

Figure 15C:
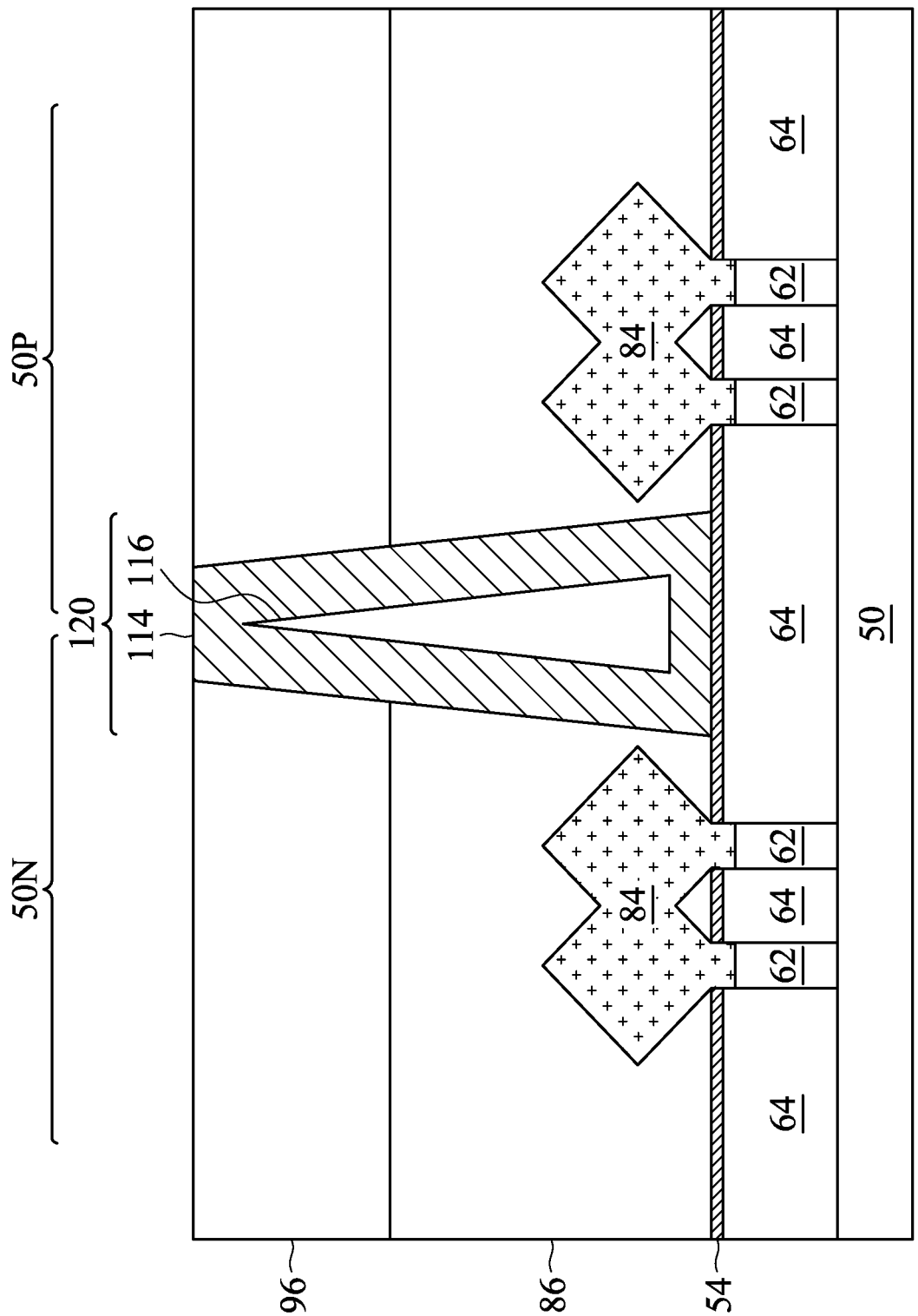

In FIG. 15C, a planarization process is performed to remove excess material of the dielectric liner 114 from the top surface of the second ILD layer 96. Specifically, the raised region 114A of the dielectric liner 114 is removed. The planarization process may be a CMP process, an etch back process, combinations thereof, or the like. The void 116 and the remaining portions of the dielectric liner 114 form the isolation feature 120, with the dielectric liner 114 surrounding the void 116. The isolation feature 120 has the same reentrant profile shape and the same dimensions as the opening 112 (see FIG. 15A).

Figure 15D:
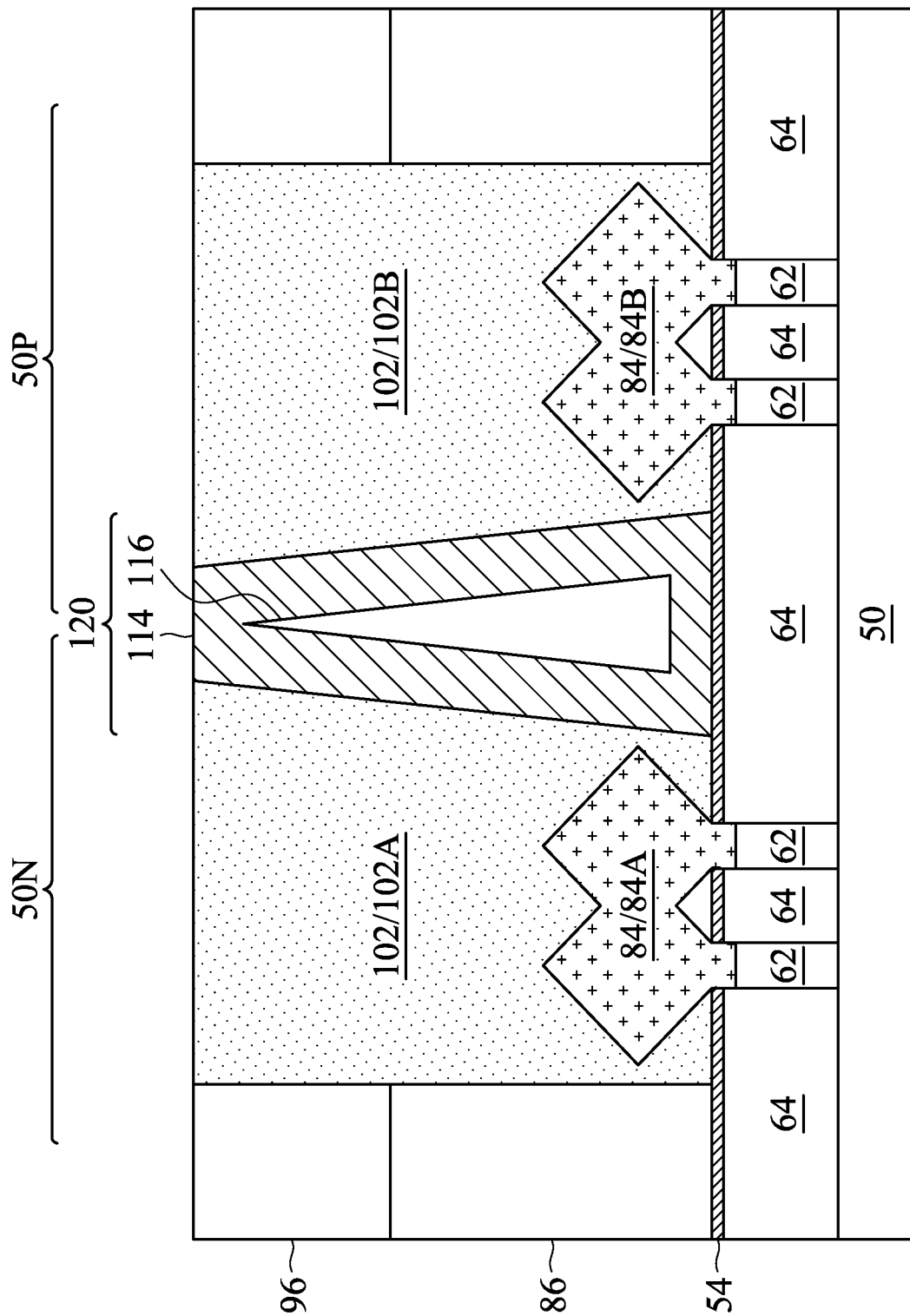

In FIG. 15D, separated source/drain contacts 102A, 102B are formed through the ILD layers 86, 96. The separated source/drain contacts 102A, 102B can be formed of similar materials and by a similar process as that described with respect to FIGS. 14D and 14E.

After the isolation feature 120 and the source/drain contacts 102A, 102B are formed, further processing of the FinFETs can be performed. For example, similar to the embodiment of FIG. 13D, an IMD layer 122 is formed on the isolation feature 120, the separated source/drain contacts 102A, 102B, and the second ILD layer 96. Conductive features 124 are formed in the IMD layer 122, and are connected to the source/drain contacts 102.

Figure 16C:
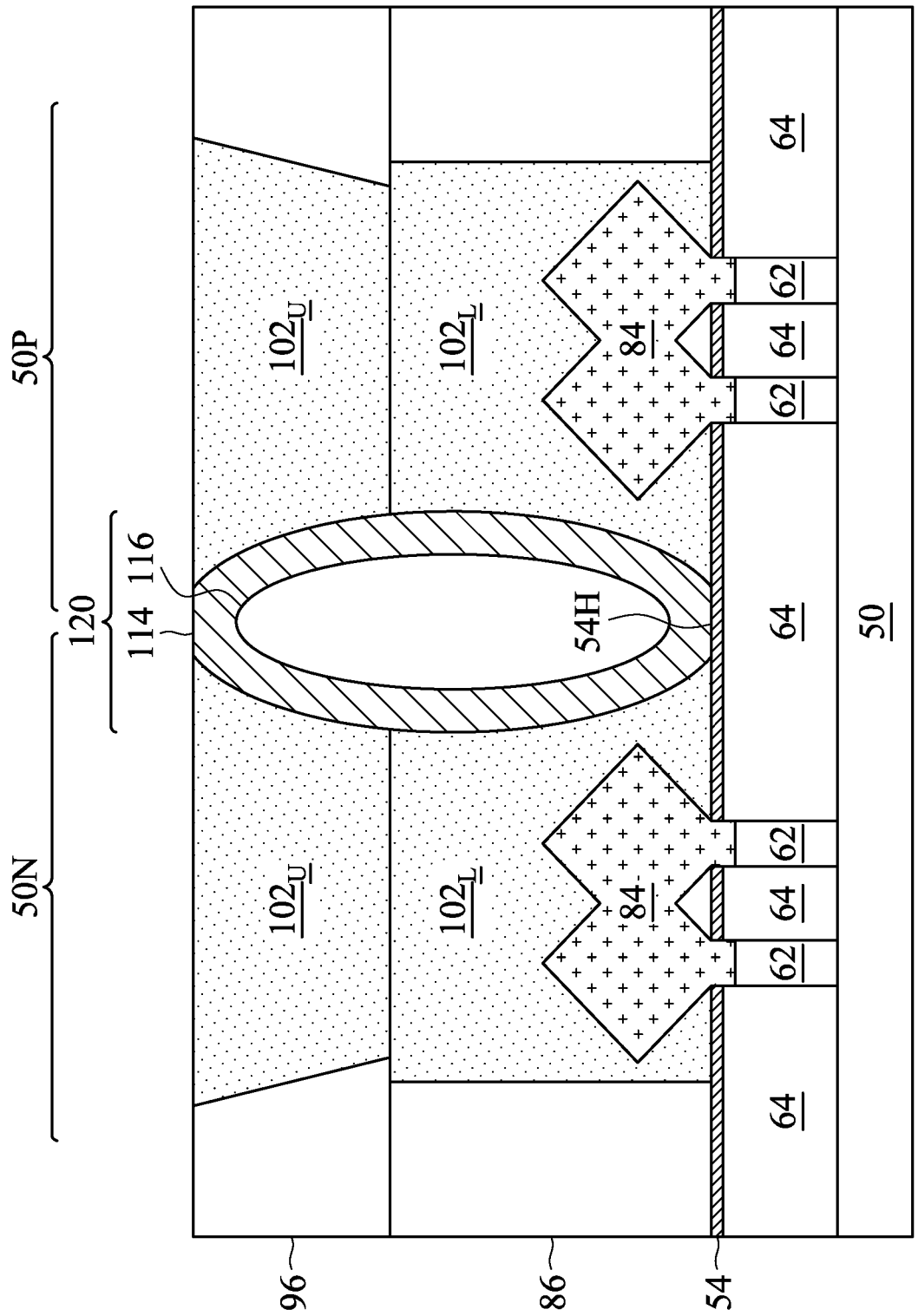
Figure 16D:
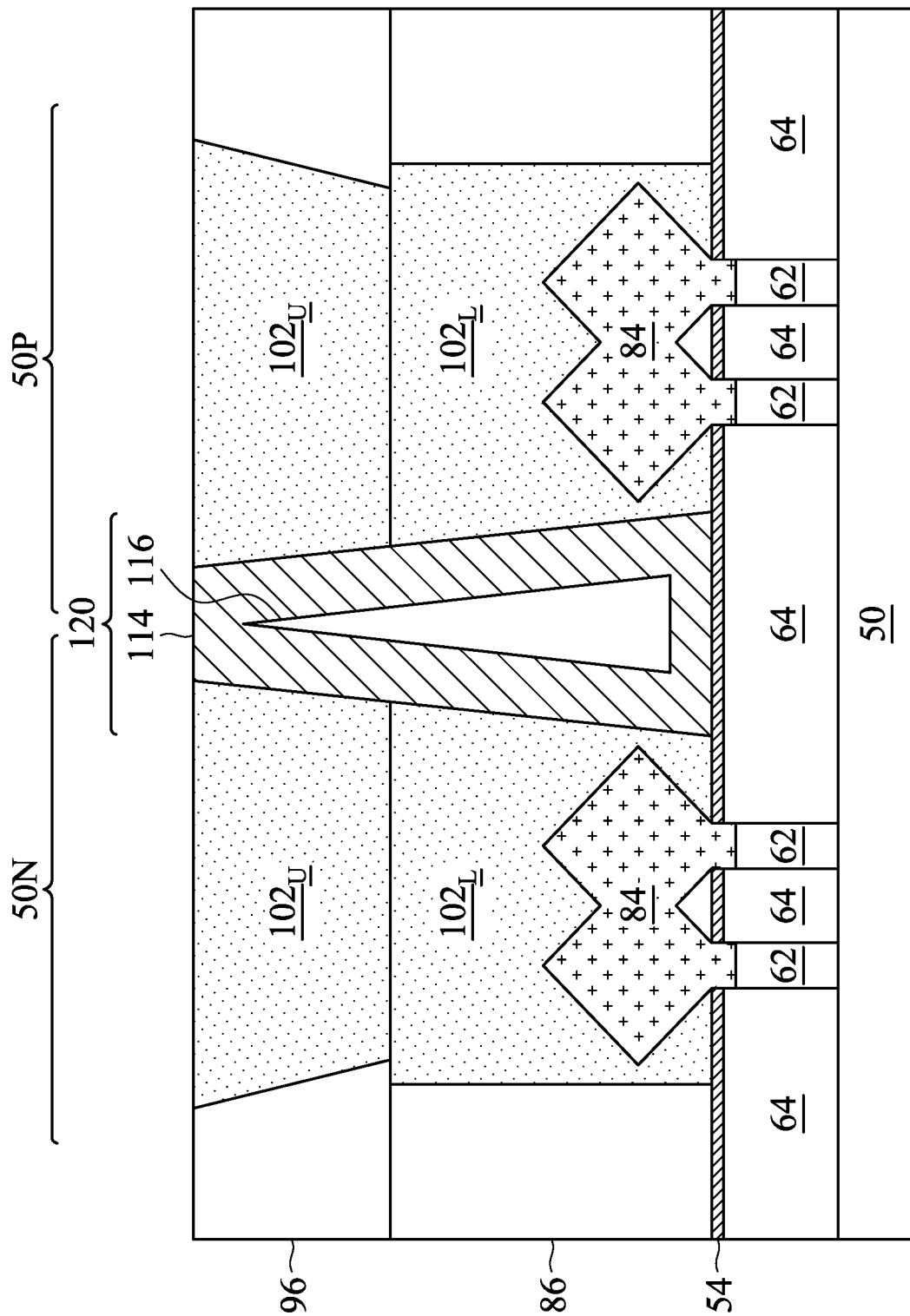

FIGS. 16A through 16D illustrate FinFETs, in accordance with other embodiments. FIG. 16A is a cross-sectional view illustrated along reference cross-section A-A in FIG. 1, except three gate structures are shown. FIG. 16B is a cross-sectional view illustrated along reference cross-section B-B in FIG. 1, except only two fins are shown. FIGS. 16C and 16D are cross-sectional views illustrated along reference cross-section C-C in FIG. 1, where four fins are shown. In this embodiment, the source/drain contacts 102 include upper source/drain contacts $102_U$ and lower source/drain contacts $102_L$. The upper source/drain contacts $102_U$ are formed through the second ILD layer 96, and the lower source/drain contacts $102_L$ are formed through the first ILD layer 86. The upper source/drain contacts $102_U$ and the lower source/drain contacts $102_L$ can be formed in different processes, and can be formed of the same conductive materials, e.g., tungsten or cobalt.

An isolation feature 120 is formed between adjacent upper source/drain contacts $102_U$ and adjacent lower source/drain contacts $102_L$. The isolation feature 120 can have a bowed profile shape, as shown in FIG. 16C, or a reentrant profile shape, as shown in FIG. 16D. The isolation feature 120 in FIGS. 16C and 16D can be formed by any of the "cut last" process discussed above with respect to FIGS. 12A through 12E, the "cut last" process discussed above with respect to FIGS. 13A through 13D, the "cut first" processes discussed above with respect to FIGS. 14A through 14E, or the "cut first" processes discussed above with respect to FIGS. 15A through 15D.

The FinFETs of FIGS. 16C and 16D have merged epitaxial source/drain regions 84 similar to those in FIG. 7C. In other embodiments, the FinFETs of FIGS. 16C and 16D could have separated epitaxial source/drain regions 84 similar to those in FIG. 7D.

Figures 17A, 17B:
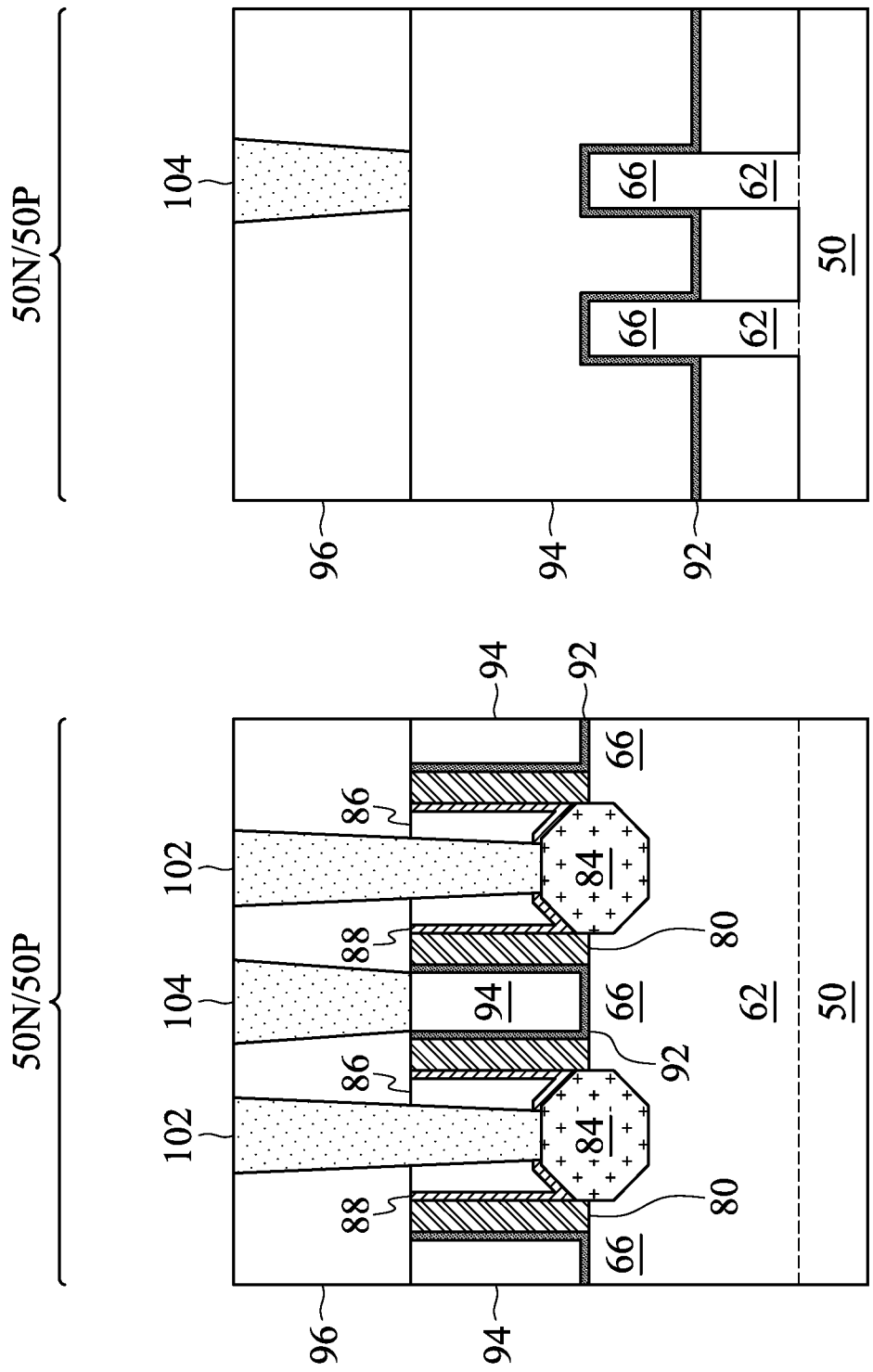
FIGS. 17A, 17B, 17C, and 17D are cross-sectional views of FinFETs, in accordance with some other embodiments.
Figure 17C:
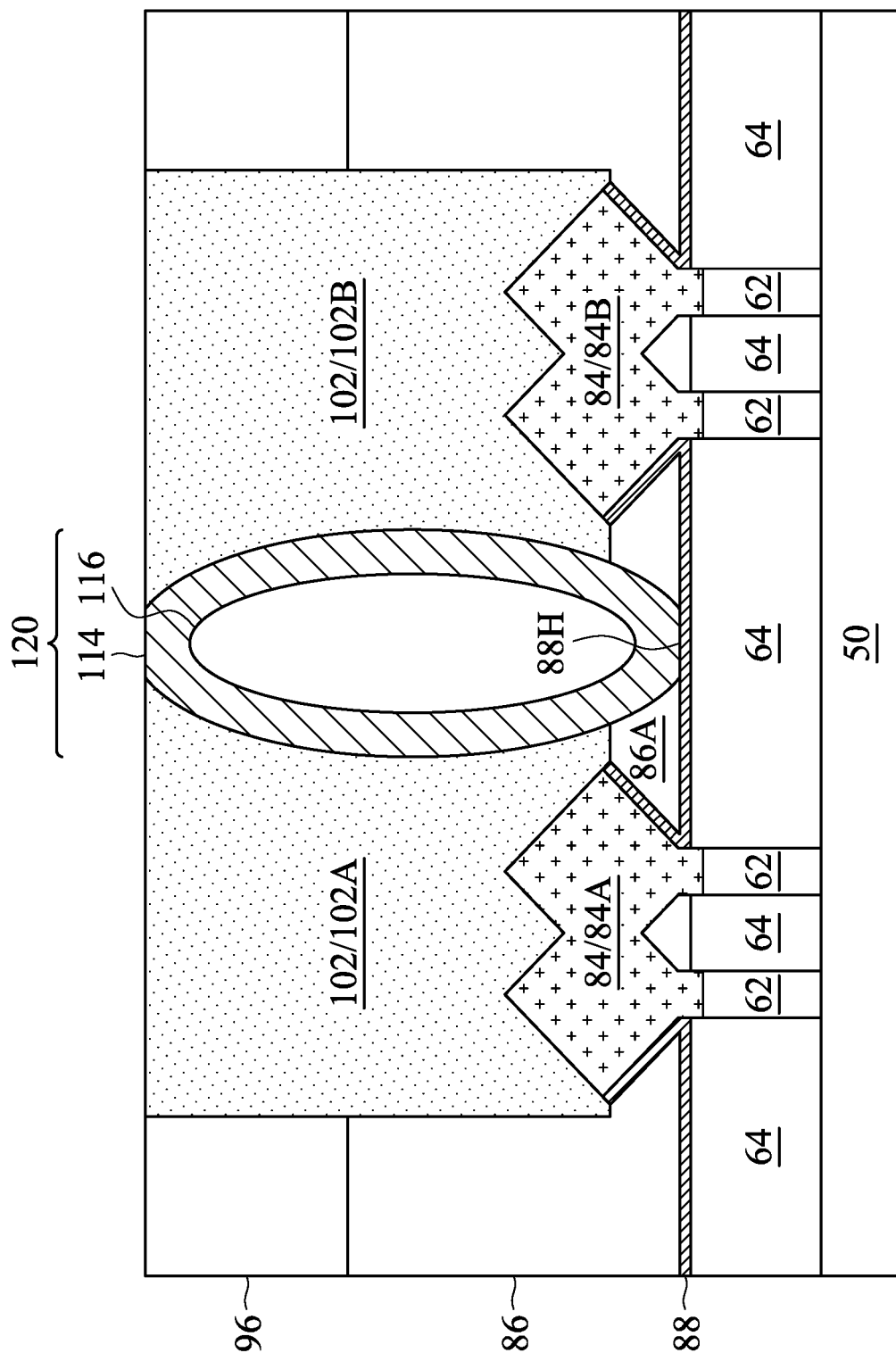
Figure 17D:
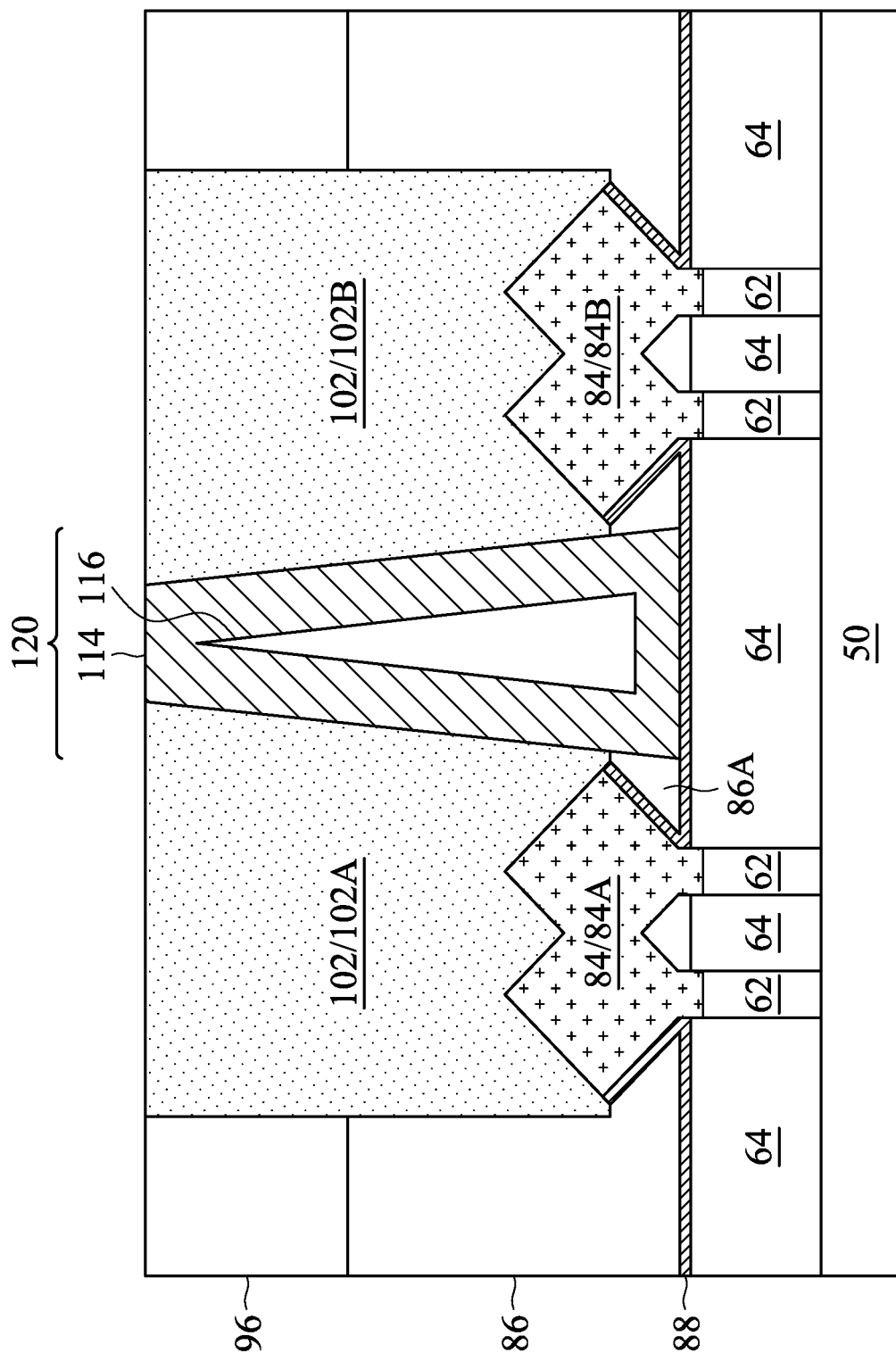

FIGS. 17A through 17D illustrate FinFETs, in accordance with other embodiments. FIG. 17A is a cross-sectional view illustrated along reference cross-section A-A in FIG. 1, except three gate structures are shown. FIG. 17B is a cross-sectional view illustrated along reference cross-section B-B in FIG. 1, except only two fins are shown. FIGS. 17C and 17D are cross-sectional views illustrated along reference cross-section C-C in FIG. 1, where four fins are shown. In this embodiment, the etch stop layer 54 (see FIG. 6) is not deposited before growing the epitaxial source/drain region 84. Instead, a CESL 88 is deposited on the epitaxial source/drain region 84 and the STI regions 64. For example, the CESL 88 can be deposited after forming the epitaxial source/drain region 84 but before forming the first ILD layer 86. The CESL 88 can be formed of similar materials and by a similar deposition process as the etch stop layer 54. The source/drain contacts 102 are formed by patterning openings in the first ILD layer 86 and the CESL 88, such that portions 86A of the first ILD layer 86 remain beneath the shared source/drain contacts 102. Further, in this embodiment, the fins 62 may not be epitaxial structures grown on the substrate 50, but rather the fins 62 can be formed in the substrate 50 by etching trenches in the substrate 50. As such, the substrate 50 and the fins 62 can be a continuous semiconductor material in this embodiment.

An isolation feature 120 is formed between adjacent source/drain contacts 102A, 102B. The isolation feature 120 can have a bowed profile shape, as shown in FIG. 17C, or a reentrant profile shape, as shown in FIG. 17D. The isolation feature 120 in FIGS. 17C and 17D can be formed by any of the "cut last" process discussed above with respect to FIGS. 12A through 12E, the "cut last" process discussed above with respect to FIGS. 13A through 13D, the "cut first" processes discussed above with respect to FIGS. 14A through 14E, or the "cut first" processes discussed above with respect to FIGS. 15A through 15D. In any such embodiments, the opening for the isolation feature 120 further formed through the portion 86A of the first ILD layer, and is stopped on the CESL 88 The opening for the isolation feature 120 thus exposes sidewalls of the portion 86A of the first ILD layer 86, and a horizontal portion 88H of the CESL 88. The horizontal portion 88H of the CESL 88 extends along the STI regions 64, and extends between the epitaxial source/drain region 84A and the epitaxial source/drain region 84B. The dielectric liner 114 contacts the sidewalls of the portion 86A of the first ILD layer 86 and a top surface of the horizontal portion 88H of the CESL 88.

The FinFETs of FIGS. 17C and 17D have merged epitaxial source/drain regions 84 similar to those in FIG. 7C. In other embodiments, the FinFETs of FIGS. 17C and 17D could have separated epitaxial source/drain regions 84 similar to those in FIG. 7D.

As noted above, forming an isolation feature 120 with a void 116 between adjacent source/drain contacts 102 allows for an increase in the electrical isolation between the adjacent source/drain contacts 102. Increasing the electrical isolation between adjacent source/drain contacts 102 can help reduce the parasitic capacitance between the source/drain contacts 102, thus increasing the performance of the resulting FinFETs. Such a decrease in parasitic capacitance can be particularly advantageous in in devices where there is a large voltage difference between adjacent source/drain contacts 102. One example of such a device is a static random-access memory (SRAM) cell.

Figure 18:
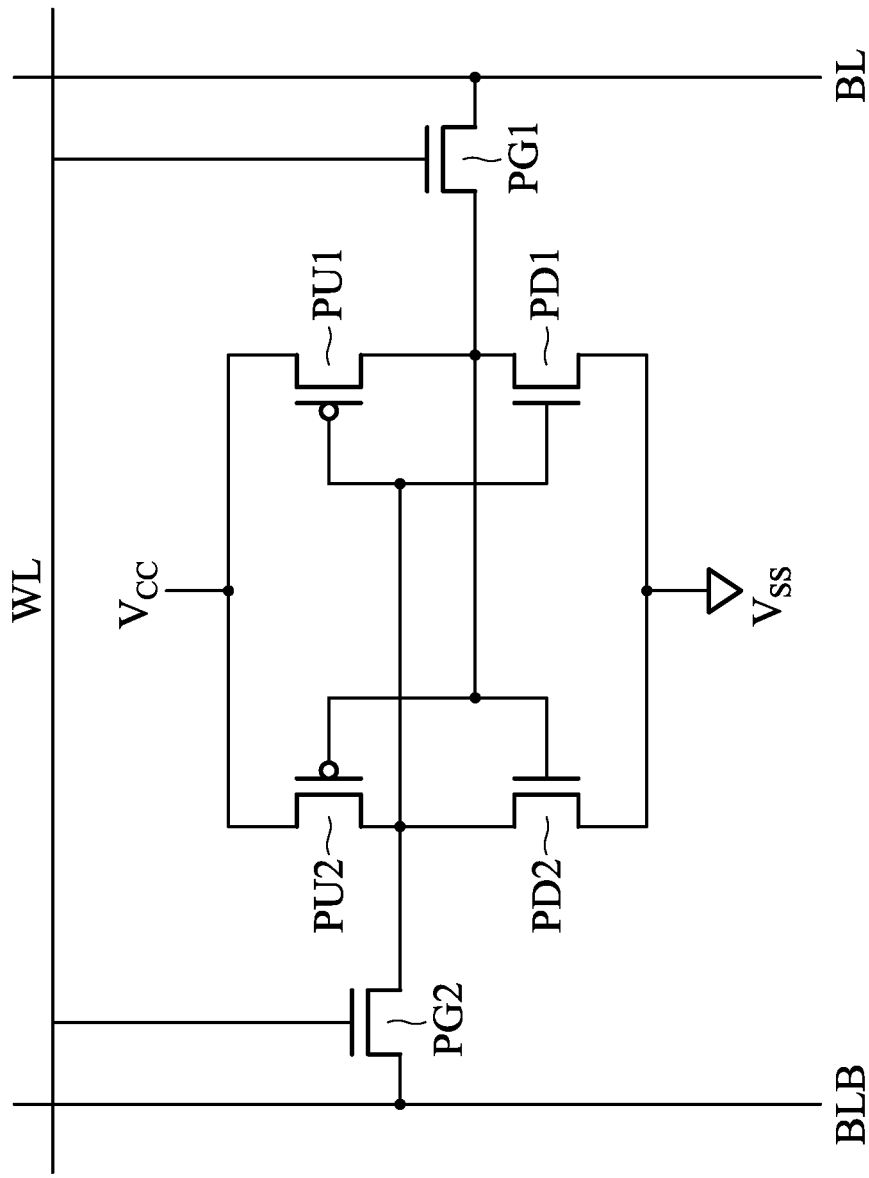
FIG. 18 is a circuit diagram of a SRAM cell.

FIG. 18 is a circuit diagram of a SRAM cell. The SRAM cell includes pull-up transistors PU1 and PU2, and pull-down transistors PD1 and PD2, which collectively store one bit. The pull-up transistors PU1 and PU2 are connected to a power supply voltage node $V_{cc}$, and the pull-down transistors PD1 and PD2 are connected to a ground voltage node $V_{ss}$. The SRAM cell also includes pass-gate transistors PG1 and PG2, which are connected to the word line WL and complimentary bitlines BL and BLB for the SRAM cell. When the pass-gate transistors PG1 and PG2 are enabled, the value of the SRAM cell may be read with the complimentary bitlines BL and BLB, and a new value may be written to the SRAM cell with the complimentary bitlines BL and BLB.

Figure 19:
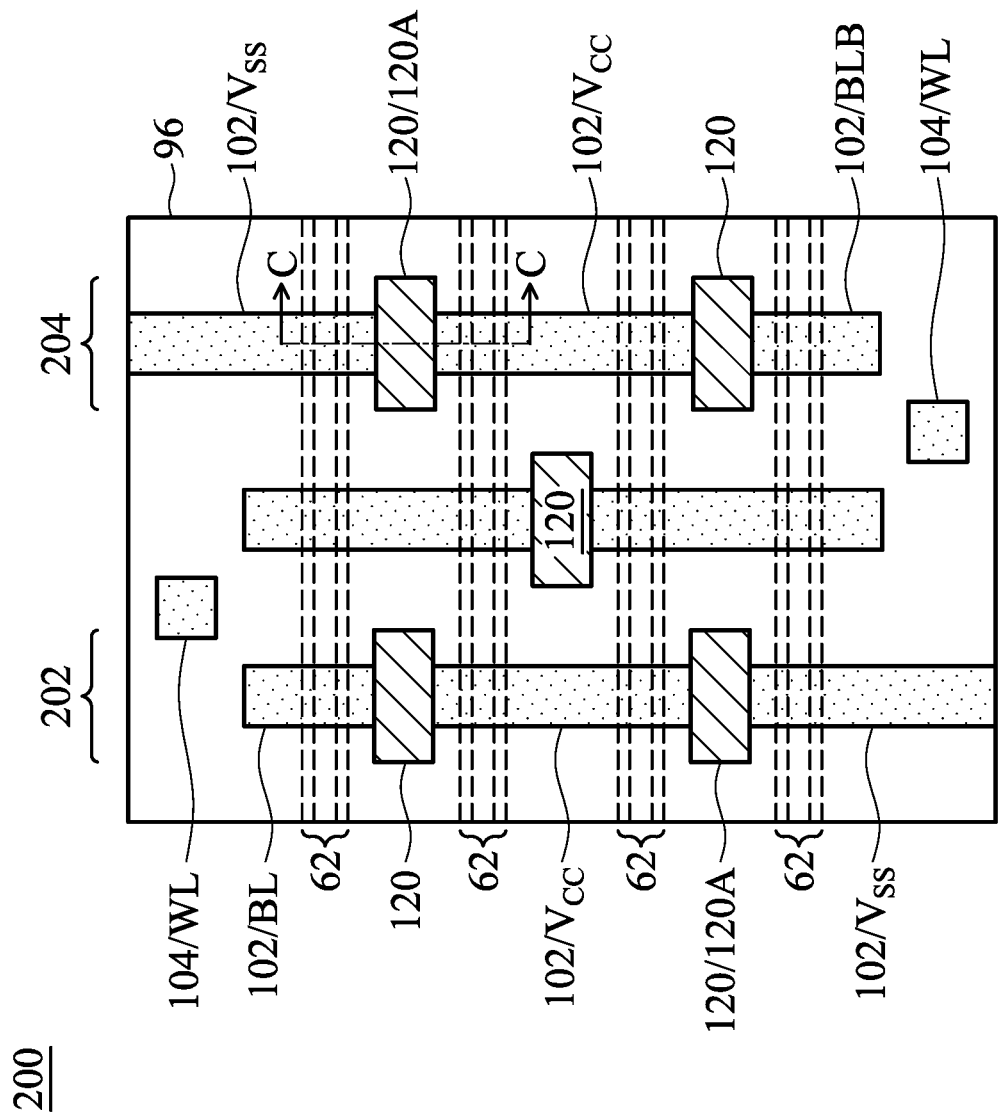
FIG. 19 is a top-down view of a semiconductor device, in accordance with some embodiments.

FIG. 19 is a top-down view of a semiconductor device 200, in accordance with some embodiments. The semiconductor device 200 includes six FinFETs which are formed using four groups of fins 62, and can be interconnected to form an SRAM cell, such as the SRAM cell of FIG. 18. FIG. 19 illustrates a cross-section C-C. FIGS. 12A through 15D, 16C, 16D, 17C, and 17D show a similar cross-section as cross-section C-C.

Source/drain contacts 102 are formed to the FinFETs of the semiconductor device 200, with the source/drain contacts 102 separated by isolation features 120. For example, if a "cut last" process is performed in region 202, a shared source/drain contact can be divided into three separated source/drain contacts 102, and two isolation features 120 are formed between the separated source/drain contacts 102. Likewise, in region 204, two isolation features 120 and three separated source/drain contacts 102 are similarly formed. The separated source/drain contacts 102 in region 202 will be connected to $V_{ss}$, $V_{cc}$, and BL. The separated source/drain contacts 102 in region 204 will be connected to $V_{ss}$, $V_{cc}$, and BLB. In some embodiments, an isolation feature 120A is formed between the source/drain contacts 102 for pull-up transistor PU1 and pull-down transistor PD1 (see FIG. 18). In some embodiments, an isolation feature 120A is formed between the source/drain contacts 102 for pull-up transistor PU2 and pull-down transistor PD2 (see FIG. 18). Notably, each isolation feature 120A is disposed between adjacent source/drain contacts 102 that will be connected to $V_{ss}$ and $V_{cc}$. Such isolation features 120A separate source/drain contacts 102 that are at a large voltage difference (e.g., power and ground). Forming the isolation feature 120A between source/drain contacts 102 at a large voltage difference helps decrease the parasitic capacitance that would be induced by the large voltage difference. The performance of the SRAM cell may thus be improved.

In an embodiment, a device includes: a first source/drain region; a second source/drain region; an inter-layer dielectric (ILD) layer over the first source/drain region and the second source/drain region; a first source/drain contact extending through the ILD layer, the first source/drain contact connected to the first source/drain region; a second source/drain contact extending through the ILD layer, the second source/drain contact connected to the second source/drain region; and an isolation feature between the first source/drain contact and the second source/drain contact, the isolation feature including a dielectric liner and a void, the dielectric liner surrounding the void.

In some embodiments of the device, the isolation feature has a first width at a top of the isolation feature, a second width at a midpoint of the isolation feature, and a third width at a bottom of the isolation feature, the second width being greater than each of the first width and the third width. In some embodiments of the device, a width of the isolation feature increases continually in a direction extending from a top of the isolation feature to a bottom of the isolation feature. In some embodiments, the device further includes: an isolation region over a substrate; and a contact etch stop layer (CESL) over the isolation region, the CESL having a horizontal portion extending from the first source/drain region to the second source/drain region, the horizontal portion of the CESL contacting each of the isolation feature, the first source/drain contact, and the second source/drain contact. In some embodiments of the device, the first source/drain region and the second source/drain region each extend through the CESL. In some embodiments of the device, the isolation feature extends through a first portion of the ILD layer, the device further including: an isolation region over a substrate; and a contact etch stop layer (CESL) over the isolation region, the CESL having a horizontal portion extending from the first source/drain region to the second source/drain region, the horizontal portion of the CESL contacting the isolation feature, the horizontal portion of the CESL separated from each of the first source/drain contact and the second source/drain contact by the first portion of the ILD layer. In some embodiments of the device, the CESL is disposed between the ILD layer and each of the isolation region, the first source/drain region, and the second source/drain region. In some embodiments of the device, the dielectric liner is a layer of silicon oxide and the void is filled with air or at a vacuum. In some embodiments of the device, the first source/drain region is part of a pull-up transistor for a static random-access memory (SRAM) cell, and the second source/drain region is part of a pull-down transistor for the SRAM cell.

In an embodiment, a device includes: a first source/drain region; a second source/drain region; an inter-layer dielectric (ILD) layer over the first source/drain region and the second source/drain region, the ILD layer having a first relative permittivity; a first source/drain contact extending through the ILD layer, the first source/drain contact connected to the first source/drain region; a second source/drain contact extending through the ILD layer, the second source/drain contact connected to the second source/drain region; and an isolation feature between the first source/drain contact and the second source/drain contact, the isolation feature having a second relative permittivity, the second relative permittivity being less than the first relative permittivity.

In an embodiment, a method includes: depositing an inter-layer dielectric (ILD) layer over a first source/drain region and a second source/drain region; forming a shared source/drain contact in the ILD layer, the shared source/drain contact connected to each of the first source/drain region and the second source/drain region; dividing the shared source/drain contact into a first source/drain contact and a second source/drain contact, the first source/drain contact connected to the first source/drain region, the second source/drain contact connected to the second source/drain region; and forming an isolation feature between the first source/drain contact and the second source/drain contact, the isolation feature including a dielectric liner and a void, the dielectric liner surrounding the void.

In some embodiments, the method further includes, before depositing the ILD layer: depositing a contact etch stop layer (CESL) over an isolation region; and growing the first source/drain region and the second source/drain region extending through the CESL. In some embodiments of the method, dividing the shared source/drain contact includes etching the shared source/drain contact to form an opening exposing a horizontal portion of the CESL, and where forming the isolation feature includes depositing the dielectric liner in the opening. In some embodiments, the method further includes, before depositing the ILD layer: depositing a contact etch stop layer (CESL) over the first source/drain region and the second source/drain region. In some embodiments of the method, dividing the shared source/drain contact includes etching the shared source/drain contact and the ILD layer to form an opening exposing a horizontal portion of the CESL, and where forming the isolation feature includes depositing the dielectric liner in the opening. In some embodiments of the method, dividing the shared source/drain contact into the first source/drain contact and the second source/drain contact includes: etching the shared source/drain contact with a plasma etching process to form an opening in the shared source/drain contact, the opening having a bowed profile shape. In some embodiments of the method, the plasma etching process is performed with a bias voltage in a range of 50 volts to 800 volts, the plasma etching process is performed at a pressure in a range of 5 mTorr to 500 mTorr, and the plasma etching process is performed with an etchant gas and a passivation gas, a ratio of a flow rate of the etchant gas to a flow rate of the passivation gas being in a range of 0.01:1 to 2:1. In some embodiments of the method, dividing the shared source/drain contact into the first source/drain contact and the second source/drain contact includes: etching the shared source/drain contact with a plasma etching process to form an opening in the shared source/drain contact, the opening having a reentrant profile shape. In some embodiments of the method, the ILD layer is deposited over a contact etch stop layer (CESL), the plasma etching process is performed for a duration in a range of 15 seconds to 1500 seconds, and the plasma etching process has an etching selectivity between the shared source/drain contact and the CESL in a range of 10:1 to 50:1. In some embodiments, the method further includes: depositing an inter-metal dielectric (IMD) layer over the ILD layer and the isolation feature; forming a first conductive feature through the IMD layer, the first conductive feature connected to the first source/drain contact; and forming a second conductive feature through the IMD layer, the second conductive feature connected to the second source/drain contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
   a first source/drain region;
   a second source/drain region;
   a contact etch stop layer having a horizontal portion extending from the first source/drain region to the second source/drain region;
   an inter-layer dielectric over the contact etch stop layer;
   a first source/drain contact extending through the inter-layer dielectric, the first source/drain contact connected to the first source/drain region;
   a second source/drain contact extending through the inter-layer dielectric, the second source/drain contact connected to the second source/drain region; and
   an isolation feature between the first source/drain contact and the second source/drain contact, the isolation feature comprising a dielectric liner and a void, the dielectric liner surrounding the void, the dielectric liner contacting the horizontal portion of the contact etch stop layer, the dielectric liner contacting a first sidewall of the first source/drain contact and a second sidewall of the second source/drain contact.

2. The device of claim 1, wherein the isolation feature has a first width at a top of the isolation feature, a second width at a midpoint of the isolation feature, and a third width at a bottom of the isolation feature, the second width being greater than each of the first width and the third width.

3. The device of claim 1, wherein a width of the isolation feature increases continually in a direction extending from a top of the isolation feature to a bottom of the isolation feature.

4. The device of claim 1 further comprising:
   an isolation region over a substrate, the contact etch stop layer disposed over the isolation region, the horizontal portion of the contact etch stop layer contacting the first source/drain contact, and the second source/drain contact.

5. The device of claim 4, wherein the first source/drain region and the second source/drain region each extend through the contact etch stop layer.

6. The device of claim 1, wherein the isolation feature extends through a first portion of the inter-layer dielectric, the device further comprising:
- an isolation region over a substrate, the contact etch stop layer disposed over the isolation region, the horizontal portion of the contact etch stop layer separated from each of the first source/drain contact and the second source/drain contact by the first portion of the inter-layer dielectric.

7. The device of claim 6, wherein the contact etch stop layer is disposed between the inter-layer dielectric and each of the isolation region, the first source/drain region, and the second source/drain region.

8. The device of claim 1, wherein the dielectric liner is a layer of silicon oxide and the void is filled with air or at a vacuum.

9. The device of claim 1, wherein the first source/drain region is part of a pull-up transistor for a static random-access memory cell, and the second source/drain region is part of a pull-down transistor for the static random-access memory cell.

10. A device comprising:
- a first source/drain region;
- a second source/drain region;
- a contact etch stop layer having a horizontal portion between the first source/drain region and the second source/drain region;
- an inter-layer dielectric over the contact etch stop layer, the inter-layer dielectric having a first relative permittivity;
- a first source/drain contact extending through the inter-layer dielectric, the first source/drain contact connected to the first source/drain region;
- a second source/drain contact extending through the inter-layer dielectric, the second source/drain contact connected to the second source/drain region; and
- an isolation feature between the first source/drain contact and the second source/drain contact, the isolation feature contacting a first sidewall of the first source/drain contact and a second sidewall of the second source/drain contact, the isolation feature contacting the horizontal portion of the contact etch stop layer, the isolation feature having a second relative permittivity, the second relative permittivity being less than the first relative permittivity.

11. The device of claim 10, wherein the isolation feature comprises an oxide layer and an air gap, the oxide layer contacting the horizontal portion of the contact etch stop layer.

12. The device of claim 10, wherein the isolation feature has a bowed profile shape.

13. The device of claim 10, wherein the isolation feature has a reentrant profile shape.

14. The device of claim 10 further comprising:
- a power supply voltage node connected to the first source/drain contact; and
- a ground voltage node connected to the second source/drain contact.

15. The device of claim 10, wherein the first source/drain region is part of a pull-up transistor for a static random-access memory cell, and the second source/drain region is part of a pull-down transistor for the static random-access memory cell.

16. A device comprising:
- an isolation region on a substrate;
- a dielectric layer on the isolation region, the dielectric layer comprising a different dielectric material than the isolation region;
- a first semiconductor fin extending above the dielectric layer;
- a second semiconductor fin extending above the dielectric layer;
- a gate structure on the first semiconductor fin, the second semiconductor fin, and the dielectric layer;
- a first source/drain region adjacent the gate structure and in the first semiconductor fin;
- a second source/drain region adjacent the gate structure and in the second semiconductor fin;
- an inter-layer dielectric on the first source/drain region, the second source/drain region, and the dielectric layer, a top surface of the inter-layer dielectric being coplanar with a top surface of the gate structure;
- a first source/drain contact extending through the inter-layer dielectric, the first source/drain contact connected to the first source/drain region;
- a second source/drain contact extending through the inter-layer dielectric, the second source/drain contact connected to the second source/drain region; and
- an isolation feature between the first source/drain contact and the second source/drain contact, the isolation feature comprising a liner layer and a void, the liner layer surrounding the void, the liner layer contacting the dielectric layer.

17. The device of claim 16, wherein an upper portion of the isolation feature has a lesser width than a lower portion of the isolation feature.

18. The device of claim 16 further comprising:
- a power supply voltage node connected to the first source/drain contact; and
- a ground voltage node connected to the second source/drain contact.

19. The device of claim 16, wherein the first source/drain region is part of a pull-up transistor for a static random-access memory cell, and the second source/drain region is part of a pull-down transistor for the static random-access memory cell.

20. The device of claim 16, wherein the liner layer contacts a first sidewall of the first source/drain contact and a second sidewall of the second source/drain contact.

* * * * *